US006383714B1

(12) United States Patent
Nakamura et al.

(10) Patent No.: US 6,383,714 B1
(45) Date of Patent: May 7, 2002

(54) IMAGE RECORDING MATERIAL AND PLANOGRAPHIC PRINTING PLATE USING SAME

(75) Inventors: Ippei Nakamura; Tatsuo Nakamura, both of Shizuoka-ken; Kunio Nakamura, Tokyo; Kazuto Kunita, Shizuoka-ken, all of (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/580,525

(22) Filed: May 30, 2000

(30) Foreign Application Priority Data

May 31, 1999 (JP) .......................................... 11-151412
Jun. 4, 1999 (JP) .......................................... 11-157987

(51) Int. Cl.$^7$ ............................................... G03F 7/004

(52) U.S. Cl. .................... 430/270.1; 430/302; 430/921; 101/462

(58) Field of Search ............................. 430/270.1, 927, 430/302; 101/402, 430

(56) References Cited

U.S. PATENT DOCUMENTS

| | | | | |
|---|---|---|---|---|
| 5,208,135 A | * | 5/1993 | Patel et al. | 430/281 |
| 5,705,322 A | | 1/1998 | West et al. | 430/325 |
| 6,083,658 A | * | 7/2000 | Kunita et al. | 430/270.1 |

FOREIGN PATENT DOCUMENTS

| | | |
|---|---|---|
| EP | 0405219 | 1/1991 |
| EP | 0444786 | 9/1991 |
| EP | 0784233 | 7/1997 |
| EP | 0899614 | 3/1999 |
| EP | 0903225 | 3/1999 |
| EP | 0982123 | 3/2000 |

* cited by examiner

*Primary Examiner*—Rosemary Ashton
(74) *Attorney, Agent, or Firm*—Burns, Doane, Swecker & Mathis, LLP

(57) ABSTRACT

The present invention is an image recording material characterized in that it contains (a) a compound that is decomposed by light or heat and produces an acid, (b) a crosslinking agent that crosslinks in the presence of an acid, (c) a high-polymer compound insoluble in water but soluble in an alkali aqueous solution, and (d) the anionic infrared absorbing agent expressed by general formula (I) or general formula (II) below. In the formulas, M represents a conjugated chain, $G_a^-$ represents an anionic substituent, $G_b$ represents a neutral substituent, $X^{m+1}$ represents a hydrogen ion or a cation of m valence, and m represents an integer from 1 to 6.

(I)

$$[G_a^- — M — G_b]_m \ X^{m+}$$

(II)

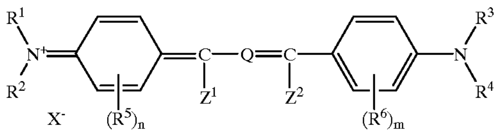

21 Claims, No Drawings

IMAGE RECORDING MATERIAL AND PLANOGRAPHIC PRINTING PLATE USING SAME

BACKGROUND OF THE INVENTION

1. Field of the Invention

The present invention relates to a negative-type image recording material, and more particularly to a negative-type image recording material ideal for a plate material for use in planographic printing which enables so-called direct plate-making, which can be written with heat from an infrared laser or thermal head or the like, and which enables a plate to be made directly from digital signals from a computer or the like.

2. Description of the Related Art

In recent years, with the development of solid lasers and semiconductor lasers having light emission spectrums from near infrared to infrared, attention is being focused on systems for making plates directly from computer digital data which employ such infrared lasers.

One negative-type image recording material capable of recording by infrared laser is a recording material comprising an onium salt, resol resin, novolac resin, and infrared absorbing agent, as described in Japanese Patent Application Laid-Open (JP-A) No. 7-20629.

This is a material wherewith, in a plate material used for planographic printing and using the image recording material, energy provided by a solid laser or semiconductor laser emitting infrared radiation is converted to thermal energy by the infrared absorbing agent, and that heat causes the onium salt to decompose, whereby the image is formed. That is, the acid produced by the decomposition of the onium salt promotes a crosslinking reaction between a binder and a crosslinking agent that effects crosslinking in the presence of an acid, whereby the image recording, that is, the making of the plate from the recording material, is conducted.

However, the only infrared absorbing agents used in this case are cationic dyes. Because the amount of heat generated by exposure to light is low, there is a problem in that good images cannot be obtained (low sensitivity and narrow developing latitude). What is meant here by developing latitude is the allowable range wherein good images can be formed when changing the alkali concentration of an alkali developing fluid. There is another problem, moreover, involving changes in sensitivity before and after storage in high-temperature, high-humidity environments, that is, a problem of poor storage stability.

SUMMERY OF THE INVENTION

The purpose of the present invention is to resolve the problems noted above with the prior art and achieve the object stated below. That is, an object of the present invention is to provide a negative-type image recording material wherewith direct plate-making is possible by recording digital data from a computer or the like using a solid laser or semiconductor laser that emits infrared radiation, which material is not easily contaminated and exhibits good developing latitude and storage stability.

The inventors performed much exacting research with the objective of improving image formation characteristics (sensitivity and developing latitude) and storage stability and, as a result, discovered that high-sensitivity images can be formed using an infrared absorbing agent exhibiting certain properties, and thus perfected the present invention.

The means for resolving the problems noted earlier are as follows. The present invention is an image recording material characterized in that it at least contains the substances (a) to (d) noted below.

(a) a compound decomposable by light or heat, and which produces an acid when decomposed thereby;

(b) a crosslinking agent that crosslinks in the presence of an acid;

(c) a high-polymer compound substantially insoluble in water and-substantially soluble in an alkali aqueous solution; and (d) an infrared absorbing agent selected from the group of general formulas consisting of general formula (I) or general formula (II) as follows:

(I)

$$[Ga^{-}—M—G_b]_m \ X^{m+}$$

(II)

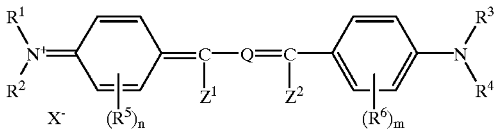

wherein in general formula (I), M represents a conjugated chain; $G_a^-$ represents an anionic substituent; $G_b$ represents a neutral substituent; and $X^{m+}$ represents a hydrogen ion or a cation of valence m, where m represents an integer from 1 to 6; and in general formula (II), $R^1$ to $R^4$ each independently represent a hydrogen atom, alkyl group, or aryl group; $R^5$ and $R^6$ each independently represent an alkyl group, substituted oxy group, or halogen atom; n and m each independently represent an integer from 0 to 4; either $R^1$ and $R^2$, or $R^3$ and $R^4$, may bond to form a ring, or $R^1$ and/or $R^2$ may bond with $R^5$, or $R^3$ and/or $R^4$ may bond with $R^6$ to form a ring, and, furthermore, either $R^5$'s may bond to form a ring or $R^6$'s may bond to form a ring; $Z^1$ and $Z^2$ are each independently a hydrogen atom, alkyl group, or aryl group, and at least one of $Z^1$ and $Z^2$ represents either a hydrogen atom or an alkyl group; Q is a trimethine group or pentamethine group that may have a substituent, and may form a ring structure together with a bivalent organic group; and $X^-$ represents a counter-anion.

The reason why a prescribed effect is obtained in using the infrared absorbing agent expressed by the general formula (I) is believed to be that the use of an anionic infrared absorbing agent makes it possible to control the interaction with the binder in the counter-cation part. More specifically, the current situation is that, in the case of a cationic infrared absorbing agent known in the prior art, the structure thereof naturally becomes limited in order to impart absorption in the infrared region, the structure responsible for the interaction with the binder is limited to a range wherein the absorbing ability in the infrared region is not impaired, and the desired interaction cannot be controlled given the molecular structure. When an anionic infrared absorbing agent like that of the present invention is employed, however, free selection of the counter-cation becomes possible, and the interaction with the binder can be freely changed without restriction, wherefore, it is believed, it becomes possible to make the desired improvement in image forming characteristics, which is a benefit of the present invention.

Moreover, with compounds that generate acids when heated (hereinafter called "acid generating compounds") that are cationic, in particular, due to ionic bonding, the distance between the anionic infrared absorbing agent and the cationic acid generating compound in the film is small, and heat can be efficiently propagated from the infrared absorbing agent to the acid generating compound. That is also thought to be a reason.

The reason why the prescribed effect is obtained when using the infrared absorbing agent of general formula (II) is thought to be as follows. The molecular weight of the infrared absorbing agent relating to the present invention is comparatively small, and the number of molecules of the infrared absorbing agent itself relative to the quantity added becomes large. Therefore the absorbency becomes high, the sensitivity rises, and, together therewith, a dense interaction is formed in the interior of the photosensitive layer film. For that reason, it is thought, even when stored in high humidity, the penetration of moisture that impairs the crosslinking reaction into the film of the photosensitive layer can be effectively prevented, and degradation in sensitivity during storage can be suppressed.

DESCRIPTION OF THE PREFERRED EMBODIMENTS

The image recording material of the present invention contains at least (a) a compound (acid generating compound) that is decomposed by light or heat and produces an acid, (b) a crosslinking agent that crosslinks in the presence of an acid (hereinafter called "crosslinking agent"), (c) a high-polymer compound that is insoluble in water but soluble in an alkali aqueous solution (hereinafter called "alkali-soluble polymer"), and (d) either an anionic infrared absorbing agent expressed by the general formula (I) given above or an anionic infrared absorbing agent expressed by the general formula (II) given above, and also contains other components as necessary.

The infrared absorbing agents expressed by the general formulas (I) and (II) above are now described in greater detail.

(d-1) Infrared Absorbing Agent Expressed by General Formula (I) Above:

In the general formula (I) given above, M represents a conjugated chain, and that conjugated chain may have a substituent or ring structure. The conjugated chain M can be expressed by the following formula.

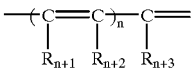

In the formula, $R_{n+1}$, $R_{n+2}$, and $R_{n+3}$, respectively, independently represent hydrogen atoms, halogen atoms, cyano groups, alkyl groups, aryl groups, alkenyl groups, alkynyl groups, carbonyl groups, thio groups, sulfonyl groups, sulfinyl groups, oxy groups, [or] amino groups, these may have substituents, and these may mutually link to form a ring structure. n represents an integer from 1 to 8.

When the $R_{n+1}$, $R_{n+2}$, and $R_{n+3}$, respectively, represent alkyl groups, such alkyl groups include straight-chain, branched, or ring-shaped alkyl groups having 1 to 20 hydrogen atoms. More specifically, these include methyl groups, ethyl groups, propyl groups, butyl groups, pentyl groups, hexyl groups, heptyl groups, otcyl groups, nonyl groups, decyl groups, undecyl groups, dodecyl groups, tridecyl groups, hexadecyl groups, octadecyl groups, eicocyl groups, isopropyl groups, isobutyl groups, s-butyl groups, t-butyl groups, isopentyl groups, neopentyl groups, 1-methylbutyl groups, isohexyl groups, 2-ethylhexyl groups, 2-methylhexyl groups, cyclohexyl groups, cyclopentyl groups, and 2-norbornyl groups, etc. Of these, straight-chain alkyl groups having 1 to 12 carbon atoms, branched alkyl groups having 3 to 12 carbon atoms, and ring-shaped alkyl groups having 5 to 10 carbon atoms are preferred.

These alkyl groups may have substituents. Such substituents include monovalent non-metallic atomic groups excluding hydrogen. Favorable examples thereof include halogen atoms (—F, —Br, —Cl, —I), hydroxyl groups, alkoxy groups, aryloxy groups, mercapto groups, alkylthio groups, arylthio groups, alkyldithio groups, arylthio groups, amino groups, N-alkylamino groups, N,N-dialkylamino groups, N-alylamino groups N,N-diarylamino groups, N-alkyl-N-arylamino groups, acyloxy groups, carbamoyloxy groups, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, ureido groups, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alcoxycarbonylamino groups, N-aryl-N-aryloxycarbonylamino groups, formyl groups, acyl groups, carboxyl groups, and conjugate-base groups thereof (hereinafter called "carboxylato"), alkoxycarbonyl groups, aryloxycarbonyl groups, carbamoyl groups, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, sulfo groups ($—SO_3H$) and conjugate-base groups thereof (hereinafter called "sulfonato groups"), alkoxysulfonyl groups, aryloxysulfonyl groups, sulfinamoyl groups, N-alkylsulfinamoyl groups, N,N-dialkylsulfmamoyl groups, N-arylsulfinamoyl groups, N,N-diarylsulfmamoyl groups, N-alkyl-N-arylsulfinamoyl groups, sulfamoyl groups, N-alkylsulfamoyl groups, N,N-dialkylsulfamoyl groups, N-arylsulfamoyl groups, N,N-diarylsulfamoyl groups, N-alkyl-N-arylsulfamoyl groups, N-acylsulfamoyl groups and conjugate-base groups thereof, N-alkylsulfonylsulfamoyl groups ($—SO_2NHSO_2R$, where R represents an alkyl group) and conjugate-base groups thereof, N-arylsulfonylsulfamoyl groups ($—SO_2NHSO_2Ar$, where Ar represents an aryl group) and conjugate-base groups thereof, N-alkylsulfonylcarbamoyl groups ($—CONHSO_2R$, where R represents an alkyl group) and conjugate-base groups thereof, N-arylsulfonylcarbamoyl groups ($—CONHSO_2Ar$, where Ar represents an aryl group) and conjugate-base groups thereof, alkoxysilyl groups ($—Si(OR)_3$, where R represents an alkyl group), aryloxysilyl groups ($—Si(OAr)_3$, where Ar represents an aryl group), hydroxysilyl groups ($—Si(OH)_3$) and conjugate-base groups thereof, phosphono groups ($—PO_3H_2$) and conjugate-base groups thereof (hereinafter called "phosphonato groups"), dialkylphosphono groups ($—PO_3R_2$, where R represents an alkyl group), diarylphosphono groups ($—PO_3Ar_2$, where Ar represents an aryl group), alkylarylphosphono groups ($—PO_3(R)(Ar)$, where R represents an alkyl group and Ar represents an aryl group), monoalkylphosphono groups ($—PO_3H(R)$, where R represents an alkyl group) and conjugate-base groups thereof (hereinafter called "alkylphosphonate groups"), monoarylphosphono groups ($—PO_3H(Ar)$ where Ar represents an aryl group) and conjugate-base groups thereof (hereinafter called "arylphosphonato groups"), phosphonoxy groups ($—OPO_3H_2$) and conjugate-base groups thereof (hereinafter called "phosphonatoxy groups"), dialkylphosphonoxy groups ($—OPO_3(R)2$, where R represents an alkyl group), diarylphosphonoxy groups ($—OPO_3(Ar)_2$, where Ar represents an aryl group), alkylarylphosphonoxy groups ($—OPO_3(R)(Ar)$, where R represents an alkyl group, and where Ar represents an aryl group), monoalkylphosphonoxy groups ($—OPO_3H(R)$, where R represents an alkyl group) and conjugate-base groups thereof (hereinafter called "alkylphosphonatoxy groups"), monoarylphosphonoxy groups ($—OPO_3H(Ar)$, where Ar represents an aryl group) and conjugate-base groups thereof (hereinafter called "arylphosphonatoxy groups"), cyano groups, nitro groups, aryl groups, alkenyl groups, and alkynyl groups.

Specific examples of the alkyl groups in these substituents include the alkyl groups noted earlier and represented by $R_{n+1}$, $R_{n+2}$, and $R_{n+3}$, while specific examples of the aryl groups include phenyl groups, biphenyl groups, naphthyl groups, tolyl groups, xylyl groups, mesityl groups, cumenyl groups, fluorophenyl groups, chlorophenyl groups, bromophenyl groups, chloromethylphenyl groups, hydroxyphenyl groups, methoxyphenyl groups, ethoxyphenyl groups, phenoxyphenyl groups, acetoxyphenyl groups, benzoyloxyphenyl groups, methylthiophenyl groups, phenylthiophenyl groups, methylaminophenyl groups, dimethylaminophenyl groups, acetylaminophenyl groups, carboxyphenyl groups, methoxycarbonylphenyl groups, ethoxycarbonylphenyl groups, phenoxycarbonylphenyl groups, N-phenylcarbamoylphenyl groups, nitrophenyl groups, cyanophenyl groups, sulfophenyl groups, sulfonatophenyl groups, phosphonophenyl groups, and phosphonatophenyl groups, etc. Specific examples of the alkenyl groups in the substituents noted above include vinyl groups, 1-propenyl groups, 1-butenyl groups, cinnamyl groups, 2-chloro-1-ethenyl groups, etc., while specific examples of the alkynyl groups include ethynyl groups, 1-propinyl groups, 1-butynyl groups, trimethylsilyl groups, and phenylethynyl groups, etc. The acyl groups ($R^7CO—$) in the substituents noted above may be ones where $R^7$ is a hydrogen atom, or an alkyl group, aryl group, alkenyl group, or alkynyl group noted above.

Of these substituents, the preferred groups include halogen atoms (—F, —Br, —Cl, —I), alkoxy groups, aryloxy groups, alkylthio groups, arylthio groups, N-alkylamino groups, N,N-dialkylamino groups, acyloxy groups, N-alkylcarbamoyloxy groups, N-arylcarbamoyloxy groups, acylamino groups, formyl groups, acyl groups, carboxyl groups, alkoxycarbonyl groups, aryloxycarbonyl groups, carbamoyl groups, N-alkylcarbamoyl groups, N,N-dialkylcarbamoyl groups, N-arylcarbamoyl groups, N-alkyl-N-arylcarbamoyl groups, sulfo groups, sulfanato groups, sulfamoyl groups, N-alkylsulfamoyl groups, N,N-dialkylsulfamoyl groups, N-arylsulfamoyl groups, N-alkyl-N-arylsulfamoyl groups, phosphono groups, phosphonato groups, dialkylphosphono groups, diarylphosphono groups, monoalkylphosphono groups, alkylphosphonato groups, monoarylphosphono groups, arylphosphonato groups, phosphonoxy groups, phosphonatoxy groups, aryl groups, and alkenyl groups, etc.

The alkylene groups in the substituted alkyl groups may be the alkyl groups noted above having 1 to 20 carbon atoms wherefrom any one carbon atom has been removed to make a bivalent organic remainder group, preferably a straight-chain alkylene group having 1 to 12 carbon atoms, a branched alkylene group having 3 to 12 carbon atoms, or a ring-shaped alkylene group having 5 to 10 carbon atoms.

Specific examples of preferred substituted alkyl groups obtained by combining those substituents and alkylene groups include chloromethyl groups, bromomethyl groups, 2-chloroethyl groups, trifluoromethyl groups, methoxymethyl groups, methoxyethoxyethyl groups, allyloxymethyl groups, phenoxymethyl groups, methylthiomethyl groups, tolylthiomethyl groups, ethylaminoethyl groups, diethylaminopropyl groups, morpholinopropyl groups, acetyloxymethyl groups, benzoyloxymethyl groups, N-cyclohexylcarbamoyloxyethyl groups, N-phenylcarbamoyloxyethyl groups, acetylaminoethyl groups, N-methylbenzoylaminopropyl groups, 2-oxoethyl groups, 2-oxopropyl groups, carboxypropyl groups, methoxycarbonylethyl groups, methoxycarbonylmethyl groups, methoxycarbonylbutyl groups, allyloxycarbonylbutyl groups, chlorophenoxycarbonylmethyl groups, carbamoylmethyl groups, N-methylcarbamoylethyl groups, N,N-dipropylcarbamoylmethyl groups, N-(methoxyphenyl) carbamoylethyl groups, N-methyl-N-(sulfophenyl) carbamoylmethyl groups, sulfopropyl groups, sulfobutyl groups, sulfonatobutyl groups, sulfamoylbutyl groups, N-ethylsulfamoylmethyl groups, N,N-dipropylsulfamoylpropyl groups, N-tolylsulfamoylpropyl groups, N-methyl-N-(phosphonophenyl)sulfamoyloctyl groups, phosphonobutyl groups, phosphonatohexyl groups, diethylphosphonobutyl groups, diphenylphosphonopropyl groups, methylphosphonobutyl groups, methylphosphonatobutyl groups, tolylphosphonohexyl groups, torylphosphonatohexyl groups, phosphonoxypropyl groups, phosphonatoxybutyl groups, benzyl groups, phenethyl groups, α-methylbenzyl groups, 1-methyl-1-phenylethyl groups, p-methylbenzyl groups, cyanamyl groups, allyl groups, 1-propenylmethyl groups, 2-butenyl groups, 2-methylallyl groups, 2-methylpropenylmethyl groups, 2-propenyl groups, 2-butynyl groups, and 3-butynyl groups, etc.

When the $R_{n+1}$, $R_{n+2}$, and $R_{n+3}$ noted earlier represent aryl groups, the aryl groups noted above may be those wherein 1 to 3 benzene rings form a condensed ring, or those wherein a benzene ring and a 5-member unsaturated ring form a condensed ring. Specific examples include phenyl groups, naphthyl groups, anthryl groups, phenanthryl groups, indenyl groups, acenabutenyl groups, and fluorenyl groups, etc., among which the phenyl groups and naphthyl groups are preferred.

When the $R_{n+1}$, $R_{n+2}$, and $R_{n+3}$ noted earlier represent substituted aryl groups, those substituted aryl groups may be the aryl groups noted above having a monovalent non-metal atom group excluding hydrogen as a constituent on the ring-forming carbon atoms. Preferred examples of such substituents include the alkyl groups noted above, substituted alkyl groups, and those groups noted as substituents in the substituted alkyl groups.

Preferred specific examples of such substituted aryl groups include biphenyl groups, tolyl groups, xylyl groups, mesityl groups, cumenyl groups, chlorophenyl groups, bromophenyl groups, fluorophenyl groups, chloromethylphenyl groups, trifluoromethylphenyl groups, hydroxyphenyl groups, methoxyphenyl groups, methoxyethoxyphenyl groups, allyloxyphenyl groups, phenoxyphenyl groups, methylthiophenyl groups, tolylthiophenyl groups, phenylthiophenyl groups, ethylaminophenyl groups, diethylaminophenyl groups, morpholinophenyl groups, acetyloxyphenyl groups, benzoyloxyphenyl groups, N-cyclohexylcarbamoyloxyphenyl groups, N-phenylcarbamoyloxyphenyl groups, acetylaminophenyl groups, N-methylbenzoylaminophenyl groups, carboxyphenyl groups, methoxycarbonylphenyl groups, allyloxycarbonylphenyl groups, chlorophenoxycarbonylphenyl groups, carbamoylphenyl groups, N-methylcarbamoylphenyl groups, N,N-dipropylcarbamoylphenyl groups, N-(methoxyphenyl)carbamoylphenyl groups, N-methyl-N-(sulfophenyl)carbamoylphenyl groups, sulfophenyl groups, sulfonatophenyl groups, sulfamoylphenyl groups, N-ethylsulfamoylphenyl groups, N,N-dipropylsulfamoylphenyl groups, N-tolylsulfamoylphenyl groups, N-methyl-N-(phosphophenyl)sulfamoylphenyl groups, phosphonophenyl groups, phosphonatophenyl groups, diethylphosphonophenyl groups, diphenylphosphonophenyl groups, methylphosphonatophenyl groups, methylphosphonatophenyl groups, tolylphosphonophenyl groups, tolylphosphonatophenyl groups, allyl groups, 1-propenylmethyl groups, 2-butenyl groups, 2-methylallylphenyl groups, 2-methylpropenylphenyl groups, 2-propynylphenyl groups, 2-butynylphenyl groups, and 3-butynylphenyl groups, etc.

When the $R_{n+1}$, $R_{n+2}$, and $R_{n+3}$ noted earlier respectively represent alkenyl groups, substituted alkenyl groups, alkynyl groups, or substituted alkynyl groups (—C($R^8$)═C($R^9$)($R^{10}$), —C≡C($R^{11}$)), the $R^2$, $R^3$, $R^4$, and $R^5$ noted earlier respectively represent monovalent non-metal atomic groups. Preferred examples of $R^8$, $R^9$, $R^{10}$, and $R^{11}$ above include hydrogen atoms, halogen atoms, alkyl groups, substituted alkyl groups, aryl groups, and substituted aryl groups. Specific examples of these include those examples noted earlier. Preferred examples of $R^8$, $R^9$, $R^{10}$, and $R^{11}$ include hydrogen atoms, halogen atoms, and straight-chain, branched, or ring-shaped alkyl groups having 1 to 10 carbon atoms.

Specific examples of $R^8$, $R^9$, $R^{10}$, and $R^{11}$ include methyl groups, ethyl groups, propyl groups, butyl groups, pentyl groups, hexyl groups, heptyl groups, octyl groups, nonyl groups, decyl groups, undecyl groups, dodecyl groups, tridecyl groups, hexadecyl groups, octadecyl groups, eicosyl groups, isopropyl groups, isobutyl groups, s-butyl groups, t-butyl groups, isopentyl groups, neopentyl groups, 1-methylbutyl groups, isohexyl groups, 2-ethylhexyl groups, allyl groups, 1-propenylmethyl groups, 2-butenyl groups, 2-methylallyl groups, 2-methylpropenyl groups, 2-propenyl groups, 2-butynyl groups, 3-butynyl groups, benzyl groups, phenethyl groups, α-methylbenzyl groups, 1-methyl-1-phenylethyl groups, p-methylbenzyl groups, cyanamyl groups, hydroxyethyl groups, methoxyethyl groups, phenoxydiethyl groups, allyloxyethyl groups, methoxyethoxyethyl groups, ethoxyethoxyethyl groups, morpholinoethyl groups, morpholinopropyl groups, sulfopropyl groups, sulfonatopropyl groups, sulfobutyl groups, sulfonatobutyl groups, carboxydimethyl groups, carboxydiethyl groups, carboxypropyl groups, methoxycarbonylethyl groups, 2-ethylhexyloxycarbonylethyl groups, phenoxycarbonylmethyl groups, methoxycarbonylpropyl groups, N-methylcarbamoylethyl groups, N,N-ethylaminocarbamoylmethyl groups, N-phenylcarbamoylpropyl groups, N-tolylsulfamoylbutyl groups, P-triensulphonylaminopropyl groups, benzoylaminohexyl groups, phosphonomethyl groups, phosphonoethyl groups, phosphonopropyl groups, p-phosphonobenzylaminocarbonylethyl groups, phosphonatomethyl groups, phosphonatopropyl groups, phosphonatobutyl groups, p-phosphonatobenzylaminocarbonylethyl groups, vinyl groups, and ethynyl groups.

When the $R_{n+1}$, $R_{n+2}$, and $R_{n+3}$ noted earlier represent substituted carbonyl groups ($R^{12}$CO—), the $R^{12}$ represents a monovalent non-metal atomic group. Preferred examples of the substituted carbonyl group include formyl groups, acyl groups, carboxyl groups, alkoxycarbonyl groups, aryloxycarbonyl groups, carbamoyl groups, N-alkylcarbamoyl groups, N,N-dialkylcarbamoyl groups, N-arylcarbamoyl groups, N,N-diarylcarbamoyl groups, and N-alkyl-N-arylcarbamoyl groups. For the alkyl groups and aryl groups therein, the alkyl groups, substituted alkyl groups, aryl groups, and substituted aryl groups noted earlier may be cited as examples. To be preferred among these are, for the substituted carbonyl groups, formyl groups, acyl groups, carboxyl groups, alkoxycarbonyl groups, aryloxycarbonyl groups, carbamoyl groups, N-alkylcarbamoyl groups, N,N-dialkylcarbamoyl groups, and N-arylcarbamoyl groups, with formyl groups, acyl groups, alkoxycarbonyl groups, and aryloxycarbonyl groups being particularly preferable. Specific examples of preferable substituted carbonyl groups include formyl groups, acetyl groups, benzoyl groups, carboxyl groups, methoxycarbonyl groups, allyloxycarbonyl groups, N-methylcarbamoyl groups, N-phenylcarbamoyl groups, N,N-diethylcarbamoyl groups, and morpholinocarbonyl groups, etc.

When the $R_{n+1}$, $R_{n+2}$, and $R_{n+3}$ noted earlier represent substituted thio groups ($R^{13}$S—), the $R^{13}$ represents a monovalent non-metal atomic group excluding hydrogen. Preferred examples of the substituted thio groups include alkylthio groups, arylthio groups, alkyldithio groups, aryldithio groups, and acylthio groups. For the alkyl groups and aryl groups therein, the alkyl groups, substituted alkyl groups, aryl groups, and substituted aryl groups noted earlier may be cited as examples, with the $R^1$ in the acyl group ($R^1$CO—) in the acylthio group being as noted earlier. Among these, the alkylthio groups and arylthio groups are to be preferred. Specific examples of preferred substituted thio groups include methylthio groups, ethylthio groups, phenylthio groups, ethoxyethylthio groups, carboxylethylthio groups, and methoxycarbonylthio groups, etc.

When the $R_{n+1}$, $R_{n+2}$, and $R_{n+3}$ noted earlier represent substituted sulfonyl groups ($R^{14}SO_2$—), the $R^{14}$ represents a monovalent non-metal atomic group. Preferred examples thereof include alkylsulfonyl groups and arylsulfonyl groups. For the alkyl groups and aryl groups therein, the alkyl groups, substituted alkyl groups, aryl groups, and substituted aryl groups noted earlier may be cited as examples. Specific examples of the substituted sulfonyl group include butylsulfonyl groups and chlorophenylsulfonyl groups, etc.

When the $R_{n+1}$, $R_{n+2}$, and $R_{n+3}$ noted earlier represent substituted sulfinyl groups ($R^{15}$SO—), the $R^{15}$ represents a monovalent non-metal atomic group. Preferred examples include alkylsulfinyl groups, arylsulfinyl groups, sulfinamoyl groups, N-alkylsulfinamoyl groups, N,N-dialkylsulfinamoyl groups, N-arylsulfinamoyl groups, N,N-diarylsulfinamoyl groups, and N-alkyl-N-arylsulfinamoyl groups. For the alkyl groups and aryl groups therein, the alkyl groups, substituted alkyl groups, aryl groups, and substituted aryl groups noted earlier may be cited as examples. The preferred examples among these are alkylsulfinyl groups and arylsulfinyl groups. Specific examples of such substituted sulfinyl groups include hexylsulfinyl groups, benzylsulfinyl groups, and tolylsulfinyl groups, etc.

When the $R_{n+1}$, $R_{n+2}$, and $R_{n+3}$ noted earlier represent substituted oxy groups ($R^{16}O$—), the $R^{16}$ represents a monovalent non-metal atomic group excluding hydrogen. Preferred substituted oxy groups are alkoxy groups, aryloxy groups, acyloxy groups, carbamoyloxy groups, N-alkcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, phosphonoxy groups, and phosphonatoxy groups. For the alkyl groups and aryl groups therein, the alkyl groups, substituted alkyl groups, aryl groups, and substituted aryl groups noted earlier may be cited as examples.

For the acyl groups ($R^7CO$—) in the acyloxy groups noted above, the $R^7$ may be one of the alkyl groups, substituted alkyl groups, aryl groups, or substituted aryl groups noted earlier. Among those substituted oxy groups, the alkoxy groups, aryloxy groups, acyloxy groups, and arylsulfoxy groups are to be preferred. Examples of preferred substituted oxy groups include methoxy groups, ethoxy groups, propyloxy groups, isopropyloxy groups, butyloxy groups, pentyloxy groups, hexyloxy groups, dodecyloxy groups, benzyloxy groups, allyloxy groups, phenethyloxy groups, carboxylethyloxy groups, methoxycarbonylethyloxy groups, ethoxycarbonylethyloxy groups, methoxyethoxy groups, phenoxyethoxy groups, methoxyethoxyethoxy groups, ethoxyethoxyethoxy groups, morpholinoethoxy groups, morpholinopropyloxy groups, allyoxyethoxyethoxy groups, phenoxy groups, tolyloxy groups, xylyloxy groups, mesityloxy groups, cumenyloxy groups, methoxyphenyloxy groups, ethoxyphenyloxy groups, chlorophenyloxy groups, bromophenyloxy groups, acetyloxy groups, benzoyloxy groups, naphthyloxy groups, phenylsulfonyloxy groups, phosphonoxy groups, and phosphonatoxy groups, etc.

When the $R_{n+1}$, $R_{n+2}$, and $R_{n+3}$ noted earlier represent substituted amino groups ($R^{17}NH$—,($R^{18}$)($R^{19}$)N—), the $R^{17}$, $R^{18}$, and $R^{19}$ respectively represent monovalent non-metal atomic groups excluding hydrogen. Preferred examples of the substituted amino groups are N-alkylamino groups, N,N-dialkylamino groups, N-arylamino groups, N,N-diarylamino groups, N-alkyl-N-arylamino groups, acylamino groups, N-alkylacylamino groups, N-arylacylamino groups, ureido groups, N'-alkylureido groups, N', N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N', N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N- alkoxycarbonylamino groups, N-alkyl-N-aryloxycarbonylamino groups, N-aryl-N- alkoxycarbonylamino groups, and N-aryl-N-aryloxycarbonylamino groups.

For the alkyl groups and aryl groups therein, the alkyl groups, substituted alkyl groups, aryl groups, and substituted aryl groups noted earlier may be cited as examples, with the $R^1$ in the acyl group ($R^1CO$—) in the acylamino groups, N-alkylacylamino groups, and N-arylacylamino groups being the same as noted earlier. Of these, the N-alkylamino groups, N,N-dialkylamino groups, N-arylamino groups, and acylamino groups are to be preferred.

Specific examples of preferred substituted amino groups are methylamino groups, ethylamino groups, diethylamino groups, morpholino groups, piperidino groups, pyrrolidino groups, phenylamino groups, benzoylamino groups, and acetylamino groups, etc.

In the general formula (I) given earlier, $G_a^-$ represents an anionic substituent, and may have a ring structure. $G_b$ represents a neutral substituent, and may have a ring structure. These may, respectively, be represented by the structures diagrammed below.

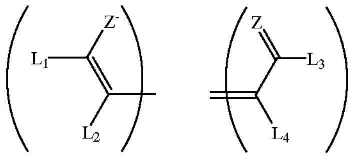

In the formulas above, $L_1$ to $L_4$ represent mutually independent hydrogen atoms, halogen atoms, cyano groups, the alkyl groups noted above, aryl groups, alkenyl groups, alkynyl groups, carbonyl groups, thio groups, sulfonyl groups, sulfinyl groups, oxy groups, or amino groups. $L_1$ and $L_2$, and $L_3$ and $L_4$, may be linked to form a ring structure. Preferred examples of $G_b$ include the acidic nucleus of cyanine dye, and of $G_a^-$ include such wherein the acidic nucleus has been anionized. The acidic nucleus may be a compound described in "The Theory of the Photographic Process," p. 199, table 8, 2-B, or any of the nucleii listed below.

1) 1,3-dicarbonyl nuclei such as 1,3-indan dione, 1,3-cyclohexane dione, and 5,5-dimethyl-1,3-cyclohexane dione, 1,3-dioxane-4,6-dione,
2) pyrazolinone nucleii such as 3-methyl-1-phenyl-2-pyrazoline-5-one, 1-phenyl-2-pyrazoline-5-one, 1-phenyl-2-pyrazoline-S-one, 1-(2-benzothiazoryl)-3-methyl-2-pyrazoline-5-one,
3) isooxazolinone nucleii such as 3-phenyl-2-isooxazoline-5-one, 3-methyl-2-isooxazoline-5-one, etc.,
4) oxyindole nucleii such as 1-alkyl-2,3-dihydro-2-oxyindole,
5) 2,4,6-triketohexahydropyriridine nucleii such as barbituric acid or 2-thiobarbituric acid and derivatives thereof, such derivatives including such 1-alkyl bodies as 1-methyl and 1-ethyl, such 1,3-dialkyl bodies as 1,3-diethyl and 1,3-dibutyl, such 1,3-diaryl bodies as 1,3-diphenyl, 1,3-di(p-chlorophenyl-, and 1,3-di(p-ethoxycarbonylphenyl), and such 1-alkyl-3-aryl bodies as 1-ethyl-3-phenyl,
6) 2-thio-2,4-thiazoline dione nucleii such as rhodanine and derivatives thereof, such derivatives including 3-ethylrhodanine, such 3-alkylrhodanines as 3-arylrhodanine, and such 3-arylrhodinines as 3-phenylrhodanine,
7) 2-thio-2,4-oxazolidine dione (2-thio-2,4-(3H,5H)-oxazol dione) nucleii such as 2-ethyl-2-thio-2,4-oxazolidine dione,
8) thianaphthenone nucleii such as 3(2H)-thianaphthenone and 3(2H)-thianaphthenone-1,1-dioxide,
9) 2-thio-2,5-thiazolidine dione nucleii such as 3-ethyl-2-thio-2,5-thiazolidine dione,
10) 2,4-thiazolidine dione nucleii such as 2,4-thiazolidine dione, 3-ethyl-2,4-thiazolidine dione, and 3-phenyl-2,4-thiazolidine dione,
11) thiazolidinone nucleii such as 4-thiazolidinone and 3-ethyl4-thiazolidinone,
12) 4-thiazolinone nucleii such as 2-ethylmercapto-5-thiazoline-4-one and 2-alkylphenylamino-5-thiazoline-4-one, 13) 2-imino-2-oxozoline-4-one (congealed hydantoin) nucleii, 14) 2,4-imidazolidine dione (hydantoin) nucleii such as 2,4-imidazolidine dione and 3-ethyl-2,4-imidazolidine dione, 15) 2-thio-2,4-imidazolidine dione (2-thiohydantoin) nucleii such as 2-thio-2,4-imidazolidine dione and 3-ethyl-2-thio-2,4-imidazolidine dione, 16) 2-imidazoline-5-one nucleii such as 2-n-propyl-mercapto-2-imidazoline-5-one, 17) faran-5-one, 18) 4-hydroxy-2(1H)-quinolinone nucleii or 4-hydroxy-2(1H)-pyridinone nucleii such as N-methyl-4-hydroxy-2(1H)-quinolinone, N-n-butyl-4-hydroxy-2(1H)-quinolinone, and N-methyl4-hydroxy-2(1H)-pyridinone, 19) substituted or non-substituted 4-hydroxy-2H-pyrane-2-one and 4-hydroxycoumarin, and 20) substituted or non-substituted thioindoxyl such as 5-methylthioindoxyl.

In the formulas noted above, moreover, Z represents a chalcogen atom or a —C($Y_1$)($Y_2$) group. Here, $Y_1$ and $Y_2$ may be the same or different, representing, respectively, —CN, —$CO_2$R', or —$SO_2$R". R' and R" represent alkyl groups or aryl groups such as noted earlier.

In the general formula (I) given earlier, $X^{m+}$ (hereinafter called a "counter-cation") represents a hydrogen ion or cation of m valence where m is an integer from 1 to 6.

In a preferred mode of the anionic infrared absorbing agent, the counter-cation is interactive with the binder. Such a counter-cation may have an onium salt structure, where the onium salt may be an ammonium salt, diazonium salt, oxonium salt, sulfonium salt, selenium salt, phosphonium salt, carbonium salt, or iodonium salt.

Preferred examples of such onium salts include, for example, the diazonium salts cited in S. I. Schlesinger, Photogr. Sci. Eng., 18, 387 (1974), T. S. Bal et al, Polymer, 21, 423 (1980), and JP-A No. 5-158230, the ammonium salts cited in U.S. Pat. No. 4,069,055, U.S. Pat. No. 4,069,056, and JP-A No. 3-140140, the phosphonium salts cited in D. C. Necker et al, Macromolecules, 17, 2468 (1984), C. S. Wen et al, The, Proc. Configuration. Rad. Curing ASIA, p 478 Tokyo, October (1988), U.S. Pat. No. 4,069,055, and U.S. Pat. No. 4,069,056, the iodonium salts cited in J. V. Crivello et al, Macromolecules, 10 (6), 1307 (1977), Chem. & Eng. News, Nov. 28, p 31 (1988), European Patent No. 104,143, U.S. Pat. No. 339,049, U.S. Pat. No. 410,201, JP-A No. 2-150848, and JP-A No. 2-296514, the sulfonium salts cited in J. V. Crivello et al, Polymer J. 17, 73 (1985), J. V. Crivello et al. J. Org. Chem., 43, 3055 (1978), W. R. Watt et al, J. Polymer Sci., Polymer Chem. Ed., 22, 1789 (1984), J. V. Crivello et al, Polymer Bull., 14, 279 (1985), J. V. Crivello et al, Macromolecules, 14 (5), 1141 (1981), J. V. Crivello et al, J. Polymer Sci., Polymer Chem. Ed., 17, 2877 (1979), European Patent No. 370,693, European Patent No. 233, 567, European Patent No. 297,443, European Patent No. 297,442, U.S. Pat. No. 4,933,377, U.S. Pat. No. 3,902, 114, U.S. Pat. No. 410,201, U.S. Pat. No. 339,049, U.S. Pat. No. 4,760,013, U.S. Pat. No. 4,734,444, U.S. Pat. No. 2,833,827, German Patent No. 2,904,626, German Patent No. 3,604,580, and German Patent No. 3,604,581, the selenonium salts cited in J. V. Crivello et al, Macromolecules, 10 (6), 1307 (1977), and J. V. Crivello et al, J. Polymer Sci., Polymer Chem. Ed., 17, 1047 (1979), and the aluzonium salts cited in C. S. Wen et al, The, Proc. Configuration. Rad. Curing ASIA, p 478 Tokyo, October (1988).

The ammonium salts, phosphonium salts, sulfonium salts, and iodonium salts cited in JP-A No. 9-134009 are also well suited for use in the present invention.

The oxonium salts noted above are represented by the general formulas (A) or (B) below.

(A)

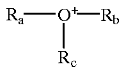

(B)

$$R_d—O^+=R_e$$

In these formulas, $R_a$ to $R_d$, respectively, independently represent alkyl groups or aryl groups, and $R_e$ represents an alkylyn group or an arylyn group. Also, adjacent groups $R_a$ to $R_c$, or $R_d$ and $R_e$, may mutually bond to form a ring structure.

The selenium salts noted above are represented by the general formulas (C) or (D) below.

(C)

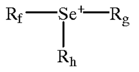

(D)

$$R_i—Se^+=R_j$$

In these formulas, $R_f$ to $R_i$, respectively, independently represent alkyl groups or aryl groups, and $R_j$ represents an alkylyn group or an arylyn group. Also, adjacent groups $R_f$ to $R_g$, or $R_i$ and $R_j$, may mutually bond to form a ring structure.

The diazonium salts noted above are represented by the general formula (E) below.

$$R_k—N^+\equiv N \quad (E)$$

In this formula, $R_k$ represents an alkyl group or an aryl group.

The carbonium salts noted above are represented by the general formulas (F) or (G) below.

(F)

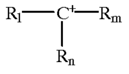

(G)

$$R_o—C^+=R_p$$

In these formulas, $R_l$ to $R_o$, respectively, independently represent alkyl groups or aryl groups, and $R_p$ represents an alkylyn group or an arylyn group. Also, adjacent groups $R_l$ to $R_m$, or $R_o$ and $R_p$, may mutually bond to form a ring structure.

Other preferred onium salts are represented by the general formulas (H) to (K) below.

(H)

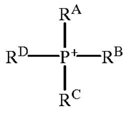

-continued (I)

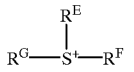

(J)

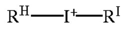

(K)

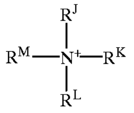

In these formulas, $R^A$, $R^B$, $R^C$, $R^D$, $R^J$, $R^K$, $R^L$ and $R^M$, respectively, independently represent alkyl groups, aryl groups, or aralkyl groups. $R^A$, $R^B$, $R^C$, and $R^D$ may mutually bond to form a ring, and $R^J$, $R^K$, $R^L$ and $R^M$ may mutually bond to form a ring. $R^E$, $R^F$ and $R^G$, respectively, independently represent alkyl groups or aryl groups. $R^E$, $R^F$ and $R^G$ may mutually bond to form a ring. $R^H$ and $R^I$, respectively, independently represent alkyl groups.

Preferred examples include modes wherein the counter-cation is a thermally decomposing onium salt. By thermally decomposing onium salt here is meant an onium salt wherewith, when measured by differential thermal/thermogravimetric analysis or a melting point measuring device, the temperature at which 10 mol % decomposition occurs is 200° C. or lower.

Such thermally decomposing onium salts can be easily obtained by changing a substituent in the onium salt. The thermally decomposing onium salts used here may be ammonium salts, diazonium salts, oxonium salts, sulfonium salts, selenium salts, phosphonium salts, carbonium salts, or iodonium salts, so long as the thermal decomposition properties thereof satisfy the condition noted above.

In the general formula (I) given earlier, the anionic dye skeleton can be represented by the general formula (IV) below.

$$G_{a\theta}^{-}—M_{\alpha\phi}—G_{b\theta} \quad \text{(IV)}$$

In this formula, θ, α, and φ, respectively, are variables, and, by combining the respective partial structures $G_a\theta$, $M\alpha\phi$, and $G_b\theta$, specific structures of the anionic dye skeleton can be represented. When, for example, the partial structures $G_{a1}$, $M_{f3}$, and $G_{b2}$ are as diagrammed below, namely $G_{a1}$ = 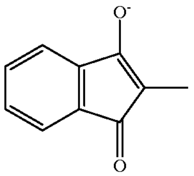

$M_{f3}$ = 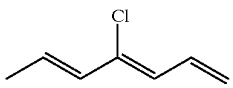

-continued $G_{b2}$ = 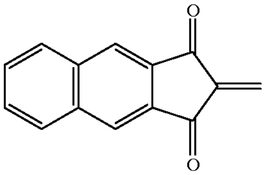

the combined anionic dye skeleton takes on the structure diagrammed below.

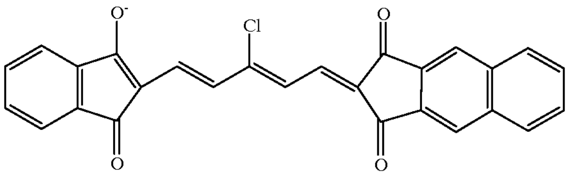

Example partial structures for anionic dye skeletons, examples of anionic dye structures, and specific examples of preferred onium salts for the counter-ion are now diagrammed, but the present invention is not limited to or by these specific examples.

The following are given as examples of the partial structure $G_a\theta$.

$G_{a1}^{-}$

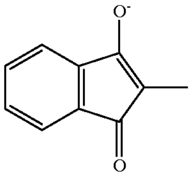

$G_{a2}^{-}$

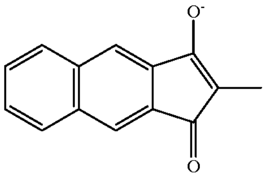

$G_{a3}^{-}$

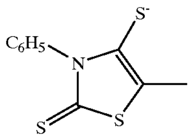

$G_{a4}^{-}$

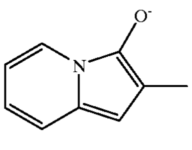

$G_{a5}^{-}$

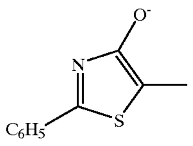

-continued
$G_{a6}^-$
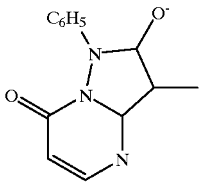
$G_{a7}^-$
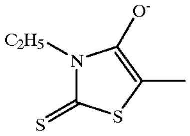
$G_{a8}^-$
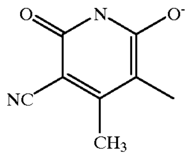
$G_{a9}^-$
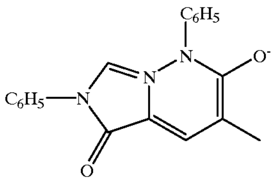
$G_{a10}^-$
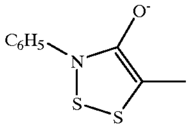
$G_{a11}^-$
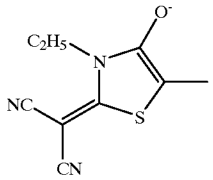
$G_{a12}^-$
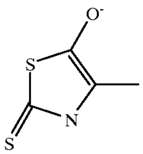
$G_{a13}^-$
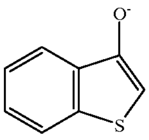
The following are given as examples of the partial structure $G_b\theta$.
Gb 1
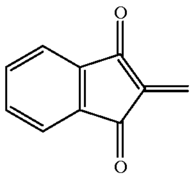
Gb 2
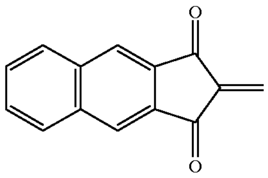
Gb 3
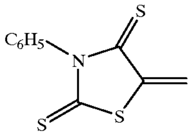
Gb 4
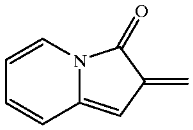
Gb 5
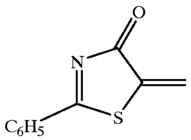
Gb 6
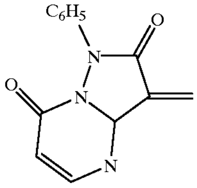
Gb 7
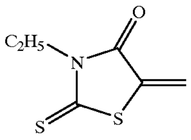
Gb 8
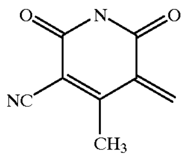
Gb 9
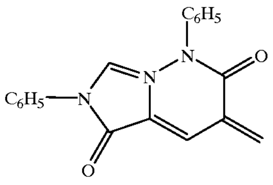

-continued
Gb 10
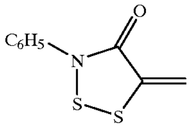
Gb 11
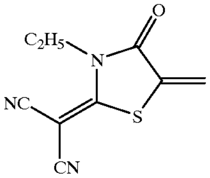
Gb 12
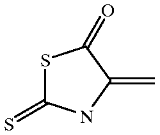
Gb 13
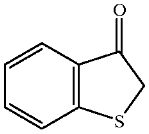
The following are given as examples of the methine chain Mαϕ.
Ma
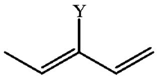
Mb
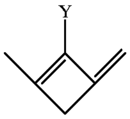
Mc
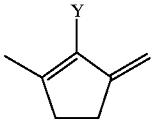
Md
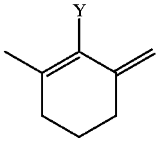
Me
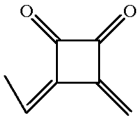
Mf
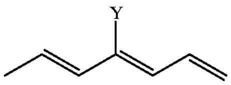
-continued
Mg
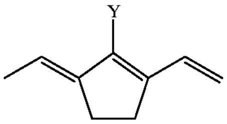
Mh
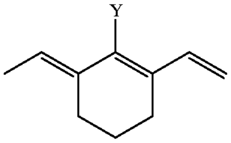
Mi
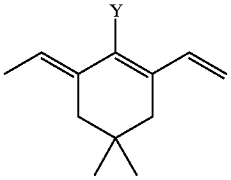
Mj
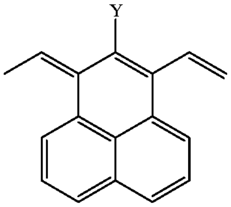
Mk
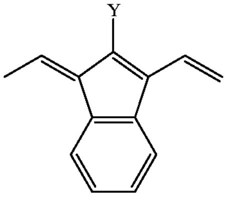
Ml
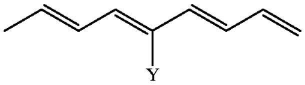
Mm
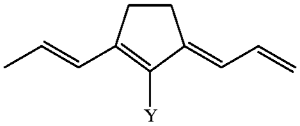
Mn
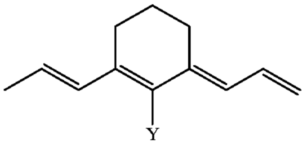
Mo
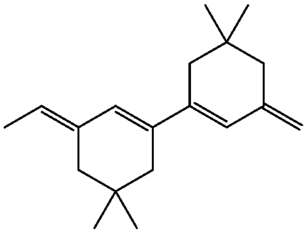

-continued
Mp
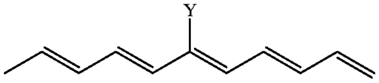
Mq
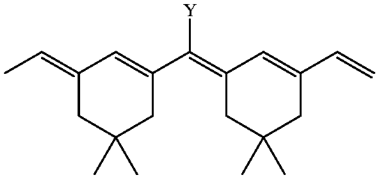
Mr
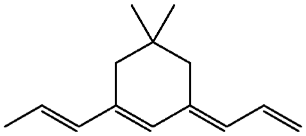
Ms
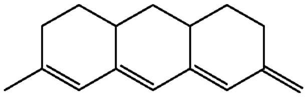
The following are given as examples of the substituent Y when the methine chain Mαφ has a substituent.
1
—H
2
—F
3
—Cl
4
—Br
5
—I
6
—CN
7
—$CH_3$
8
—$C_2H_5$
9
—$^nC_3H_7$
10
—$^iC_3H_7$
11
—$^nC_4H_9$
12
—$^tC_4H_9$
13
—$^nC_5H_{11}$
14
—$^nC_6H_{13}$
15
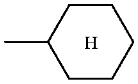
16
—$CH_2$—$C_6H_5$
-continued
17
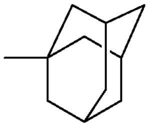
18
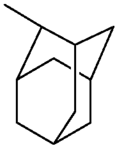
19
—$CF_3$
20
—$C_8H_{17}$
21
—$C_6H_5$
22
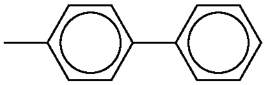
23
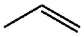
24
25
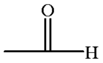
26
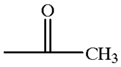
27
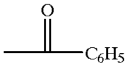
28
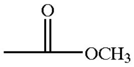
29
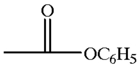
30
—$SCH_3$
31
—$SC_2H_5$
32
—$SC_6H_5$
33
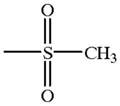
34
—$OCH_3$
35
—$OC_2H_5$
36
—$OC_6H_5$
37
—$N(CH_3)_2$ -continued
38
$-N(C_2H_5)_2$
The following are given as examples of anionic dye skeletons.
IR-1
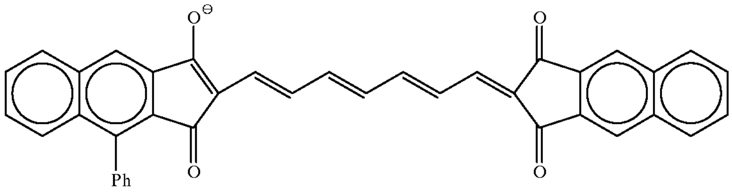
IR-2
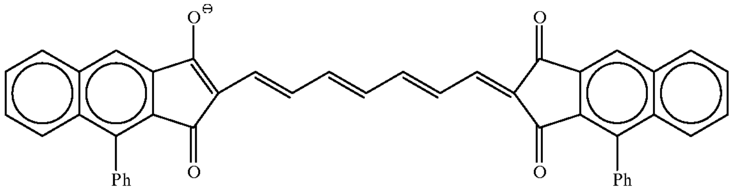
IR-3
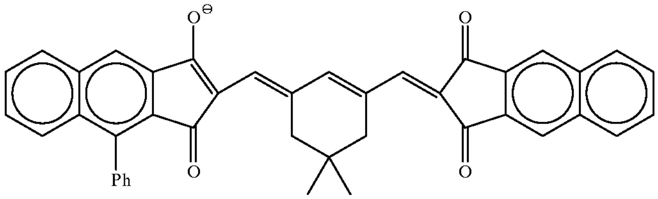
IR-4
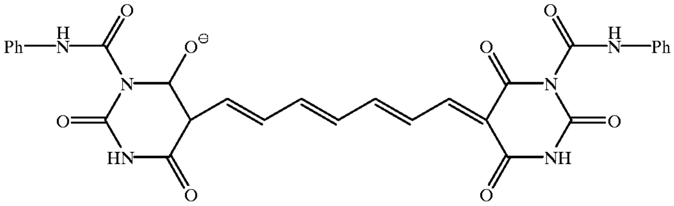
IR-5
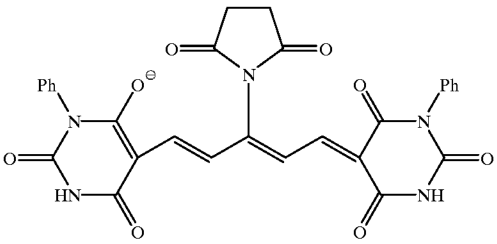
IR-6
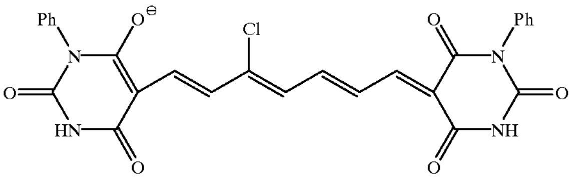

-continued
IR-7
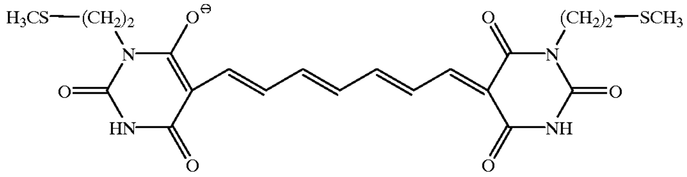
IR-8
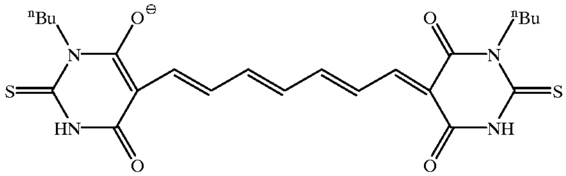
IR-9
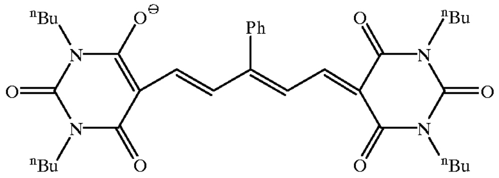
IR-10
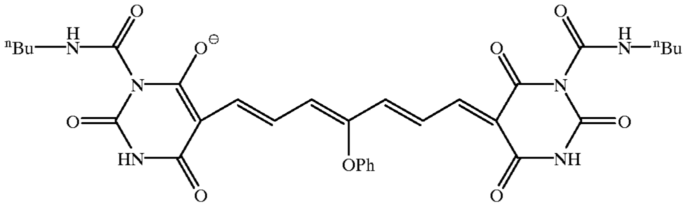
IR-11
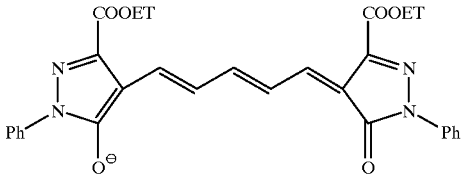
IR-12
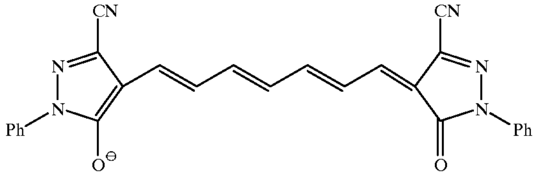
IR-13
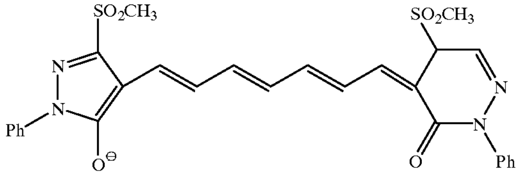
IR-14
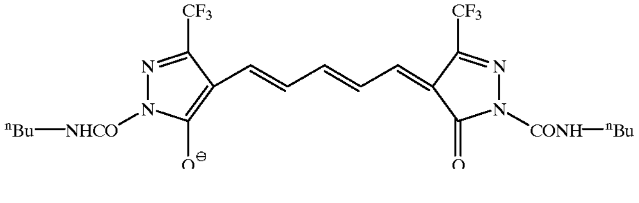

The following are given as examples of very suitable counter-cation partial structures represented by the general formulas (A) to (G) given earlier.

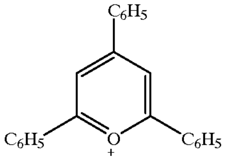
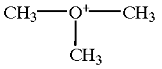
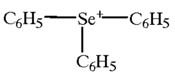
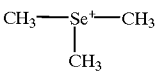
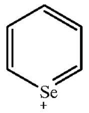
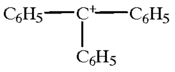
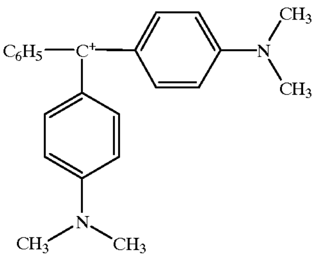
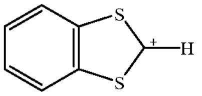

The following are given as examples of very suitable counter-cation partial structures represented by the general formula (H) given earlier.

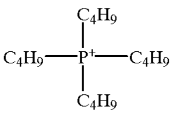
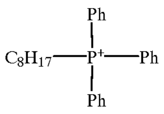
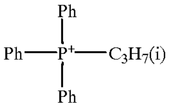
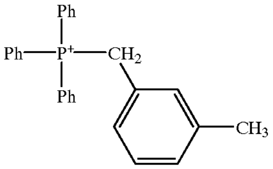
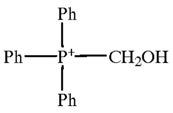
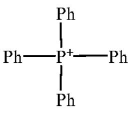
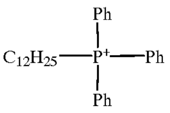
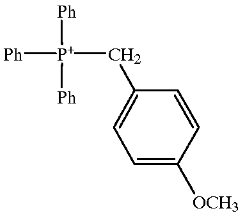
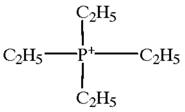
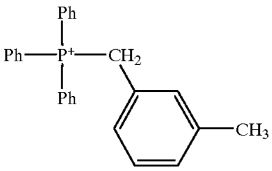
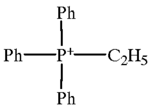

The following are given as examples of very suitable counter-cation partial structures represented by the general formula (I) given earlier.

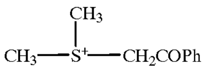
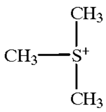
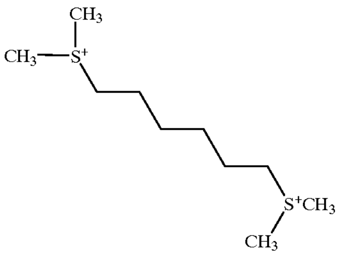
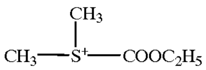
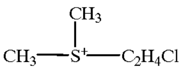
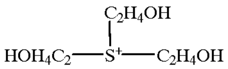
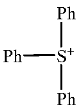
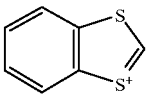
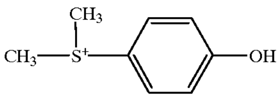
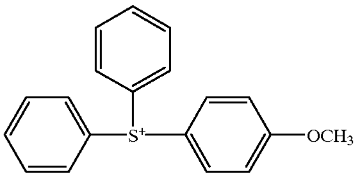
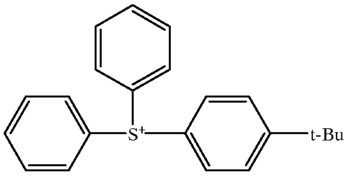
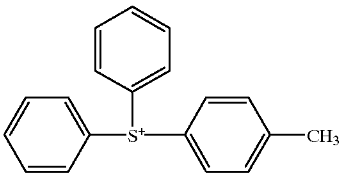
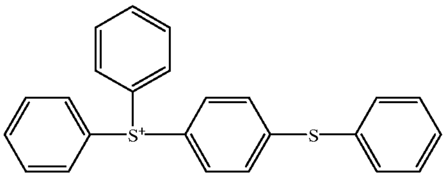
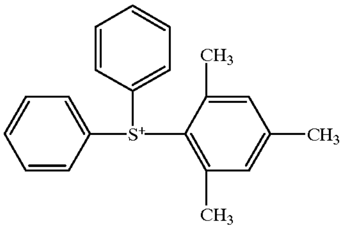

-continued

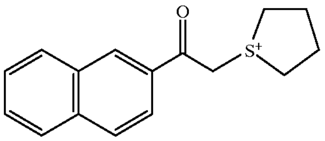
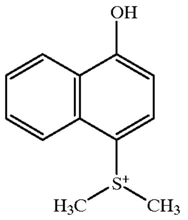
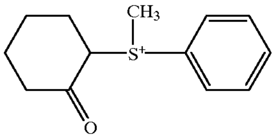

The following are given as examples of very suitable counter-cation partial structures represented by the general formula (J) given earlier.

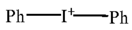
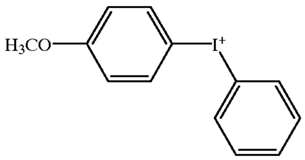
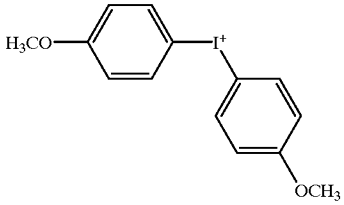
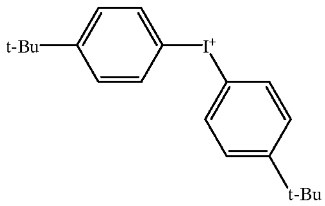
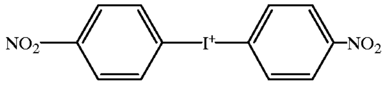

The following are given as examples of very suitable counter-cation partial structures represented by the general formula (K) given earlier.

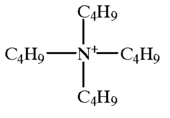
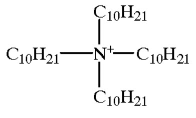
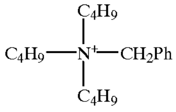
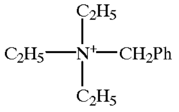
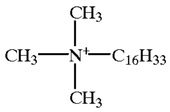
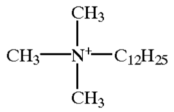

-continued

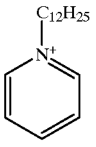
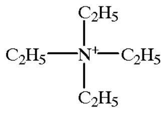
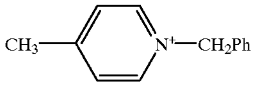
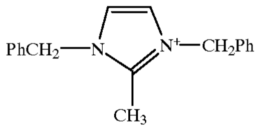
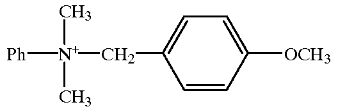
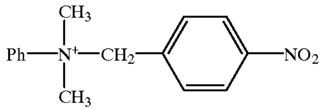
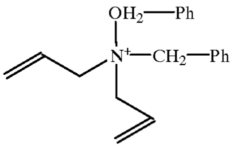
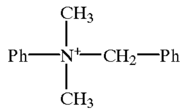

The synthesis of the anionic infrared absorbing agent used in the present invention can be performed by condensing a compound containing active methylene and a methylene chain donor in the presence of a base. This method of synthesis can be performed according to a common method of synthesizing dyes, such as the oxonol pigment synthesizing method described in "Senryo to Yakuhin (Dyes & Pharmaceuticals)" (1991), pages 274–289.

In the present invention, the oxonol dye represented by the general formula (I) given earlier is preferable in terms of absorbency. Such dyes include those described in European Patent No. 444,786 and European Patent No. 397,435, but those described in Japanese Patent Application Nos. 10-237634 and 10-270097 are to be preferred. Those described in JP-A No. 10-297103 can also be used.

(d-2) Infrared Absorbing Agent Expressed by General Formula (II) Above:

In the general formula (II), $R^1$ to $R^4$ each independently represent a hydrogen atom, alkyl group, or aryl group.

$R^5$ and $R^6$ each independently represent an alkyl group, substituted oxy group, or halogen atom.

n and m each independently represent an integer from 0 to 4.

$R^1$ and $R^2$, or $R^3$ and $R^4$, respectively, may bond to form a ring. Also, $R^1$ and/or $R^2$ may bond with $R^5$, and $R^3$ and/or $R^4$ may bond with $R^6$, to form a ring. Moreover, the $R^5$'s themselves or the $R^6$'s themselves may mutually bond to form a ring.

$Z^1$ and $Z^2$ are each independently a hydrogen atom, alkyl group, or aryl group, and at least one or other of $Z^1$ and $Z^2$ represents either a hydrogen atom or an alkyl group.

Q is a trimethine group or pentamethine group that may have a substituent, and may form a ring structure together with a bivalent organic group.

X represents a counter-anion.

Specific examples of such infrared absorbing agents having the general formula (II) are given below, but the present invention is not limited to or by these specific examples.

The alkyl groups, aryl groups, and substituted oxy groups in $R^1$ to $R^4$, $R^5$ and $R^6$, and $Z^1$ and $Z^2$ are the same as the groups listed in connection with $R_{n+1}$, $R_{n+2}$, and $R_{n+3}$ in the description pertaining to general formula (I).

The halogen atom in $R^5$ and $R^6$ may be fluorine, chlorine, bromine, or iodine, etc. $R^1$ and $R^2$, or $R^3$ and $R^4$, respectively, may bond to form a ring. Also, $R^1$ or $R^2$ may bond with $R^5$, and $R^3$ or $R^4$ may bond with $R^6$, to form a ring. Moreover, when m and n noted above are 2 or greater, the $R^5$'s themselves or the $R^6$'s themselves may mutually bond to form a ring. When me or n is 2, $R^1$ and $R^2$ may bond with $R^5$, or $R^3$ and $R^4$ may bond with $R^6$ to form a ring.

n and m each independently represent an integer from 0 to 4.

It is necessary that at least one or other of $Z^1$ and $Z^2$ be either a hydrogen atom or an alkyl group. In the present invention, by using such an infrared absorbing agent as this, outstanding solvent solubility [is obtained], and favorable image formability can be manifested even when the quantity of additives to the photosensitive composition is reduced.

For the Q substituent, a monovalent non-metal atomic group excluding hydrogen is used. Preferred examples include, to begin with, alkyl groups and aryl groups that may have a substituent. For specific examples of these alkyl groups and aryl groups, the examples cited as alkyl groups and aryl groups in $R^1$ to $R^4$ and $Z^1$ and $Z^2$ may be cited as preferred examples. For preferred examples of Q substituents may also be cited alkenyl groups and alkynyl groups that may have a substituent. Such alkenyl groups include, for example, vinyl groups, phenylvinyl groups, dialkylaminophenylvinyl groups, phenylvinyl groups, 1-propenyl groups, 1-butenyl groups, cinnamyl groups, and 2-chloro-1-ethenyl groups, etc., while such alkynyl groups include ethynyl groups, 1-propynyl groups, 1-butynyl groups, trimethylsilylethynyl groups, and phenylethynyl groups, etc. And for preferred examples of Q substituents may be cited those same groups cited above as alkyl group substituents in $R^1$ to $R^4$, $R^5$ and $R^6$, and $Z^1$ and $Z^2$ in the general formula (II).

The alkyl groups described earlier may be cited as specific examples of the alkyl groups in these substituents. Specific examples of the aryl groups therein that may be cited include phenyl groups, biphenyl groups, naphthyl groups, tolyl groups, xylyl groups, mesityl groups, cumenyl groups, fluorophenyl groups, chlorophenyl groups, bromophenyl groups, chloromethylphenyl groups, hydroxyphenyl groups, methoxyphenyl groups, ethoxyphenyl groups, phenoxyphenyl groups, acetoxyphenyl groups, benzoyloxyphenyl groups, methylthiophenyl groups, phenylthiophenyl groups, methylaminophenyl groups, dimethylaminophenyl groups, acetylaminophenyl groups, carboxyphenyl groups, methoxycarbonylphenyl groups, ethoxycarbonylphenyl groups, phenoxycarbonylphenyl groups, N-phenylcarbamoylphenyl groups, phenyl groups, nitrophenyl groups, cyanophenyl groups, sulfophenyl groups, sulfonatophenyl groups, phosphonophenyl groups, and phosphonatophenyl groups, etc.

In the acyl groups ($R^1CO$—) noted earlier, $R^1$ may be a hydrogen atom and an alkyl group, aryl group, alkenyl group, or alkynyl group noted earlier.

Of these substituents, the groups to be preferred include alkyl groups, aryl groups, alkenyl groups, halogen atoms (—F, —Br, —Cl, —I), alcoxy groups, hydroxyl groups, aryloxy groups, alkylthio groups, arylthio groups, N-alkylamino groups, N,N-dialkylamino groups, acyloxy groups, N-alkylcarbamoyloxy groups, N-arylcarbamoyloxy groups, acylamino groups, formyl groups, acyl groups, carboxyl groups, alkoxycarbonyl groups, aryloxycarbonyl groups, carbamoyl groups, N-alkylcarbamoyl groups, N,N-dialkylcarbamoyl groups, N-arylcarbamoyl groups, N-alkyl-N-arylcarbamoyl groups, sulfo groups, sulfonato groups, sulfamoyl groups, N-alkylsulfamoyl groups, N,N-dialkylsulfamoyl groups, N-arylsulfamoyl groups, N-alkyl-N-arylsulfamoyl groups, phosphono groups, phosphonato groups, dialkylphosphono groups, diarylphosphono groups, monoalkylphosphono groups, alkylphosphonato groups, monoarylphosphono groups, arylphosphonato groups, phosphonoxy groups, and phosphonatoxy groups, etc.

Other anions include:

1) perchlorate ions,
2) trifluoromethyl sulfurous acid ions,
3) methane sulfonic acid ions,
4) ethane sulfonic acid ions,
5) 1-propane sulfonic acid ions,
6) 2-propane sulfonic acid ions,
7) n-butane sulfonic acid ions,
8) allyl sulfonic acid ions,
9) 10-camphor sulfonic acid ions,
10) trifluoromethane sulfonic acid ions,
11) pentafluoroethane sulfonic acid ions,
12) benzene sulfonic acid ions,
13) p-toluene sulfonic acid ions,
14) 3-methoxybenzene sulfonic acid ions,
15) 4-methoxybenzene sulfonic acid ions,
16) 4-hydroxybenzene sulfonic acid ions,
17) 4-chlorobenzene sulfonic acid ions,
18) 3-nitrobenzene sulfonic acid ions,
19) 4-nitrobenzene sulfonic acid ions,
20) 4-acetylbenzene sulfonic acid ions,
21) pentafluorobenzene sulfonic acid ions,
22) 4-dodecylbenzene sulfonic acid ions,
23) mesitylene sulfonic acid ions,
24) 2,4,6-triisopropylbenzene sulfonic acid ions,
25) 2-hydroxy4-methoxybenzophenone-5-sulfonic acid ions,
26) isophthalic acid dimethyl-5-sulfonic acid ions,
27) diphenylamino-4-sulfonic acid ions,
28) 1-naphthalene sulfonic acid ions,
29) 2-naphthalene sulfonic acid ions,
30) 2-naphthol-6-sulfonic acid ions,
31) 2-naphthol-7-sulfonic acid ions,
32) anthraquinone-l-sulfonic acid ions,
33) anthraquinone-2-sulfonic acid ions,
34) 9,10-dimethoxyanthracene-2-sulfonic acid ions,
35) 9,10-diethoxyanthracene-2-sulfonic acid ions,
36) quinoline-8-sulfonic acid ions,
37) 8-hydroxyquinoline-5-sulfonic acid ions, and
38) 8-anilino-naphthalene-1-sulfonic acid ions.

A method of manufacturing the infrared absorbing agent represented by the general formula (II) given earlier is now described.

The infrared absorbing agent represented by the general formula (II) noted earlier can be synthesized by any of the known representative synthesizing methods described in Justus Liebigs Ann. Chem. Vol. 623, 1959, pp 204–216, Ukr. Khim. Zh., Vol 22, 1956, pp 347–348, Chem. Heterocyc. Compd., Vol. 18, 1982, pp 334–336, J. Heterocyc. Chem., Vol 25, 1988, pp 1321–1325, or JP-A No. 60-231766. Examples of synthesis are now given. Structural formulas for the compounds synthesized will be described subsequently.

SYNTHESIS EXAMPLE 1 (IR54 synthesis)

(1) 50.8 g of 4-N,N-diethylaminobenzaldehyde and 12.1 g of cyclopentanone were dissolved in 200 ml of ethanol. Then 31 g of a 10% aqueous solution of sodium hydroxide were added and these were caused to react for 8 hours at 40° C. to 50° C. while stirring. The precipitated crystals were filtered out, washed with 80 ml of ethanol and 200 ml of water, and dried to yield 52.5 g of orange-colored crystals of 2,5-bis(4,N,N-diethylamino-benzylidene) cyclopentanone.

(2) 12.1 g of the 2,5-bis(4,N,N-diethylamino-benzylidene)cyclopentanone were dissolved in a solvent mixture of 100 g of tetrahydrofurfuryl alcohol and 150 g of tetrahydrofurane, 1.1 g of sodium borohydride were added, and [this material] was caused to react for 8 hours at 30° C. to 45° C. Then a mixture solution of 5.5 g of 48% tetrafluoroboric acid and 30 g of acetic acid were poured in at room temperature, the precipitated dark green crystals were filtered out, and washed and dried to yield 5.5 g of the infrared absorbing agent IR-54.

SYNTHESIS EXAMPLE 2 (IR-67 synthesis)

(1) 51.8 g of 2-(N-ethylanilino)ethanol and 31.7 g of triethylamine were dissolved in 300 ml of acetone. To this were slowly added 25 g of acetyl chloride while cooling the reaction solution with ice water, and this was caused to react for 6 hours at room temperature while stirring. 200 ml of water were poured in. An organic layer was extracted with ethyl acetate and dried with sodium sulfate. Then the solvent was boiled off under reduced pressure to yield 64.9 g of 2-(N-ethylanilino)ethyl acetate.

(2) After adding 55.8 g of ice-cooled phosphoryl chloride to 26.6 g of dimethylformamide, a solution of 63.0 g of the 2-(N-ethylanilino)ethyl acetate in 40 ml of dimethylformamide was slowly added at room temperature, this was caused to react for 6 hours at room temperature while stirring, and then poured into an aqueous solution of 150 g of sodium acetate under ice cooling. An organic layer was extracted with ethyl acetate and the solvent was boiled off under reduced pressure. This was refined by silica gel column chromatography to yield 60.2 g of 2-(ethyl(4-formylphenyl) amino)ethyl acetate.

(3) A mixture of 51.0 g of 4-N,N-diethylamino-benzaldehyde, 72.7 g of cyclopentanone, 19.0 g of 85% potassium hydroxide pellets, and 450 ml of water was heated and refluxed for 25 hours. Then the excess cyclopentanone was boiled off by an ordinary process, and the precipitated crystals were separated by filtration, recrystallized in ethanol, and dried to yield 45.5 g of orange colored crystals of 2-(4-(diethylamino)benzylidene)cyclopentanone.

(4) 40.5 g of 2-(ethyl(4-formylphenyl)amino)ethyl acetate and 41.8 g of the 2-(4-(diethylamino)benzylidene) cyclopentanone were dissolved in 120 ml of ethanol. Then 19 g of a 10% aqueous solution of sodium hydroxide were added, and this was caused to react for 6 hours at 40° C. to 50° C. while stirring. The precipitated crystals were separated by filtration, washed in 50 ml of ethanol and 150 ml of water, and dried to yield 38.5 g of orange colored crystals of 2-(4-(diethyl-amino)benzylidene)-5-(4-ethyl(2-hydroxyethyl)amino)benzylidene)cyclopentanone.

(5) 10.5 g of the 2-(4-(diethyl-amino)benzylidene)-5-(4-ethyl(2-hydroxyethyl)amino)benzylidene)cyclopentanone were dissolved in a solvent mixture of 100 g tetrahydrofurfuryl alcohol and 150 g of tetrahydrofuran. To this were added 1.1 g of sodium borohydride, and this [solution] was caused to react for 8 hours at 30° C. to 45° C. Then a liquid mixture of 4.2 g of 60% perchloric acid and 3 g of acetic acid was poured in at room temperature. The precipitated dark green crystals were filtered out, washed in water, and dried to yield 4.3 g of the infrared absorbing agent IR-67.

SYNTHESIS EXAMPLE 3 (IR-79 synthesis)

(1) 49.6 g of 4-(dimethylamino)benzophenonephenone were dissolved in 120 ml of tetrahydrofuran. To this were added 250 ml of a 1N tetrahydrofuran solution of methyl magnesium bromide while cooling with ice. After heating and refluxing the reaction solution for 1 hour, an aqueous solution of ammonium chloride was added, and an ordinary process was performed to obtain an alcohol intermediate. Following this, the alcohol intermediate so obtained was dissolved in 200 ml of anhydrous acetic acid. After refluxing this for 2 hours, the solvent was boiled off under reduced pressure to yield 39 g of dimethyl(4-(1-phenylvinyl)phenyl) amine.

(2) 28 g of the dimethyl(4-(1-phenylvinyl)phenyl) amine and 22 g of 4-dimethylaminocinnamaldehyde were dissolved in 200 ml of anhydrous acetic acid. After refluxing this for 3 hours, the reaction solution was cooled down to room temperature, a mixture of 11 ml of 70% perchloric acid and 600 ml of acetic acid was slowly added, and this [solution] was refluxed for another 10 minutes. The reaction solution was cooled, 600 ml of water were added, and the precipitate was separated by filtration, washed in water, and then recrystallized in ethanol and water to yield 12 g of the infrared absorbing agent IR-79.

SYNTHESIS EXAMPLE 4 (IR-95 synthesis)

(1) 42.8 g of 4-N,N-dimethylaminobenzaldehyde and 14.1 g of cyclohexanone were dissolved in 200 ml of ethanol, 31 g of a 10% aqueous solution of sodium hydroxide were added, and this was caused to react for 7 hours at 40° C. to 50° C. while stirring. The precipitated crystals were separated by filtration, washed in 80 ml of ethanol and 200 ml of water, and dried to yield 47.2 g of orange colored crystals of 2,6-bis(4-N,N-dimethylaminobenzylidene) cyclohexanone.

(2) 9.0 g of the 2,6-bis(4-N,N-dimethylamino-benzylidene)cyclohexanone were dissolved in a solvent mixture of 100 g of tetrahydrofurfuryl alcohol and 150 g of tetrahydrofuran. 1.1 g of sodium borohydride were added, and this [solution] was caused to react for 8 hours at 30° C. to 45° C. Then a liquid mixture of 4.8 g of p-toluene sulfonic acid monohydrate, 30 g of acetic acid, and 35 ml of water was poured in at room temperature. The precipitated dark green crystals were filtered out, washed in water, and cried to yield 4.3 g of the infrared absorbing agent R-95.

Specific examples of the infrared absorbing agents represented by the general formula (II) given earlier are now listed, but the infrared absorbing agents of the present invention are not limited to or by these specific examples.

IR-50

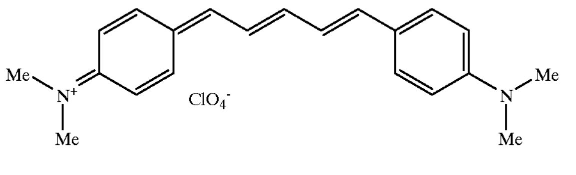

-continued
IR-51
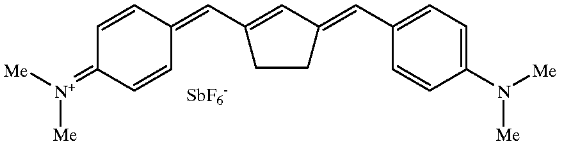
IR-52
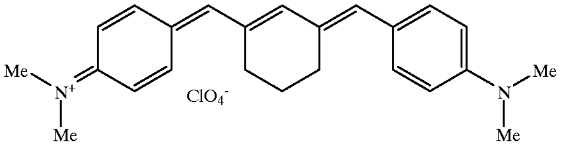
IR-53
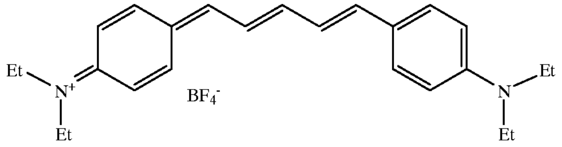
IR-54
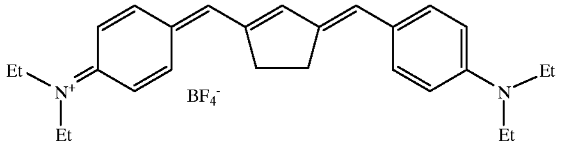
IR-55
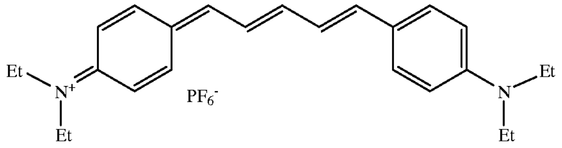
IR-56
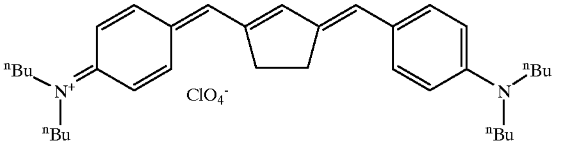
IR-57
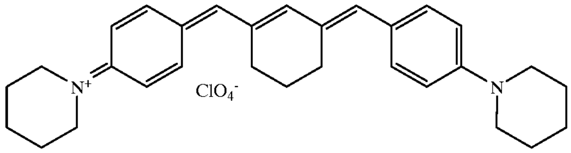
IR-58
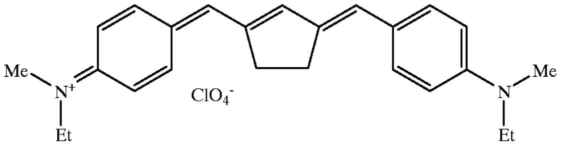
-continued
IR-59
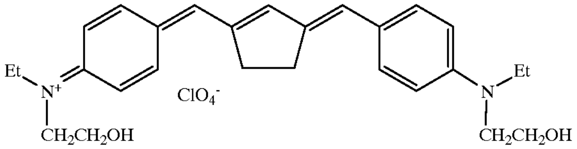
IR-60
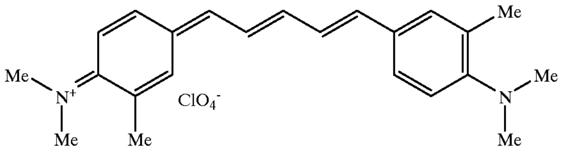
IR-61
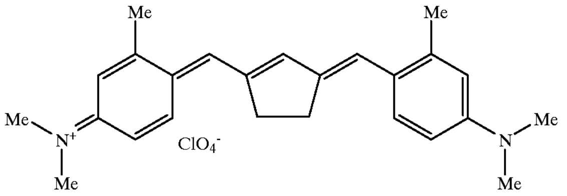
IR-62
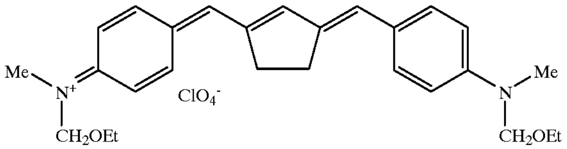
IR-63
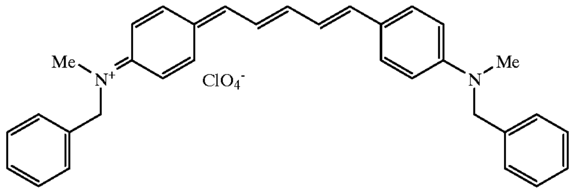
IR-64
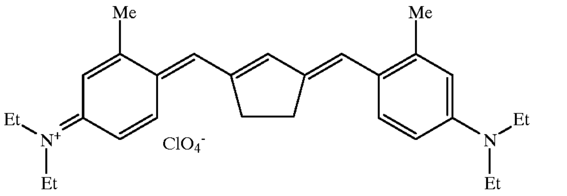
IR-65
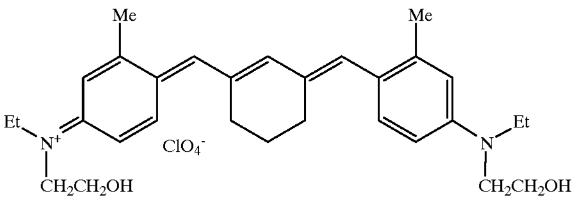

-continued
IR-66
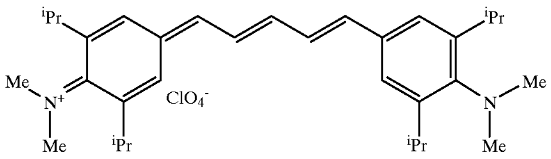
IR-67
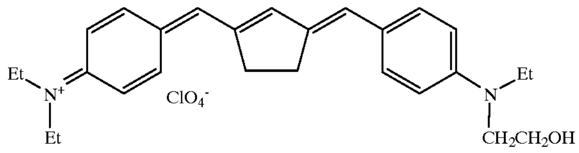
IR-68
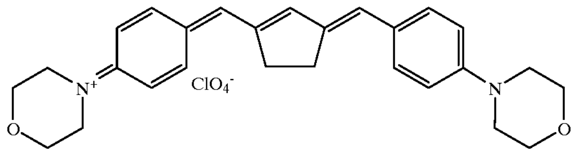
IR-69
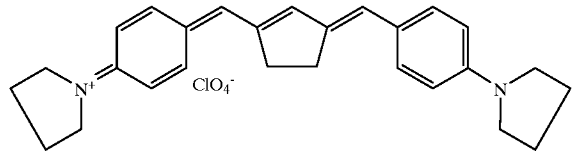
IR-70
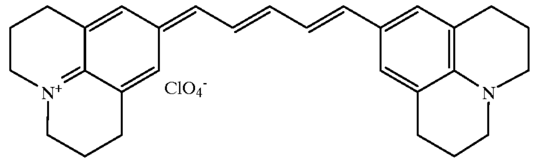
IR-71
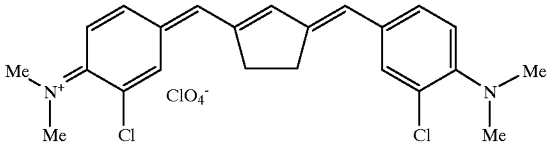
IR-72
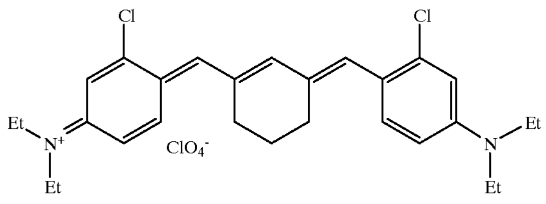
IR-73
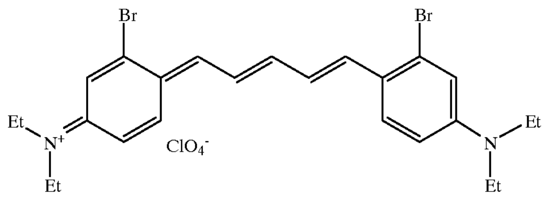
-continued
IR-74
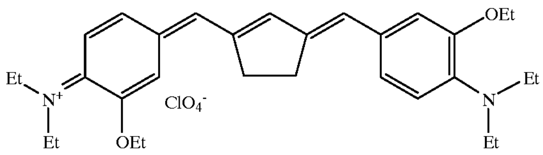
IR-75
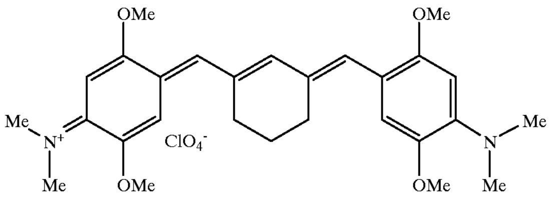
IR-76
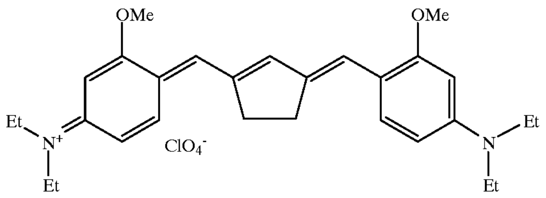
IR-77
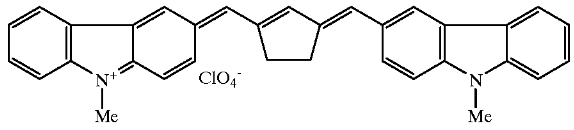
IR-78
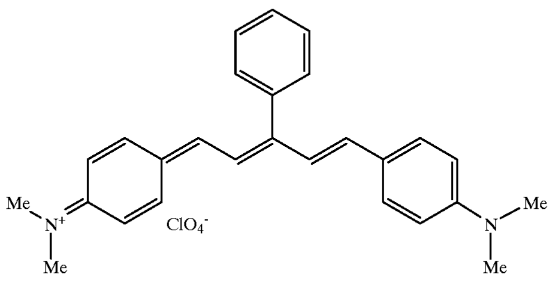
IR-79
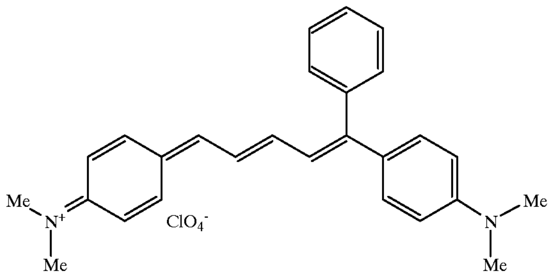

-continued
IR-80
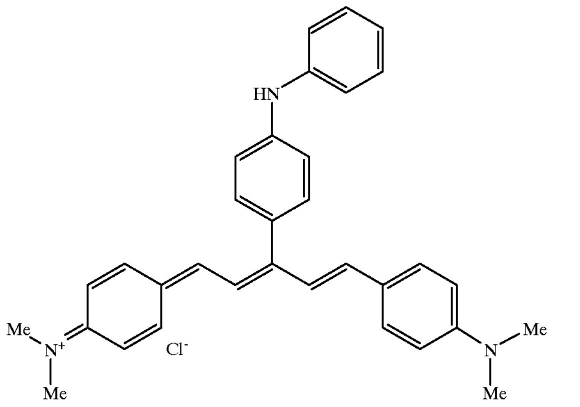
IR-81
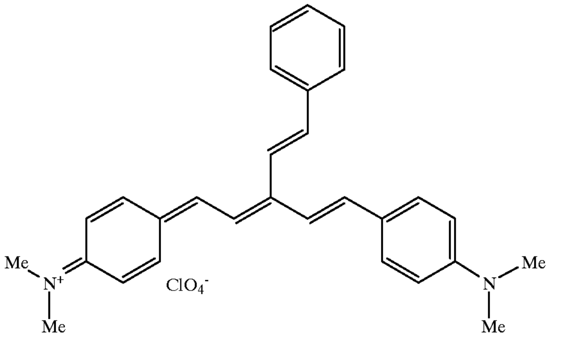
IR-82
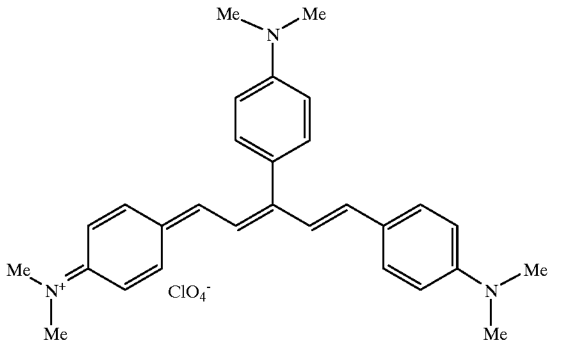
IR-83
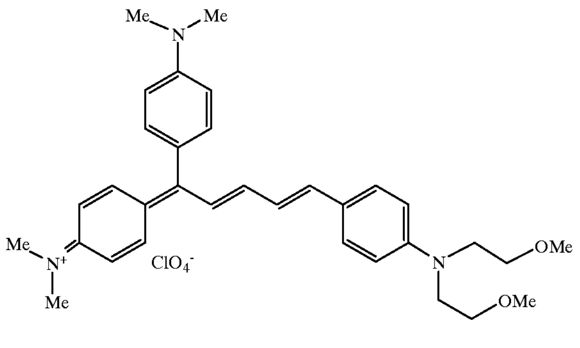
-continued
IR-84
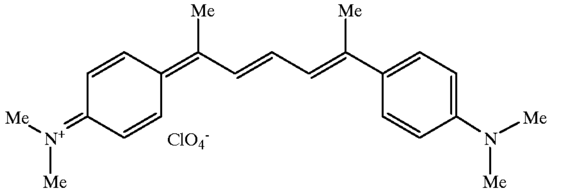
IR-85
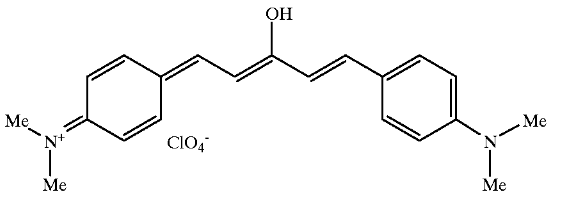
IR-86
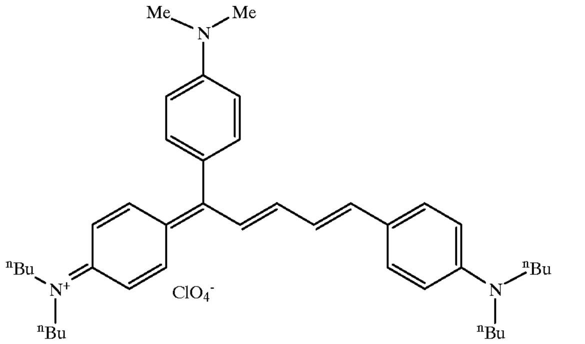
IR-87
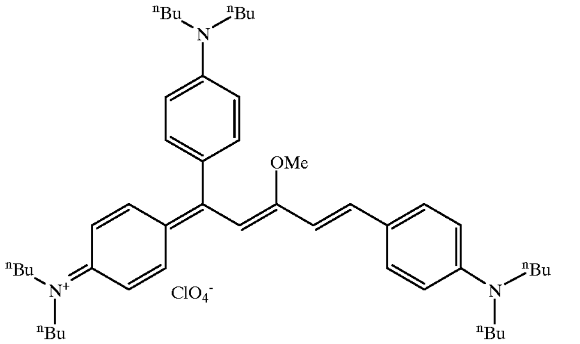
IR-88
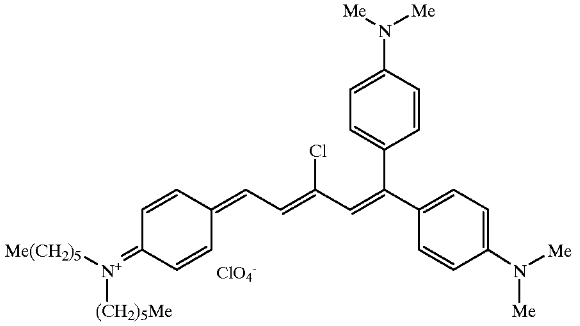

-continued
IR-89
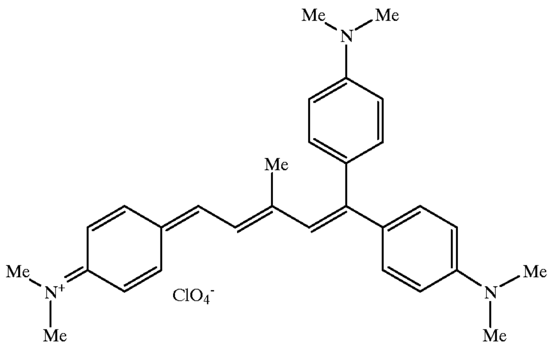
IR-90
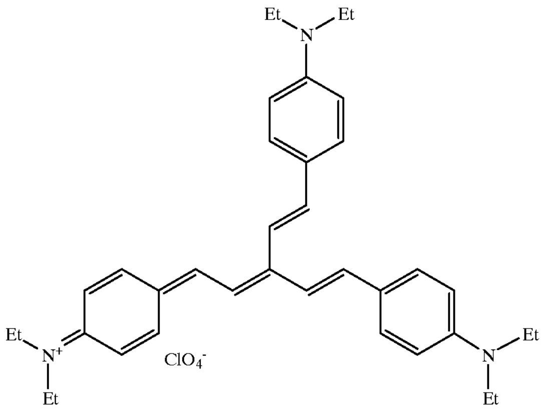
IR-91
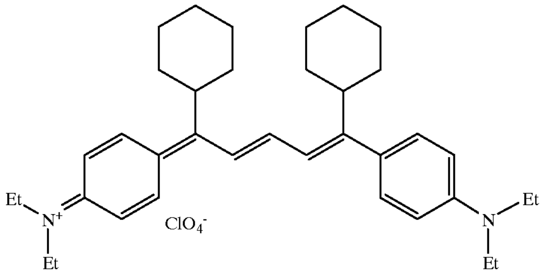
IR-92
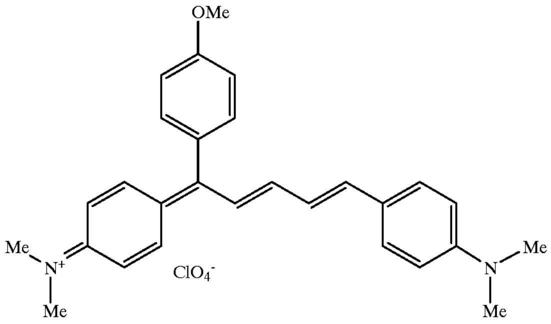
IR-93
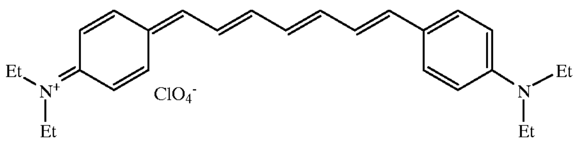
-continued
IR-94
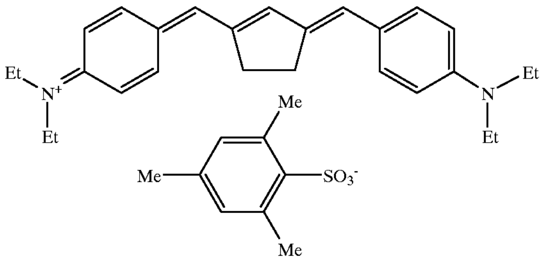
IR-95
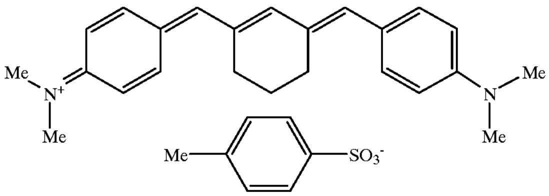
IR-96
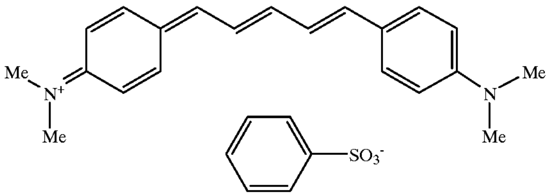
IR-97
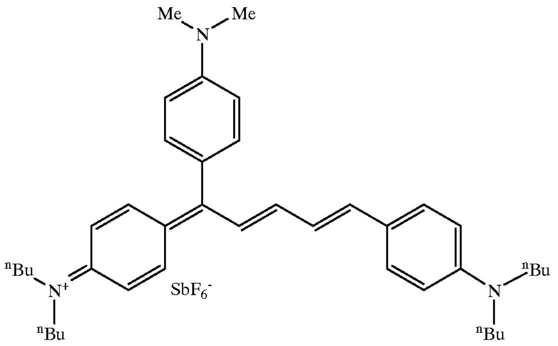
IR-98
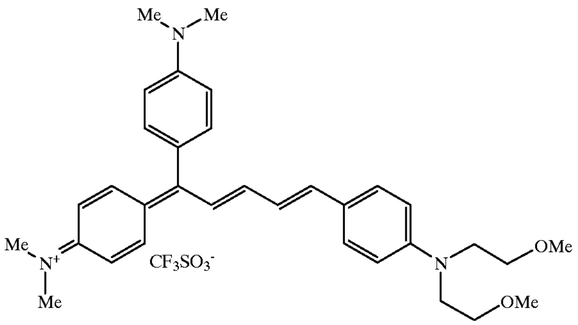

-continued

IR-99

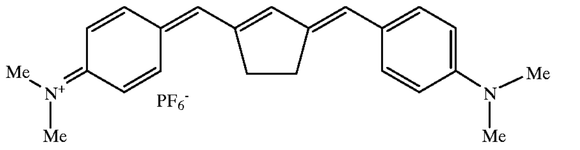

In the present invention, these anionic infrared absorbing agents can be added in an amount of 0.01 to 50 wt. % of the total solids of the image recording material, but preferably in an amount of 0.1 to 20 wt. %, and even more preferably in an amount of 0.5 to 15 wt. %. When the added quantity is less than 0.01 wt. %, images cannot be formed by this image recording material, whereas when the added quantity exceeds 50 wt. %, contamination sometimes appears in the non-image part when used in the photosensitive layer in the planographic printing plate.

To the image recording material of the present invention may be added other pigments and dyes that are infrared absorbing, besides this infrared absorbing agent, so long as the effectiveness of the present invention is not impaired.

Such pigments that can be used include commercially sold pigments and the pigments described in the Color Index (C. I.) Handbook, in "Saishin Ganryo Binran (Handbook of Recent Pigments)" (edited by Nihon Ganryo Gijutsu Kyokai (Japan Association of Pigment Technology), 1977), in "Saishin Ganryo Oyo Gijutsu (Recent Pigment Application Technology)" (CMC Suppan, 1986), or in "Insatsu Inki Gijutsu (Printing Ink Technology)" (CMC Shuppan, 1984).

In terms of type, these pigments may be black pigments, yellow pigments, orange pigments, brown pigments, red pigments, purple pigments, blue pigments, green pigments, fluorescent pigments, metal powder pigments, and other polymer-bond pigments. More specifically, these may be insoluble azo pigments, azo-lake pigments, condensed azo pigments, chelated azo pigments, phthalocyanine-based pigments, anthraquinone-based pigments, perylene- and perynone-based pigments, thioindigo-based pigments, quinacridone-based pigments, dioxadine-based pigments, isoindolinone-based pigments, quinophthalone-based pigments, dyed-lake pigments, azine pigments, nitrone pigments, nitro pigments, natural pigments, fluorescent pigments, inorganic pigments, and carbon black, etc.

These pigments may be used with or without performing a surface treatment. Possible surface treatments include methods of surface-coating with a resin or wax, methods of applying a surfactant, and methods of bonding a reactive substance (such as a silane coupling agent, epoxy compound, or polyisocyanate, etc.) to the pigment surface. These surface treatment methods are described in "Kinzoku Sekken no Seishitsu to Oyo (Metallic Soap Properties and Applications)" (Shiawase Shobo), and "Saishin Ganryo Oyo Gijutsu (Recent Pigment Application Technology)" (CMC Suppan, 1986).

The particle diameter of the pigments noted above should be 0.01 to 10 $\mu$m, but preferably 0.05 to 1 $\mu$m, and more preferably 0.1 to 1 $\mu$m. When the particle diameter of these pigments is less than 0.01$\mu$, the results are poor in terms of the stability of the dispersed material in the photosensitive layer coating liquid, whereas when 10$\mu$ is exceeded, the results are poor in terms of the uniformity of the photosensitive layer.

The method used in dispersing the pigments is a known dispersion technique used in ink or toner manufacture. The dispersing machine used may be an ultrasonic dispersing machine, a sand mill, an attrition mill, a pearl mill, a super mill, a ball mill, an impeller, a disperser, a KD mill, a colloid mill, a dynatron, a three-roller mill, or a pressurizing kneader, etc. The details are noted in "Saishin Ganryo Oyo Gijutsu (Recent Pigment Application Technology)" (CMC Suppan, 1986).

The dyes noted above may be commercially sold dyes or known dyes described in the literature (such as in "Senryo Binran (Handbook of Dyes)," edited by Yuki Gosei Kagaku Kyokai (Society of Synthetic Organic Chemistry, Japan), 1970). More specifically, these include azo dyes, metal complex azo dyes, pyrazone azo dyes, anthraquinone dyes, phthalocyanine dyes, carbonium dyes, quinone imine dyes, methine dies, and cyanine dyes, etc.

In the present invention, of the pigments or dyes noted above, those which absorb infrared light or near infrared light are especially to be preferred because they are suitable for use with lasers that emit infrared light or near infrared light.

One such pigment that absorbs infrared light or near infrared light that may be used to good purpose is carbon black. Moreover, dyes that absorb infrared light or near infrared light include, for example, the cyanine dyes described in JP-A No. 58-125246, JP-A No. 59-84356, JP-A No. 59-202829, and JP-A No. 60-78787, the methine dyes described in JP-A Nos. 58-173696, 58-181690, and 58-194595, the naphthoquinone dyes described in JP-A Nos. 58-112793, 58-224793, 59-48187, 59-73996, 60-52940, and 60-63744, the squarylium colorants described in JP-A No. 58-112792, the cyanine dyes described in Great Britain Patent No. 434,875, and the dihydropyrimidine dyes described in U.S. Pat. No. 5,380,635.

For the dyes noted above, the near infrared absorbing sensitivity enhancer described in U.S. Pat. No. 5,156,938 may also be used to good effect, as may the substituted arylbenzo(thio)pyrylium salt described in U.S. Pat. No. 3,881,924, the trimethine thiapyrylium salt described in JP-A No. 57-142645/1982 (U.S. Pat. No. 4,327,169), the pyrylium-based compounds described in JP-A Nod. 58-181051, 58-220143, 59-41363, 59-84248, 59-84249, 59-146063, and 59-146061, the cyanine colorants described in JP-A No. 59-216146, the pentamethine thiopyrylium salts described in U.S. Patent No. 4,283,475, and the pyrylium compounds disclosed in Japanese Patent Publication Nod. 5-13514 and 5-19702, and also Epolight (II)-178, Epolight (II)-130, Epolight (II)-125, and Epolight IV-62A, etc.

Other particularly preferable examples of dyes that may be cited are the near infrared absorbing dyes described in formulas (I) and (II) in the specification in U.S. Pat. No. 4,756,993.

These dyes or pigments may be added to the image recording material of the present invention, adding them together with other components in the photosensitive layer, or, when manufacturing the planographic printing plates, they may be added to another layer that is provided separately from the photosensitive layer. These dyes or pigments may be added as single types or in mixtures of two or more types.

(a) Acid Generating Compound

In the present invention, what is called a compound that is decomposed by light or heat to generate an acid refers to a compound that generates an acid when subjected to irradiated light having a wavelength of 200 to 500 nm or to heat at [a temperature of] 100° C. or higher. Acid generating compounds that may be used to good effect in the present invention include photo-cation polymerization photo-initiators, photo-radical polymerization photo-initiators, colorant photo-color-eradicators, photo-color-alterators, or known acid generating compounds used in microresists and the like, known compounds that are thermally decomposed to generate acids, or mixtures thereof, although the cationic acid generating compounds are particularly to be preferred. The reason for that is thought to be that, because the infrared absorbing agents used in the present invention are anionic, due to ionic bonding, the distance between the anionic infrared absorbing agent and the cationic acid generating compound in the film is small, and heat can be efficiently propagated from the infrared absorbing agent to the acid generating compound.

Examples that may be cited include various onium salts, such as the diazonium salts described in I. Schlesinger, Photogr. Sci. Eng., 18, 387 (1974), and T. S. Bal et al, Polymer, 21, 423 (1980), the ammonium salts described in the specifications of U.S. Pat. No. 4,069,055, U.S. Pat. No. 4,069,056, U.S. Pat. No. Re27,922, and in JP-A No. 4-365049, the phosphonium salts described in D. C. Necker et al, Macromolecules, 17, 2468 (1984), C. S. Wen et al, The, Proc. Configuration. Rad, Curing ASIA, p 478, Tokyo, October (1988), and the specifications of U.S. Pat. No. 4,069,055 and U.S. Pat. No. 4,069,056, the iodonium salts described in J. V. Crivello et al, Macromolecules, 10 (6), 1307 (1977), Chem. & Eng. News, Nov. 28, p 31 (1988), the specifications of European Patent No. 104,143, U.S. Pat. No. 339,049, and U.S. Pat. No. 410,201, JP-A Nos. 2-150848 and 2-296514, the sulfonium salts described in J. V. Crivello et al, Polymer J. 17, 73 (1985), J. V. Crivello et al. J. Org. Chem., 43, 3055 (1978), W. R. Watt et al, J. Polymer Sci., Polymer Chem. Ed., 22, 1789 (1984), J. V. Crivello et al, Polymer Bull., 14, 279 (1985), J. V. Crivello et al, Macromolecules, 14 (5), 1141 (1981), J. V. Crivello et al, J. Polymer Sci., Polymer Chem. Ed., 17, 2877 (1979), and the specifications of European Patent Nos. 370,693, 390,214, 233,567, 297,443, and 297,442, U.S. Pat. Nos. 4,933,377, 161,811, 410,201, 339,049, 4,760,013, 4,734,444 and 2,833, 827, and German Patent Nos. 2,904,626, 3,604,580 and 3,604,581, the selenomium salts described in J. V. Crivello et al, Macromolecules, 10 (6), 1307 (1977), J. V. Crivello et al, J. Polymer Sci., and Polymer Chem. Ed., 17, 1047 (1979), and the arsonium salts described in C. S. Wen et al, The, Proc. Configuration. Rad. Curing ASIA, p 478, Tokyo, October (1988), the organic halogen compounds described in the specification of U.S. Pat. No. 3,905,815, and in Japanese Patent Publication Nos. 46-4605 and 48-36281, JP-A Nos. 55-32070, 60-239736, 61-169835, 61-169837, 62-58241, 62-212401, 63-70243 and 63-298339, the organic metal/organic halogen compounds described in K. Meier et al, J. Rad. Curing, 13 (4), 26 (1986), T. P. Gill et al, Inorg. Chem., 19, 3007 (1980), D. Astruc, Acc. Chem. Res., 19 (12), 377 (1896), and tokkai H2-161445/1990, the photo-acid generating compounds having an o-nitrobenzyl-type protective group, described in S. Hayase et al, J. Polymer Sci., 25, 753 (1987), E. Reichmanis et al, J. Polymer Sci., Polymer Chem. Ed., 23, 1 (1985), Q. Q. Zhu et al, J Photochem., 36, 85, 39, 317 (1987), B. Amit et al, Tetrahedron Lett., (24) 2205 (1973), D. H. R. Barton et al, J. Chem. Soc. 3571 (1965), P. M. Collins et al, J. Chem. Soc., Perkin I, 1695 (1975), M. Rudinstein et al, Tetrahedron Lett., (17), 1445 (1975), J. W. Walker et al, J. Am. Chem. Soc., 110, 7170 (1988), S. C. Busman et al, J. Imaging Technol., 11 (4), 191 (1985), H. M Houlihan et al, Macromolecules, 21, 2001 (1988), P. M. Collins et al, J. Chem. Soc., Chem. Commun., 532 (1972), S. Hayase et al, Macromolecules, 18, 1799 (1985), E. Reichmanis et al, J. Electrochem. Soc., Solid State Sci. Technol., 130 (6), F. M. Houlihan et al, Macromolecules, 21, 2001 (1988), in the specifications of European Patent Nos. 0290,750, 046,083, 156,535, 271,851 and 0,388,343, U.S. Pat. Nos. 3,901,710 and 4,181,531, and in JP-A Nos. 60-198538 and 53-133022, the compounds that are photo-decomposed to generate sulfonic acid, typified by iminosulfonate, etc., described in M. Tunooka et al, Polymer Preprints Japan, 38 (8), G. Berner et al, J. Rad. Curing, 13 (4), W. J. Mijs et al, Coating Technol., 55 (697), 45 (1983), Akzo, H. Adachi et al, Polymer Preprints, Japan, 37 (3), in the specifications of European Patent Nos. 0199,672, 84515, 199,672, 044,115 and 0101,122, U.S. Pat. Nos. 4,618,564, 4,371,605 and 4,431,774, and in JP-A Nos. 64-18143 and 2-245756, and Japanese Patent Application No. 3-140109, and the disulfone compounds described in JP-A No. 61-166544.

It is also possible to use compounds wherein these acid-generating groups or compounds are introduced into the main chain or a side chain of the polymer, such, for example, as those described in M. E. Woodhouse et al, J. Am. Chem. Soc., 104,5586 (1982), S. P. Pappaset al, J. Imaging Sci., 30 (5), 218 (1986), S. Kondo et al. Makromol. Chem., Rapid Commun., 9, 625 (1988), Y. Yamada et al, Makromol. Chem., 152, 153, 163 (1972), J. V. Crivello et al. J. Polymer Sci., Polymer Chem. Ed., 17, 3845 (1979), in the specifications of U.S. Pat. No. 3,849,137 and German Patent No. 3,914,407, and in JP-A Nos. 63-26653, 55-164824, 62-69263, 63-146037, 63-163452, 62-153853 and 63-146029.

It is also possible to use the compounds that generate acids [when acted on] by light which are described in V. N. R. Pillai, Synthesis, (1), 1 (1980), A. Abad et al, Tetrahedron Lett., (47) 4555 (1971), D. H. R. Barton et al, J. Chem, Soc,. (C), 329 (1970), and in the specifications of U.S. Pat. No. 3,779,778 and European Patent No. 126,712.

Of these, those compounds which are particularly preferable for the acid generating compounds used in the present invention are represented below in the general formulas (i) to (v)

(i)

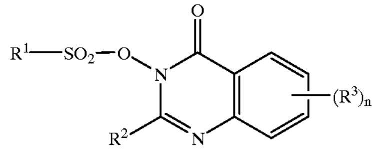

(ii)

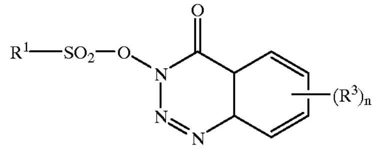

(iii)

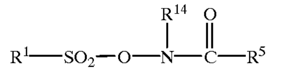

(iv)

$$Ar^1—SO_2—SO_2—Ar^2$$

-continued (v)

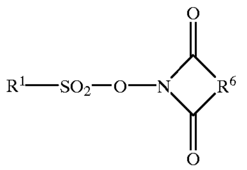

In the general formulas (i) to (v) above, $R^1$, $R^2$, $R^4$, and $R^5$, which may be the same or different, represent hydrocarbon groups having 20 or fewer carbons which may have substituents. $R^3$ represents a halogen atom, a hydrocarbon group having 10 or fewer carbons which may have a substituent, or an alcoxy group having 10 or fewer carbons. $Ar^1$ and $Ar^2$, which may be the same or different, represent aryl groups having 20 or fewer carbons which may have substituents. $R^6$ represents a bivalent hydrocarbon group having 20 or fewer carbons which may have a substituent. n represents an integer from 0 to 4.

In the general formulas (i) to (v), $R^1$, $R^2$, $R^4$, and $R^5$, respectively, independently, and preferably represent hydrocarbon groups having from 1 to 14 carbons.

Specific examples of the hydrocarbon groups described in the foregoing include such alkyl groups as methyl groups, ethyl groups, n-propyl groups, i-propyl groups, n-butyl groups, sec-butyl groups, t-butyl groups, hexyl groups, cyclohexyl groups, octyl groups, 2-ethylhexyl groups, undecyl groups, and dodecyl groups, aralkyl groups such as benzyl groups, aryl groups such as phenyl groups, tolyl groups, xylyl groups, cumenyl groups, mesityl groups, dodecylphenyl groups, phenylphenyl groups, naphthyl groups, and anthracenyl groups.

These hydrocarbon groups may have substituents such as halogen atoms, alcoxy groups, nitro groups, cyano groups, or carboxy groups, etc. Specific examples of hydrocarbon groups having substituents are trifluoromethyl groups, chloroethyl groups, 2-methoxyethyl groups, fluorophenyl groups, chlorophenyl groups, bromophenyl groups, iodophenyl groups, methoxyphenyl groups, phenoxyphenyl groups, methoxyphenylvinyl groups, nitrophenyl groups, cyanophenyl groups, carboxyphenyl groups, and 9,10-dimethoxyanthracenyl groups.

In the general formulas (i) to (v) above, $R^3$ represents a halogen atom, a hydrocarbon group having 10 or fewer carbons which may have a substituent (such as an alkyl group, alkenyl group, aralkyl group, or aryl group), or an alcoxy group having 10 or fewer carbons.

Specific examples that may be cited are halogen atoms such as fluorine, chlorine, bromine, and iodine, etc., hydrocarbon groups such as methyl groups, ethyl groups, n-propyl groups, i-propyl groups, allyl groups, n-butyl groups, sec-butyl groups, t-butyl groups, hexyl groups, cyclohexyl groups, benzyl groups, phenyl groups, and tolyl groups, etc., hydrocarbon groups that may have substituents, such as 2-methoxyethyl groups, fluorophenyl groups, chlorophenyl groups, bromophenyl groups, iodophenyl groups, and methoxyphenyl groups, etc., and alkoxy groups such as ethoxy groups, etc.

When n is 2 or greater, moreover, two adjacent $R^3$'s may mutually bond to form a condensed ring.

In the general formulas (i) to (v) above, $Ar^1$ and $Ar^2$, which may be the same or different, represent aryl groups having 20 or more carbons that may have substituents, and preferably represent aryl groups having 6 to 14 carbons.

Specifically, these may be phenyl groups, tolyl groups, xylyl groups, cumenyl groups, mesityl groups, dodecylphenyl groups, phenylphenyl groups, naphthyl groups, fluorophenyl groups, chlorophenyl groups, bromophenyl groups, iodophenyl groups, chloronaphthyl groups, methoxyphenyl groups, phenoxyphenyl groups, ethoxynaphthyl groups, nitrophenyl groups, cyanophenyl groups, carboxyphenyl groups, nitronaphthyl groups, and anthracenyl groups, etc.

In the general formulas (i) to (v) above, $R^6$ represents a bivalent hydrocarbon group having 20 or fewer carbons that may have a substituent (examples being alkylene groups, alkenylene groups, and aralkylene groups).

Specifically, these include ethylene groups, 1,2-cyclohexenylene groups, 1,2-phenylene groups, 4-chloro-1,2-phenylene groups, 4-nitro-1,2-phenylene groups, 4-methyl-1,2-phenylene groups, 4-methoxy-1,2-phenylene groups, 4-carboxy-1,2-phenylene groups, and 1,8-naphthalenylene, etc.

n represents an integer from 0 to 4. Here, when n is 0, that indicates that there is no $R^3$, that is, that it is a hydrogen atom.

Of the compounds represented by the general formulas (i) to (v) above, those which are to be preferred are diagrammed below.

These compounds can be synthesized by methods described, for example, in JP-A Nos. 2-100054 and 2-100055.

(i-1)

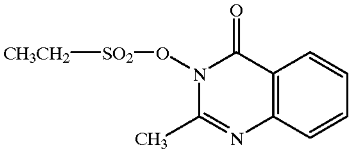

(i-2)

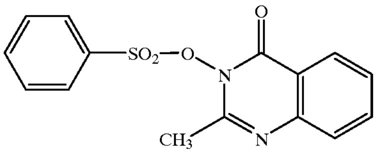

(i-3)

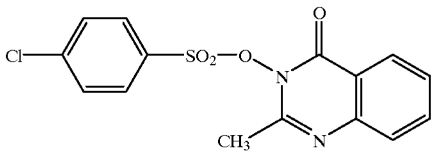

(i-4)

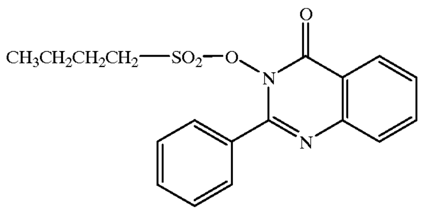

-continued
(i-5)
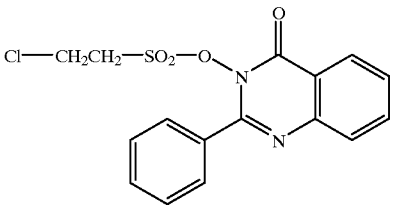
(i-6)
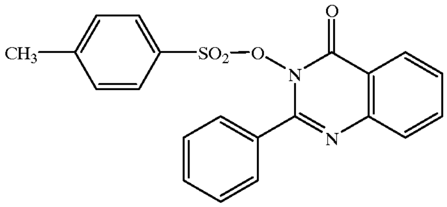
(i-7)
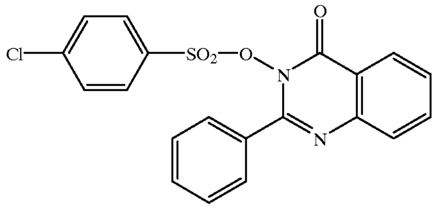
(i-8)
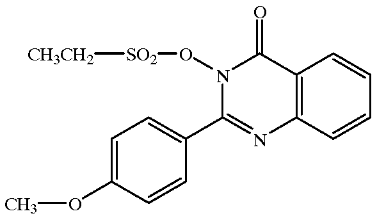
(i-9)
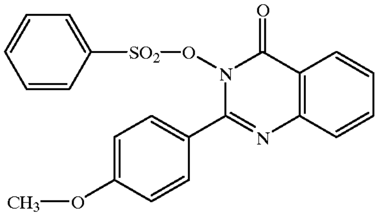
(i-10)
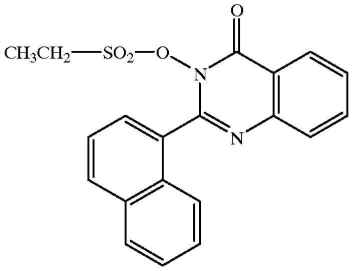
-continued
(i-11)
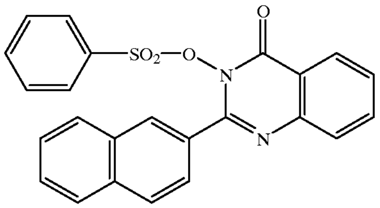
(i-12)
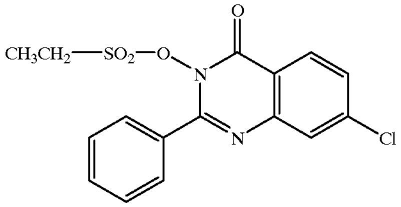
(i-13)
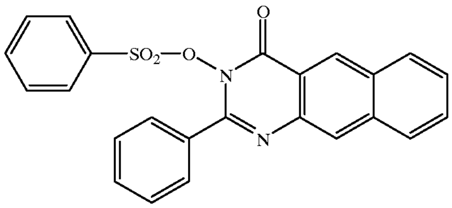
(i-14)
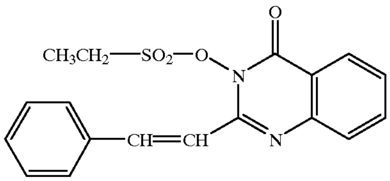
(i-15)
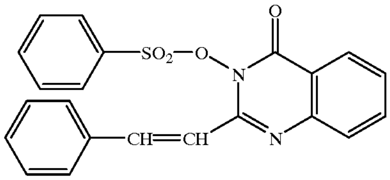
(i-16)
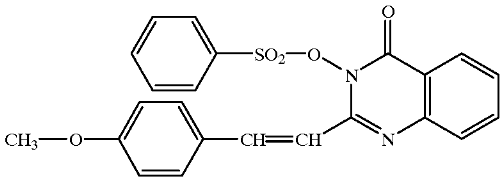
(ii-1)
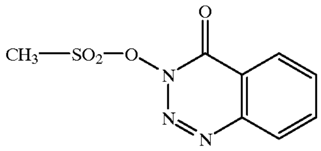

-continued
(ii-2)
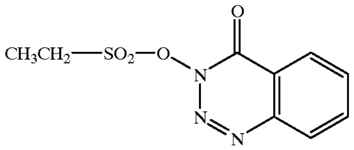
(ii-3)
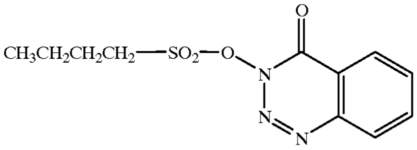
(ii-4)
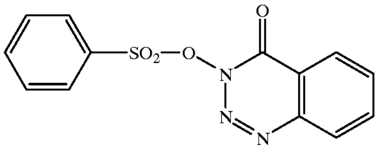
(ii-5)
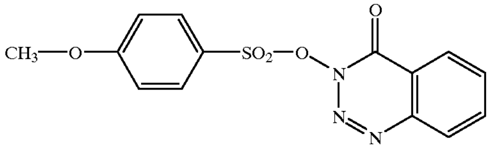
(ii-6)
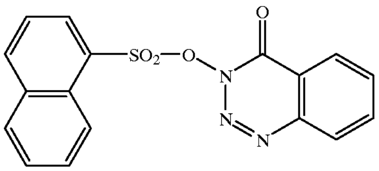
(iii-1)
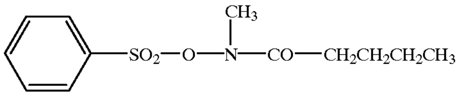
(iii-2)
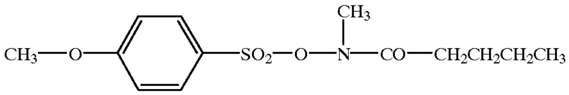
(iii-3)
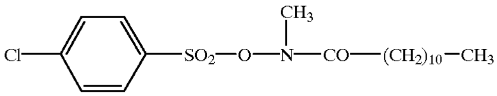
(iii-4)
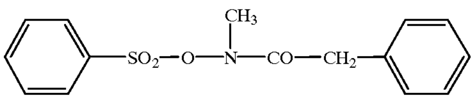
(iii-5)
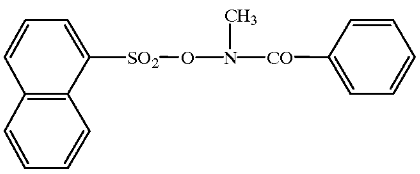
-continued
(iii-6)
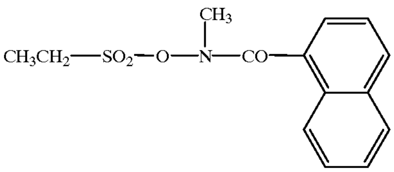
(iii-7)
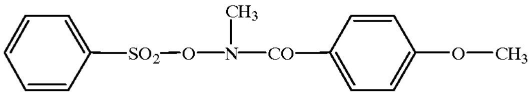
(iii-8)
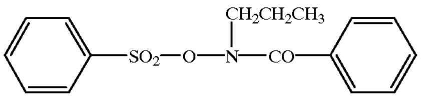
(iii-9)
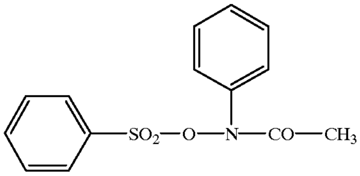
(iii-10)
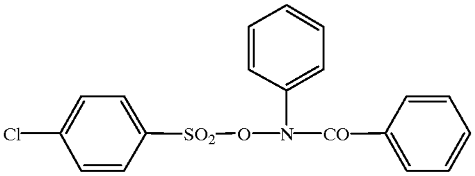
(iii-11)
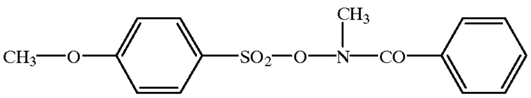
(iii-12)
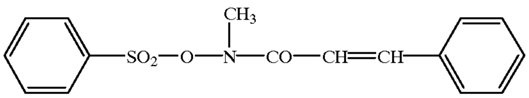
(iii-13)
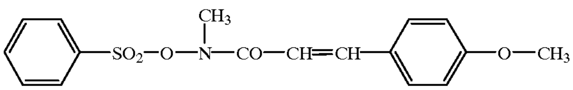
(iii-14)
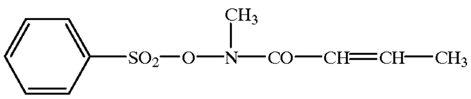
(iv-1)
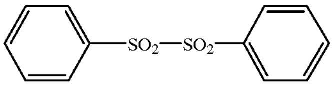

-continued
(iv-2)
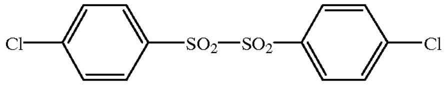
(iv-3)
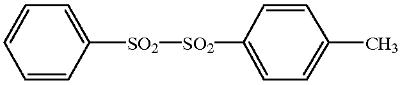
(iv-4)
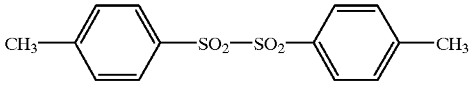
(iv-5)
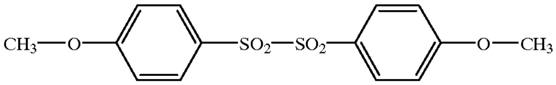
(iv-6)
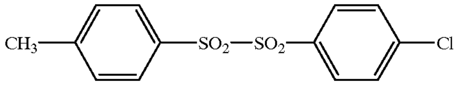
(iv-7)
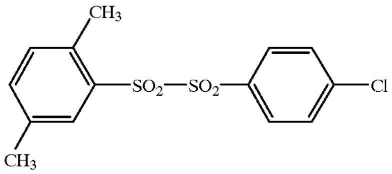
(iv-8)
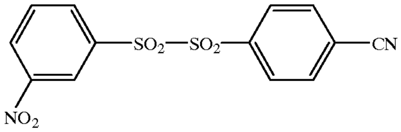
(iv-9)
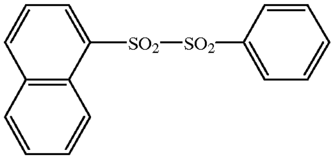
(iv-10)
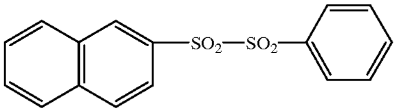
(iv-11)
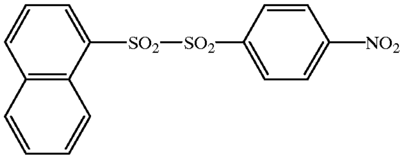
-continued
(iv-12)
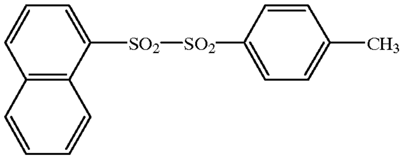
(iv-13)
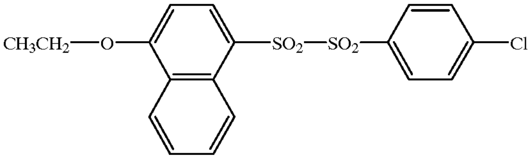
(iv-14)
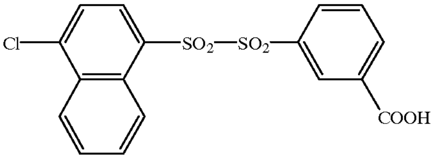
(iv-15)
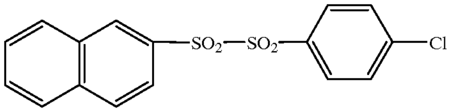
(iv-16)
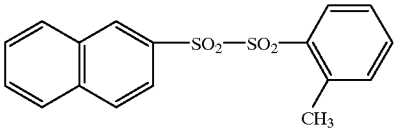
(iv-17)
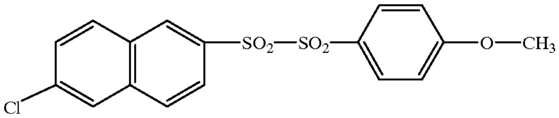
(v-1)
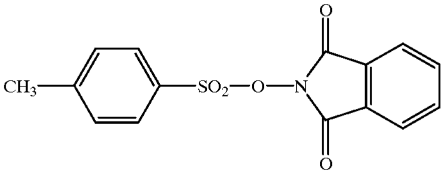
(v-2)
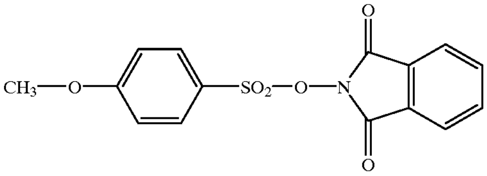

-continued
(v-3)
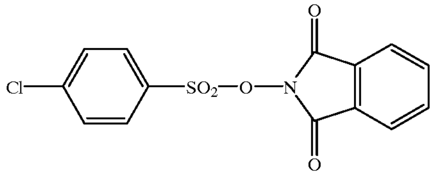
(v-4)
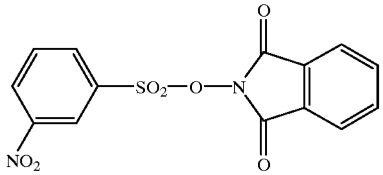
(v-5)
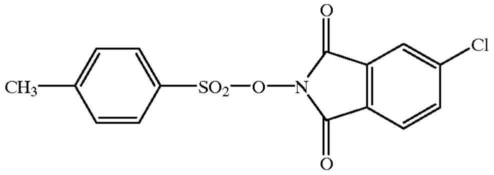
(v-6)
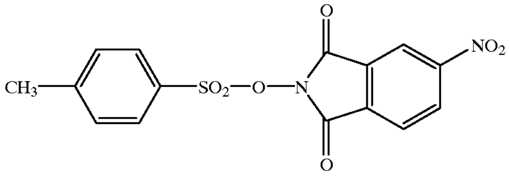
(v-7)
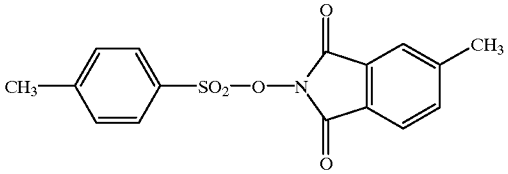
(v-8)
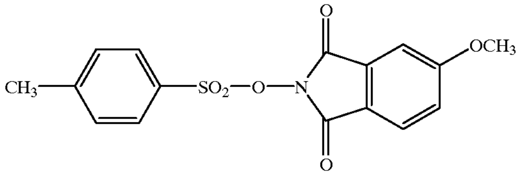
(v-9)
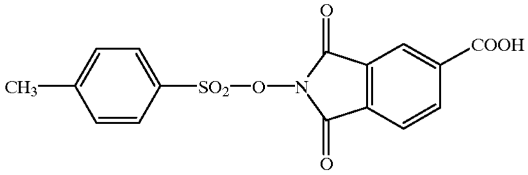
-continued
(v-10)
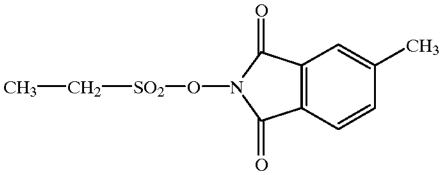
(v-11)
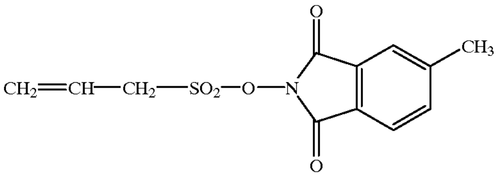
(v-12)
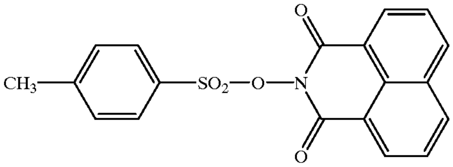
(v-13)
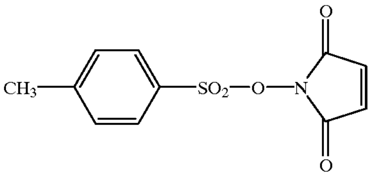
(v-14)
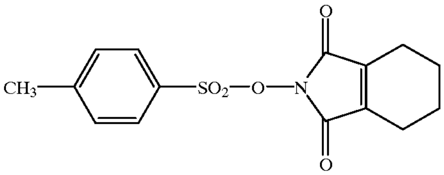
(v-15)
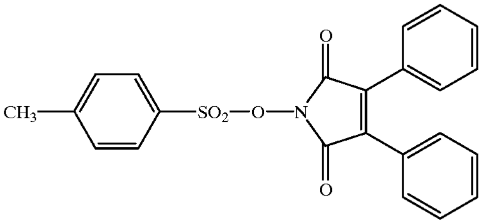
(v-16)
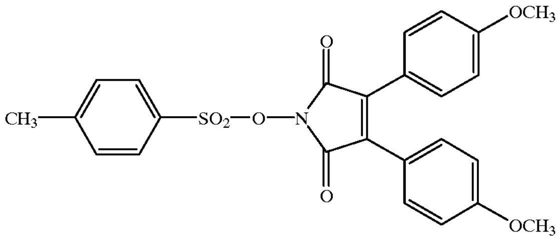

-continued (v-17)

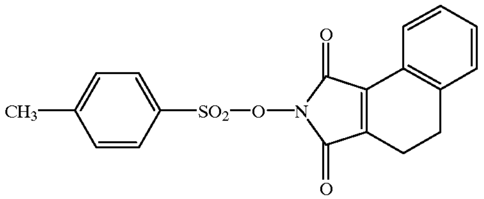

(v-18)

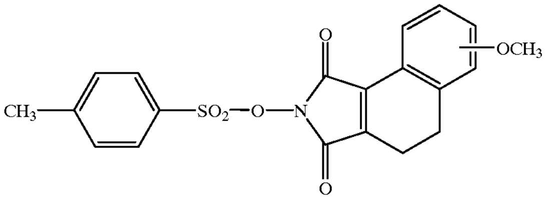

Also, for the (a) acid generating compounds, halogen compounds or onium salts having sulfonic acid or the like as the counter-ion, and preferably those having any of the iodonium salt, phosphonium salt, or diazonium salt structural formulas given below, may be used to good effect.

General Formula (vi)

$Ar^3—I^+—Ar^4 \quad X^-$

General Formula (vii)

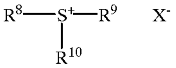

General Formula (viii)

$Ar^3—N_2^+ \quad X^-$

In the general formulas (vi) to (viii) given above, $X^-$ is a halogen compound ion such as $ClO_4^-$, $PF_6^-$, $SbF_6^-$, $BF_4^-$, or $R^7—SO_3^-$, where $R^7$ represents a hydrocarbon group having 20 or fewer carbons that may have a substituent. $Ar^3$ and $Ar^4$, respectively, represent aryl groups having 20 or fewer carbons that may have a substituent. $R^8$, $R^9$, and $R^{10}$, repsectively, represent hydrocarbon groups having 18 or fewer carbons that may have substituents.

In the general formulas (vi) to (viii) above, for the $X^-$, the use of $R^7—SO_3^-$ is particularly to be preferred, where $R^7$ represents a hydrocarbon group having 20 or fewer carbons that may have a substituent. Specific examples of hydrocarbon groups represented by $R^7$ that may be cited include such alkyl groups as methyl groups, ethyl groups, n-propyl groups, i-propyl groups, allyl groups, n-butyl groups, sec-butyl groups, t-butyl groups, hexyl groups, cyclohexyl groups, octyl groups, and 2-ethylhexyl groups, dodecyl groups, alkenyl groups such as vinyl groups, 1-methylvinyl groups, and 2-phenylvinyl groups, such aralkyl groups as benzyl groups and phenethyl groups, and such aryl groups as phenyl groups, tolyl groups, xylyl groups, cumenyl groups, mesityl groups, dodecylphenyl groups, phenylphenyl groups, naphthyl groups, and anthracenyl groups.

These hydrocarbon groups may have such substituents as, for example, halogen atoms, hydroxy groups, alkoxy groups, allyloxy groups, nitro groups, cyano groups, carbonyl groups, carboxyl groups, alkoxycarbonyl groups, aniline groups, and acetamide groups, etc. Specific examples of hydrocarbon groups having substituents that may be cited include trifluoromethyl groups, 2-methoxyethyl groups, 10-camphanyl groups, fluorophenyl groups, chlorophenyl groups, bromophenyl groups, iodophenyl groups, methoxyphenyl groups, hydroxyphenyl groups, phenoxyphenyl groups, nitrophenyl groups, cyanophenyl groups, carboxyphenyl groups, methoxynaphthyl groups, dimethoxyanthracenyl groups, diethoxyanthracenyl groups, and anthraquinonyl groups, etc.

In the general formulas (vi) to (viii) given earlier, $Ar^3$ and $Ar^4$, respectively, represent aryl groups having 20 or fewer carbons that may have substituents. Specific examples that may be cited include phenyl groups, tolyl groups, xylyl groups, cumenyl groups, mesityl groups, dodecylphenyl groups, phenylphenyl groups, naphthyl groups, anthracenyl groups, fluorophenyl groups, chlorophenyl groups, bromophenyl groups, iodophenyl groups, methoxyphenyl groups, hydroxyphenyl groups, phenoxyphenyl groups, nitrophenyl groups, cyanophenyl groups, carboxyphenyl groups, anilinophenyl groups, anilinocarbonylphenyl groups, morpholinophenyl groups, phenylazophenyl groups, methoxynaphthyl groups, hydroxynaphthyl groups, nitronaphthyl groups, and anthraquinonyl groups, etc.

In the general formulas (vi) to (viii) given earlier, $R^8$, $R^9$, and $R^{10}$, respectively, represent hydrocarbon groups having 18 or fewer carbons that may have substituents. Specific examples that may be cited include such hydrocarbon groups as methyl groups, ethyl groups, n-propyl groups, i-propyl groups, allyl groups, n-butyl groups, sec-butyl groups, t-butyl groups, hexyl groups, cyclohexyl groups, benzyl groups, phenyl groups, tolyl groups, t-butylphenyl groups, naphthyl groups, and anthracenyl groups, and such hydrocarbon groups having substituents as 2-methoxyethyl groups, fluorophenyl groups, chlorophenyl groups, bromophenyl groups, iodophenyl groups, methoxyphenyl groups, hydroxyphenyl groups, phenylthiophenyl groups, hydroxynaphthyl groups, methoxynaphthyl groups, benzoylmethyl groups, and naphthoylmethyl groups, etc.

Furthermore, $R^8$ and $R^9$ may mutually bond to form a ring.

The cation part of the onium salts represented by the general formulas (vi) to (viii) may be iodonium ions, sulfonium ions, or diazonium ions. Specific structures are diagrammed below for the cation parts of these onium salts, but they are not limited to or by these.

(vi-a)

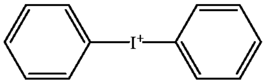

(vi-b)

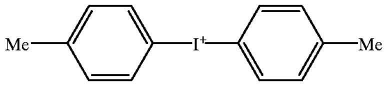

(vi-c)

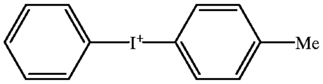

(vi-d)

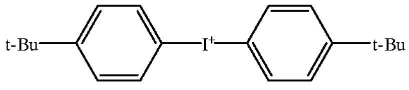

-continued
(vi-e)
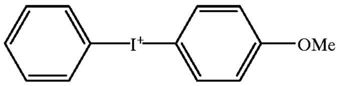
(vi-f)
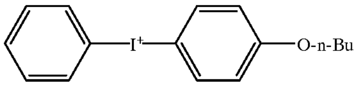
(vi-g)
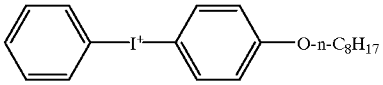
(vi-h)
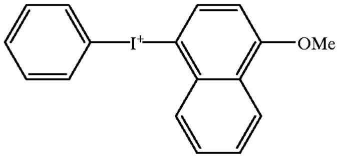
(vi-i)
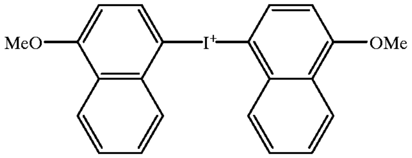
(vi-j)
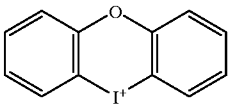
(vii-a)
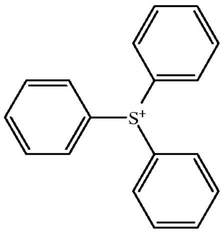
(vii-b)
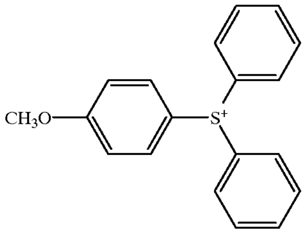
(vii-c)
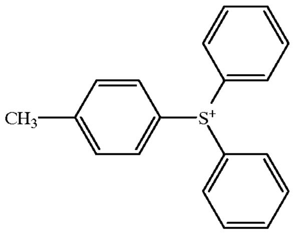
-continued
(vii-d)
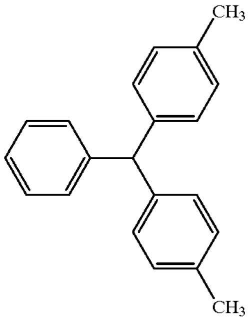
(vii-e)
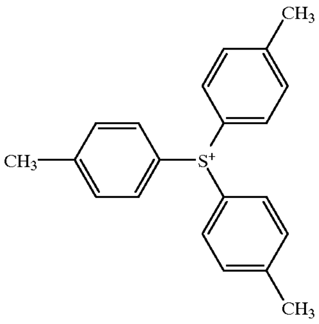
(vii-f)
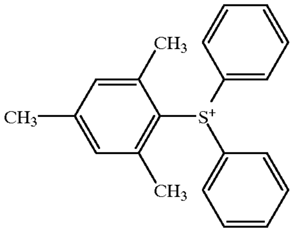
(vii-g)
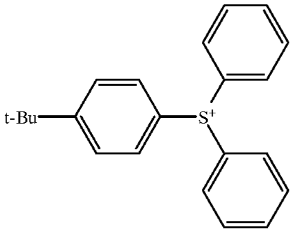
(vii-h)
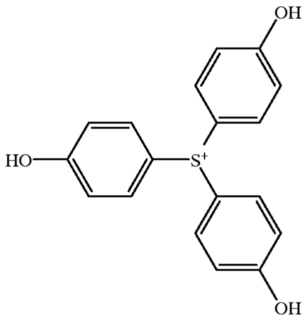

-continued
(vii-i)
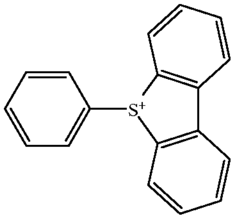
(vii-j)
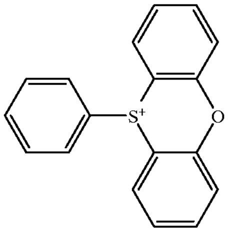
(vii-k)
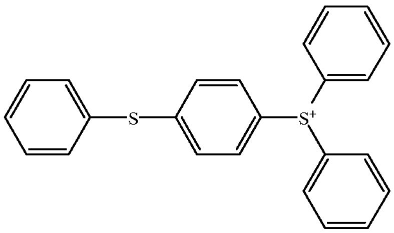
(vii-l)
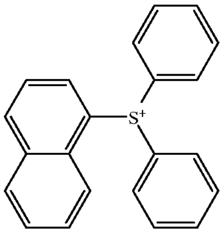
(vii-m)
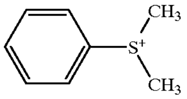
(vii-n)
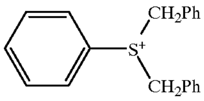
(vii-o)
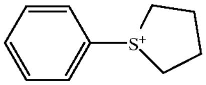
(vii-p)
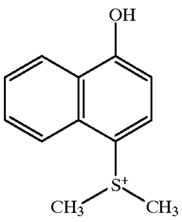
-continued
(vii-q)
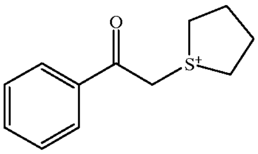
(vii-r)
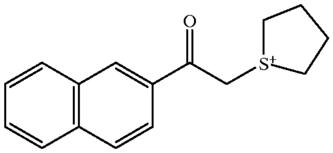
(vii-s)
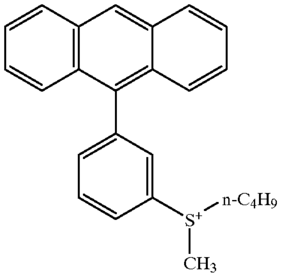
(viii-a)
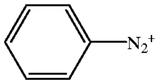
(viii-b)
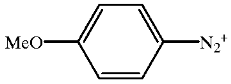
(viii-c)
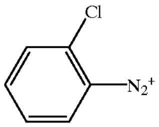
(viii-d)
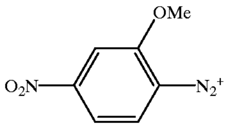
(viii-e)
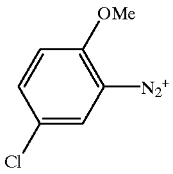
(viii-f)
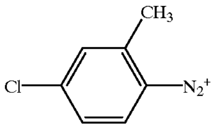

-continued (viii-g)

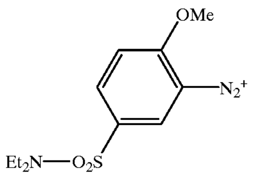

(viii-h)

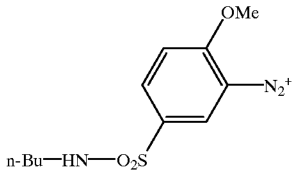

(viii-i)

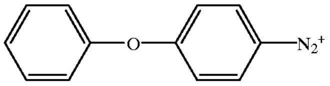

(viii-j)

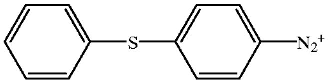

(viii-k)

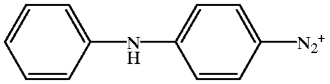

(viii-l)

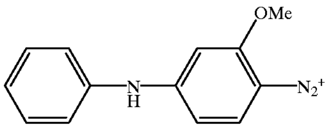

(viii-m)

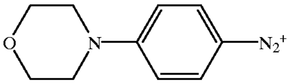

(viii-n)

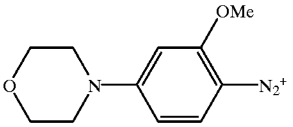

(viii-o)

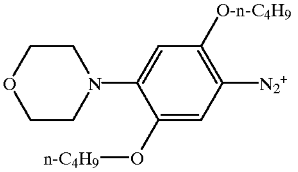

(viii-p)

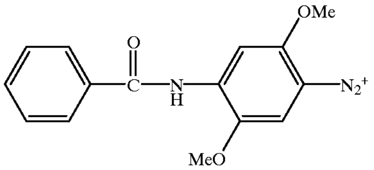

-continued (viii-q)

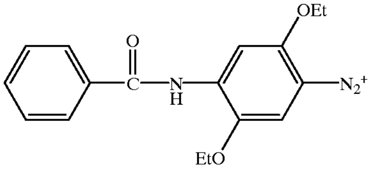

(viii-r)

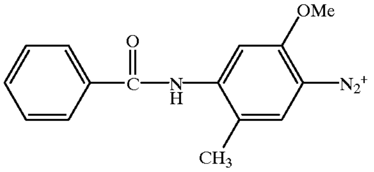

(viii-s)

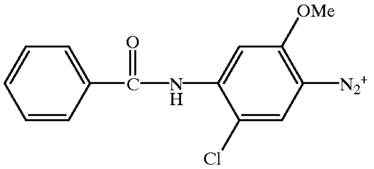

(viii-t)

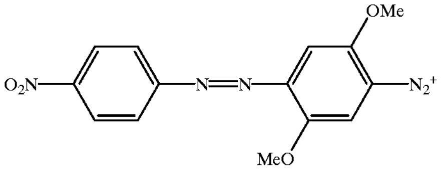

(viii-u)

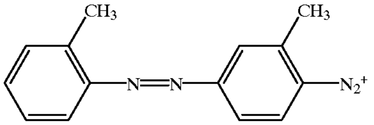

(viii-v)

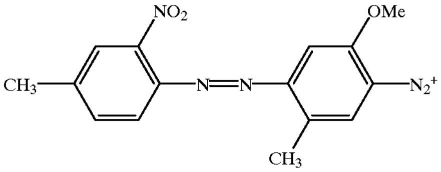

(viii-w)

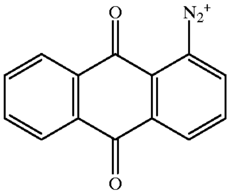

Meanwhile, of the counter-anions for these onium salts, the following may be listed as sulfonate ions that may be used to particularly good effect.

1) methane sulfonate,
2) ethane sulfonate,
3) 1-propane sulfonate,
4) 2-propane sulfonate,
5) n-butane sulfonate,
6) allyl sulfonate,
7) 10-camphor sulfonate,
8) trifluoromethane sulfonate, 9) pentafluoroethane sulfonate, 10) benzene sulfonate, 11) p-toluene sulfonate, 12) 3-methoxybenzene sulfonate, 13) 4-methoxybenzene sulfonate, 14) 4-hydroxybenzene sulfonate, 15) 4-chlorobenzene sulfonate, 16) 3-nitrobenzene sulfonate, 17) 4-nitrobenzene sulfonate, 18) 4-acetylbenzene sulfonate, 19) pentafluorobenzene sulfonate, 20) 4-dodecylbenzene sulfonate, 21) mesitylene sulfonate, 22) 2,4,6-triisopropyl benzene sulfonate, 23) 2-hydroxy-4-methoxybenzene sulfonate, 24) isophthalic acid dimethyl-5-sulfonate, 25) diphenylamine-4-sulfonate, 26) 1-naphthalene sulfonate, 27) 2-naphthalene sulfonate, 28) 2-naphthol-6-sulfonate, 29) 2-naphthol-7-sulfonate, 30) anthraquinone-1-sulfonate, 31) anthraquinone-2-sulfonate, 32) 9,10-dimethoxyanthracene-2-sulfonate, 33) 9,10-diethoxyanthracene-2-sulfonate, 34) quinoline-8-sulfonate, 35) 8-hydroxyquinoline-5-sulfonate, and 36) 8-anilino-naphthalene-1-sulfonate.

It is also possible to use salts of two onium salt cation equivalents and a disulfonate such as 41) m-benzene disulfonate, 42) benzaldehyde-2,4-disulfonate, 43) 1,5-naphthalene disulfonate, 44) 2,6-naphthalene disulfonate, 45) 2,7-naphthalene disulfonate, 46) anthraquinone-1,5-disulfonate, 47) anthraquinone-1,8-disulfonate, 48) anthraquinone-2,6-disulfonate, 49) 9,10-dimethoxyanthracene-2,6-disulfonate, and 50) 9,10-diethoxyanthracene-2,6-disulfonate.

The onium salt sulfonates preferably used in the present invention can be obtained by mixing the corresponding $Cl^-$ salt or the like with sulfonic acid, sodium sulfonate, or potassium [sulfonate] in water or in a solvent mixture of water and a hydrophilic solvent such as alcohol and performing a salt exchange.

The onium compounds can be synthesized using a known method, such, for example, as the methods described in Maruzen-Shinjikken Kagaku Koza (Maruzen-New Experimental Chemistry Lectures) Vol. 14-I, Chapter 2–3 (p. 448), Vol. 14-(II), Chapter 8–16 (p. 1838) and Chapter 7–14 (p. 1564), J. V. Crivello et al., Polymer Chemistry Edition (Polym. Chem. Ed.), Vol. 18, 2677 (1980), in the specifications of U.S. Pat. Nos. 2,807,648 and 4,247,473, and in JP-A No. 53-101331 and Japanese Patent Publication No. 5-53166.

Preferred examples of onium salt sulfonates that may be used to good effect as acid generating compounds in the present invention are now diagrammed.

(vi-a-1)

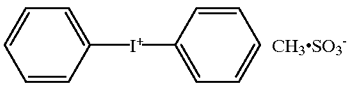

(vi-a-7)

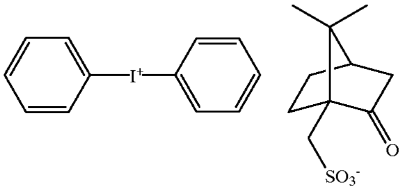

(vi-a-8)

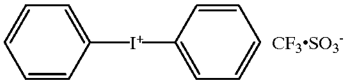

(vi-a-11)

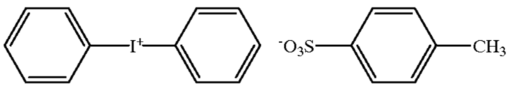

(vi-a-13)

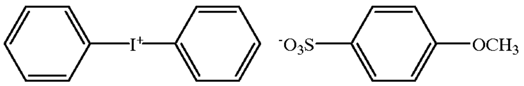

(vi-a-17)

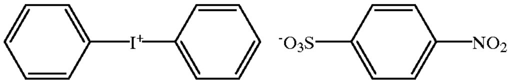

(vi-a-20)

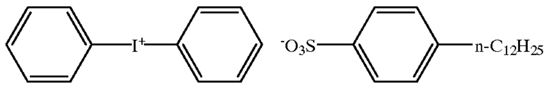

(vi-a-27)

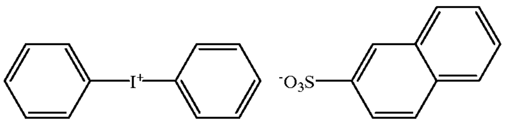

(vi-a-31)

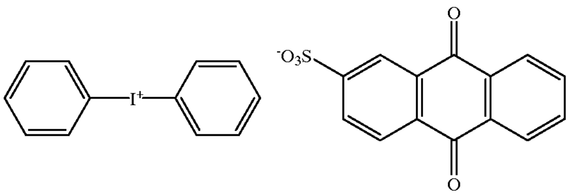

(vi-a-32)

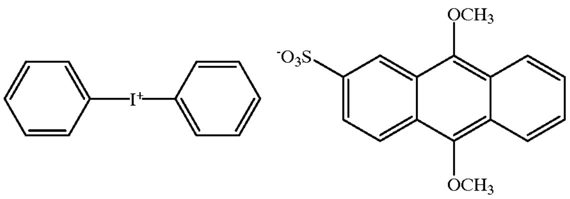

-continued
(vi-a-33)
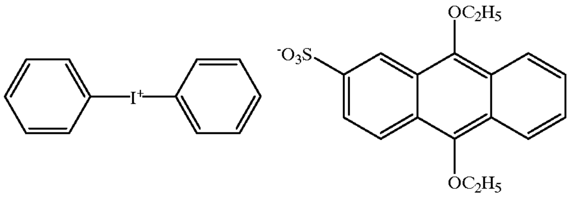
(vi-a-36)
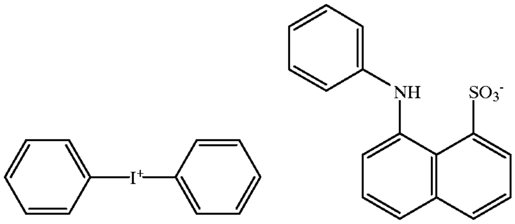
(vi-a-50)
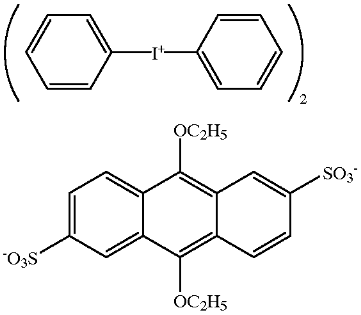
(vi-d-8)
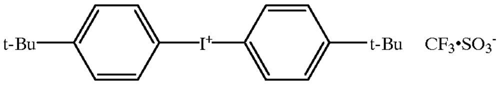
(vi-e-8)
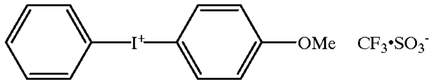
(vi-g-8)
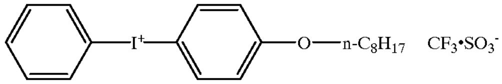
(vi-g-11)
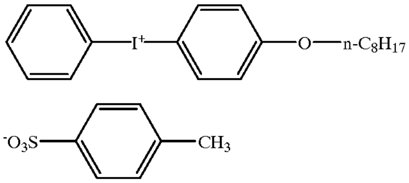
(vi-i-11)
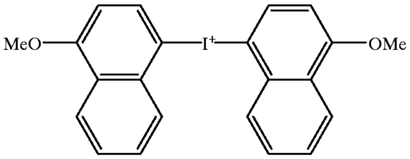
-continued
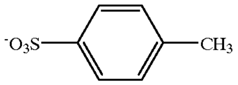
(vi-j-11)
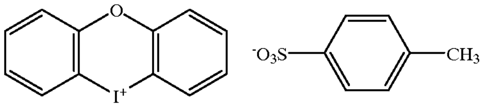
(vii-a-1)
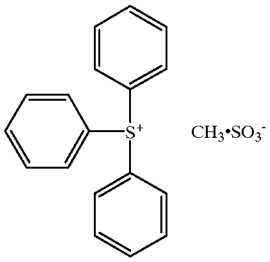
(vii-a-2)
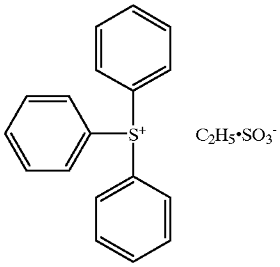
(vii-a-5)
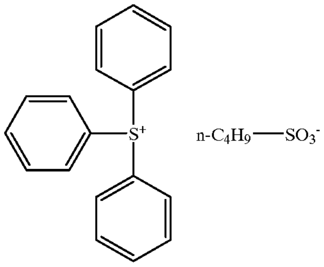
(vii-a-7)
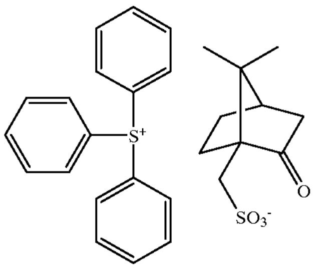

-continued
(vii-a-8)
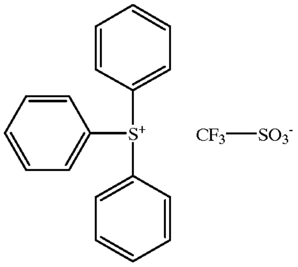
(vii-a-10)
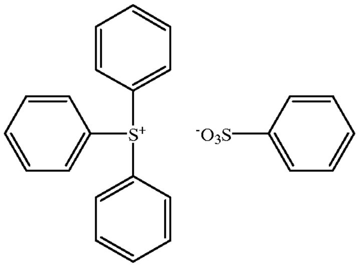
(vii-a-11)
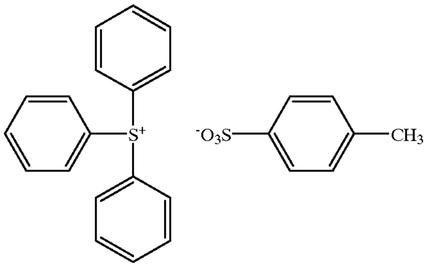
(vii-a-13)
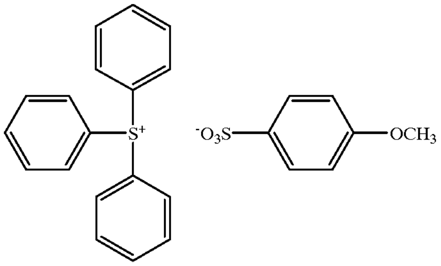
(vii-a-15)
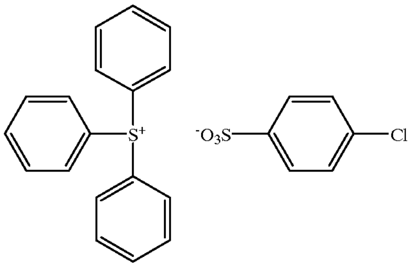
-continued
(vii-a-17)
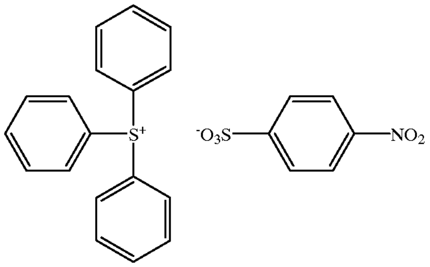
(vii-a-20)
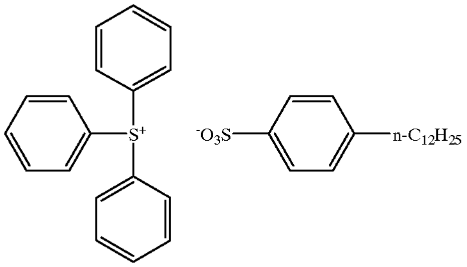
(vii-a-21)
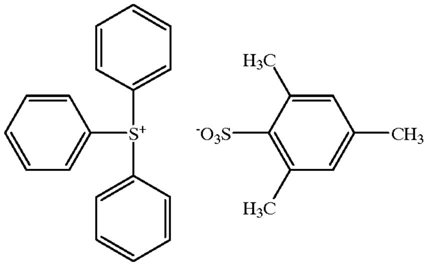
(vii-a-22)
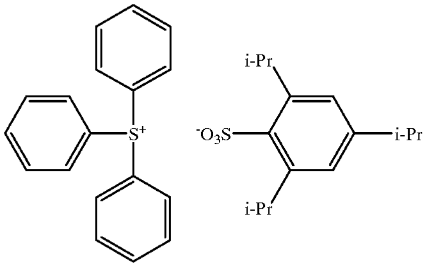
(vii-a-23)
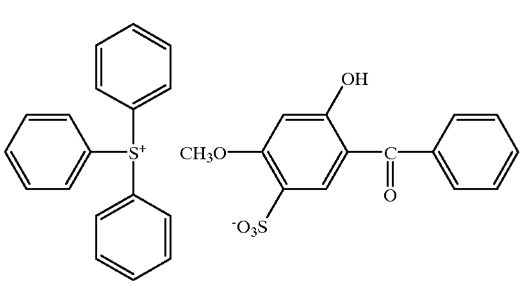

-continued
(vii-a-26)
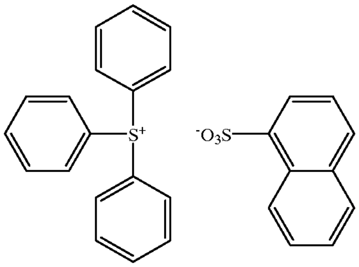
(vii-a-27)
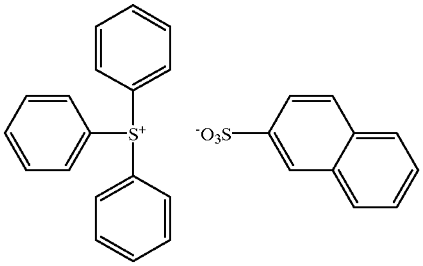
(vii-a-31)
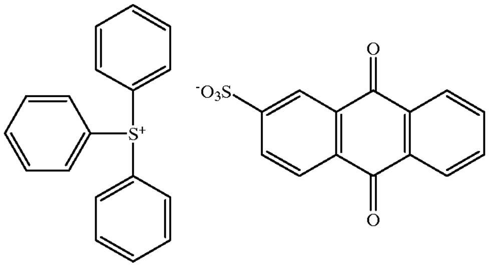
(vii-a-32)
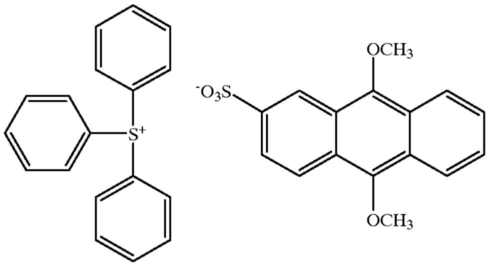
(vii-a-33)
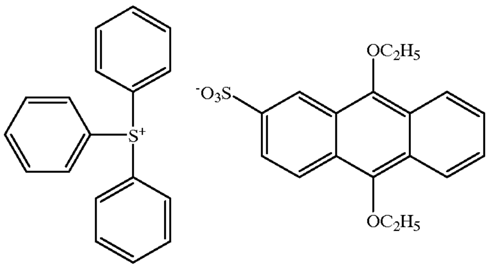
-continued
(vii-b-8)
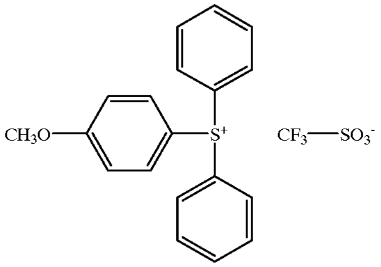
(vii-c-8)
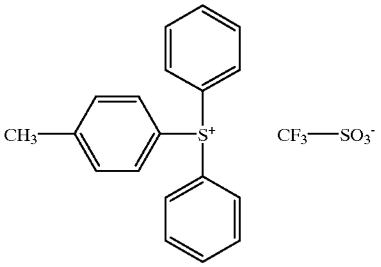
(vii-d-8)
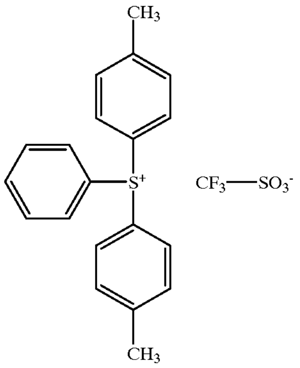
(vii-e-8)
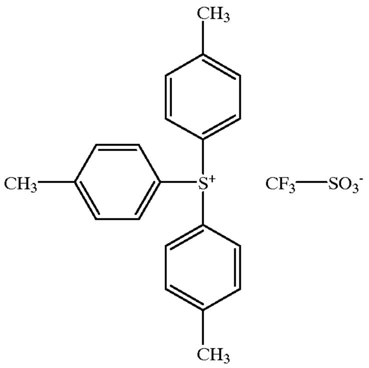
(vii-f-8)
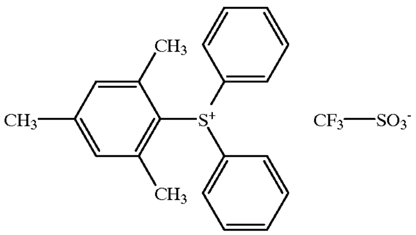

-continued
(vii-g-8)
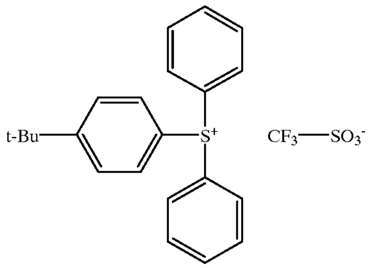
(vii-h-8)
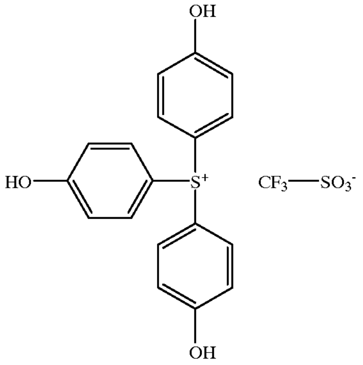
(vii-j-11)
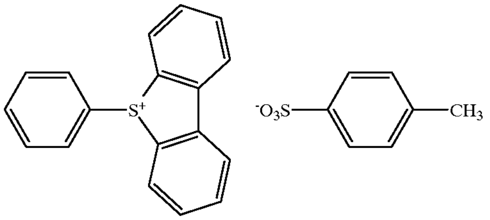
(vii-k-8)
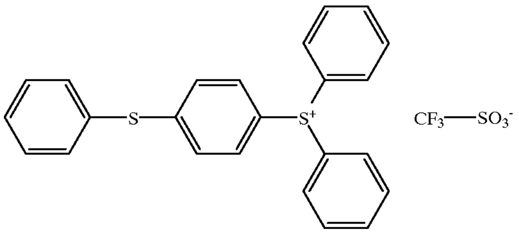
(vii-k-13)
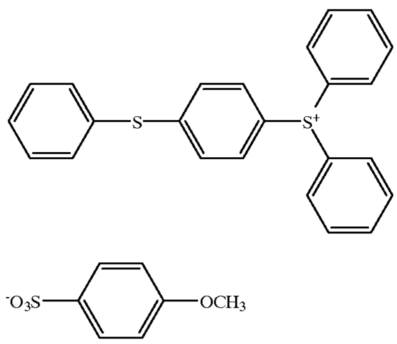
-continued
(vii-o-11)
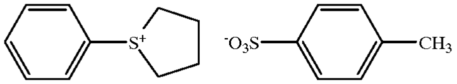
(vii-p-8)
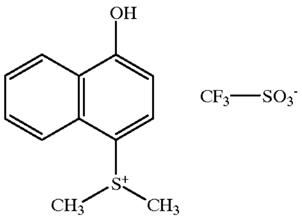
(vii-r-8)
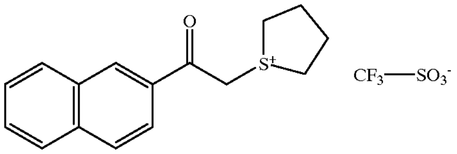
(viii-b-20)
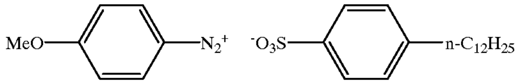
(viii-c-20)
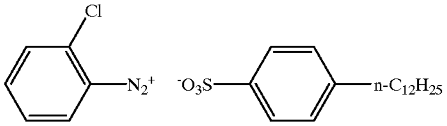
(viii-d-21)
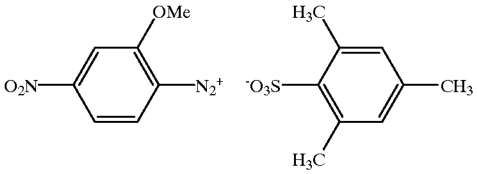
(viii-e-21)
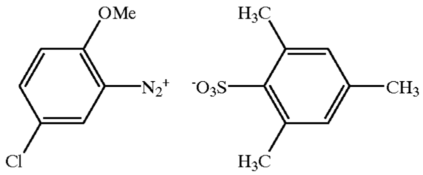
(viii-k-20)
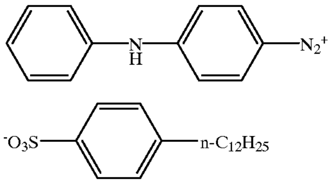
(viii-k-21)
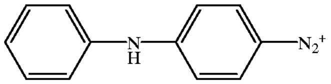

-continued

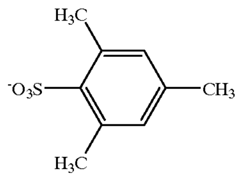

(viii-l-21)

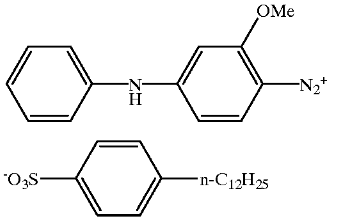

(viii-o-8)

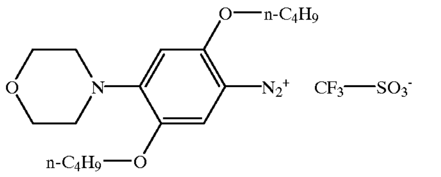

(viii-p-21)

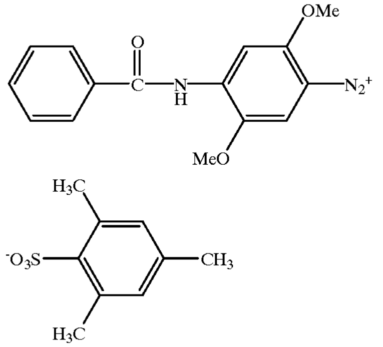

(viii-t-20)

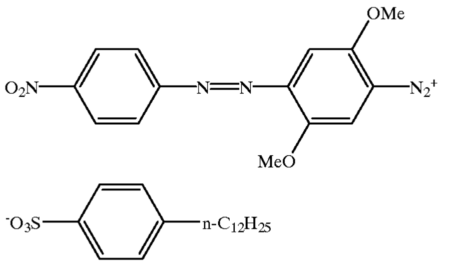

(viii-w-21)

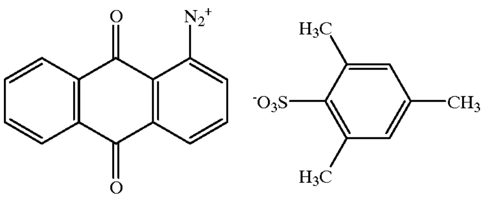

In the present invention, these acid generating compounds are added into the image recording material of the present invention in an amount of 0.01 to 50 wt. % relative to the entire solid part of the image recording material, but preferably in an amount of 0.1 to 25 wt. %, and even more preferably in an amount of 0.5 to 20 wt. %. When the quantity added is less than 0.01 wt. %, the image is not obtained, whereas when the quantity added exceeds 50 wt. %, contamination develops in the non-image portion during printing, wherefore both extremes are undesirable.

These compounds may be used singly or in combinations of two types or more. (b) Crosslinking agent The following compounds may be cited as crosslinking agents that can be used to good effect in the present invention.

(i) Aromatic compounds with a substituted alkoxymethyl group or hydroxymethyl group (ii) Compounds having an N-hydroxymethyl group, N-alkoxymethyl group, or N-acyloxymethyl group (iii) Epoxy compounds These are now described in greater detail.

(i) For the aromatic compounds with a substituted alkoxymethyl group or hydroxymethyl group, examples that may be cited include heterocyclic compounds and aromatic compounds wherein there has been poly-substitution with a hydroxymethyl group, acetomethyl group, or alkoxymethyl group. Not included, however, are the resin-form compounds known a resols wherein phenols and aldehydes are polycondensated under alkaline conditions. While resol resins do excel in crosslinking, they do not exhibit sufficient thermal stability, and, particularly when included in photosensitive materials and stored for prolonged periods in high temperatures, it becomes very difficult to realize uniform developing, wherefore such are unsuitable.

Among heterocyclic compounds and aromatic compounds wherein there has been poly-substitution with a hydroxymethyl group, acetomethyl group, or alkoxymethyl group, preferable examples are those compounds having a hydroxymethyl group or alkoxymethyl group positioned adjacent to a hydroxy group. In the case of the alkoxymethyl group, it is preferable that the compound be one wherein the alkoxymethyl group has 18 or fewer carbons. Particularly preferable examples are the compounds represented below by general formulas (1) to (4).

General Formula (1)

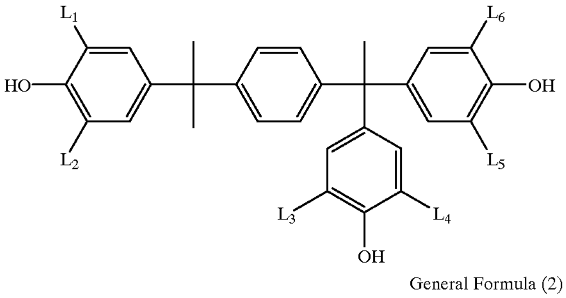

General Formula (2)

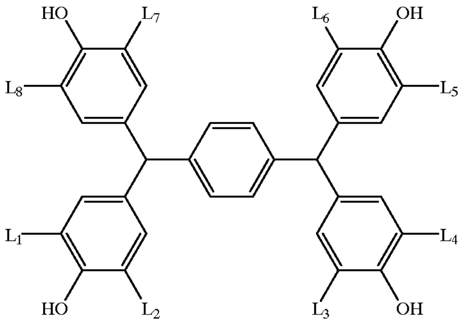

-continued

General Formula (3)

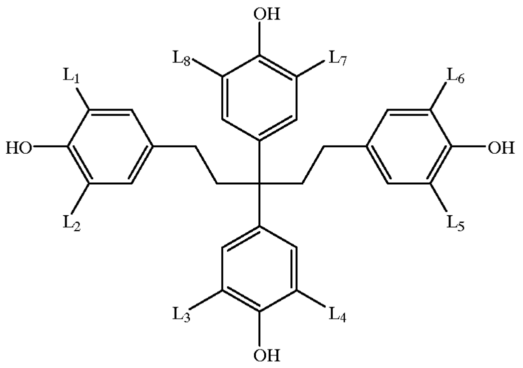

General Formula (4)

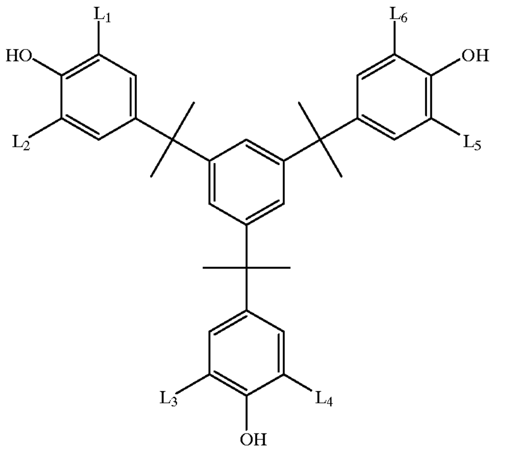

In the general formulas (1) to (4) above, $L_1$ to $L_8$, respectively, represent hydroxymethyl groups or alkoxymethyl groups substituted for by an alkoxy group having 18 or fewer carbons, such as methoxymethyl or ethoxymethyl, etc.

These exhibit high crosslinking efficiency, and are desirable because they can enhance resilience to printing. The crosslinking compounds cited above as examples may be used singly or in combinations of two or more types.

(ii) Compounds having the N-hydroxymethyl group, N-alkoxymethyl group, or N-acyloxymethyl group that may be cited include the monomers, oligomer melamine formaldehyde condensates and urea formaldehyde condensates disclosed in European Patent Laid-open (hereinafter cited as EP-A) No. 0,133,216, German Patent No. 3,634,671, and German Patent No. 3,711,264, and the alkoxy substituted compounds disclosed in the specification of EP-A No. 0,212,482, etc.

Even more preferable examples that may be cited include, for example, melamine formaldehyde derivatives having at least two free N-hydroxymethyl groups, N-alkoxymethyl groups, or N-acyloxymethyl groups, with the N-alkoxymethyl derivatives being particularly preferable.

(iii) The epoxy compounds that may be cited are those that are monomers, dimers, oligomers, or polymers containing one or more epoxy groups. Examples that may be cited include reaction products of bisphenol A and epichlorohydrin, and reaction products of epichlorohydrin and a phenol formaldehyde resin of low molecular weight. Epoxy resins may also be cited which are in use and described in the specifications of U.S. Pat. No. 4,026,704 and Great Britain Patent No. 1,539,192.

The crosslinking agents usable in the present invention noted in (i) to (iii) above are [added] in a range of 5 to 80 wt. %, relative to the total solid part of the image recording material, but preferably within a range of 10 to 75 wt. %, and even more preferably within a range of 20 to 70 wt. %. When the quantity of crosslinking agent added is less than 5 wt. %, the durability of the photosensitive layer in the planographic printing plate obtained deteriorates. When 80 wt. % is exceeded, problems arise in terms of stability during storage.

(iv) In the present invention, the phenol derivatives represented by general formula (5) below may also be used to good effect.

General Formula (5)

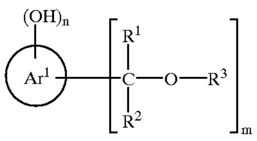

In general formula (5) above, $Ar_1$ represents an aromatic hydrocarbon ring which may have a substituent. In terms of raw material availability, preferable aromatic hydrocarbon rings include benzene rings, naphthalene rings, and anthracene rings. Preferable substituents that may be cited include halogen atoms, hydrocarbon groups having 12 or fewer carbons, alcoxy groups having 12 or fewer carbons, alkylthio groups having 12 or fewer carbons, cyano groups, nitro groups, and trifluoromethyl groups, etc. For the $Ar^1$, for reasons of high sensitivity, benzene rings or naphthalene rings having no substituent, or benzene rings or naphthalene rings having as substituents halogen atoms, hydrocarbon groups with 6 or fewer carbons, alkoxy groups with 6 or fewer carbons, alkylthio groups with 6 or fewer carbons, or nitro groups, etc., are particularly to be preferred.

In general formula (5) above, $R^1$ and $R^2$, which may be the same or different, respectively represent hydrogen atoms or hydrocarbon groups having 12 or fewer carbons. For reasons of ease of synthesis, it is particularly preferable that $R^1$ and $R^2$ be hydrogen atoms or methyl groups. $R^3$ represents a hydrogen atom or a hydrocarbon group having 12 or fewer carbons. For reasons of high sensitivity, it is especially preferable that $R^3$ be a hydrocarbon group having 7 or fewer carbons, such, for example, as an ethyl group, propyl group, cyclohexyl group, or benzyl group, etc. m represents an integer from 2 to 4. n represents an integer from 1 to 3.

Specific examples of phenol derivatives that are expressed by the general formula (5) given above and used to good effect in the present invention are diagrammed below (crosslinking agents [KZ-1] to [KZ-12]), but the present invention is not limited to or by these examples.

[KZ-1]

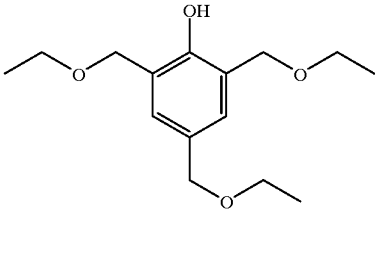

-continued

[KZ-2]

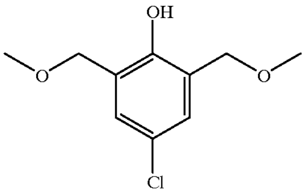

[KZ-3]

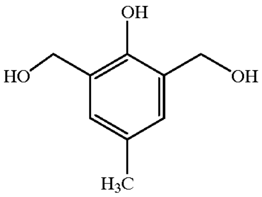

[KZ-4]

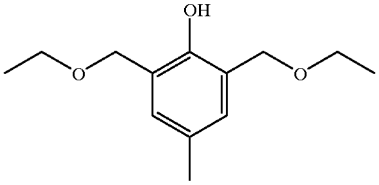

[KZ-5]

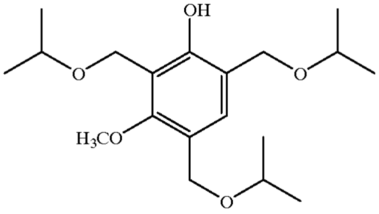

[KZ-6]

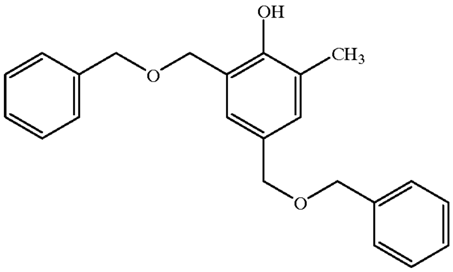

[KZ-7]

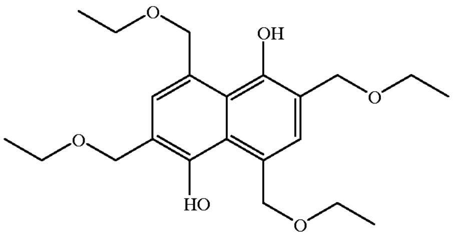

-continued

[KZ-8]

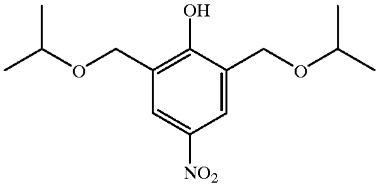

Cross-linking Agent

[KZ-9]

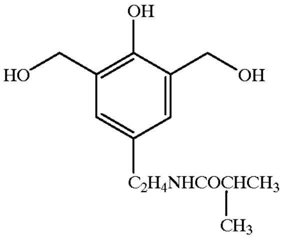

[KZ-10]

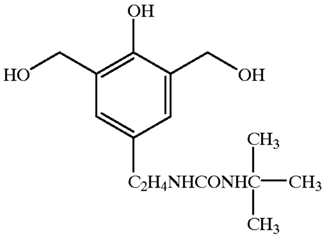

[KZ-11]

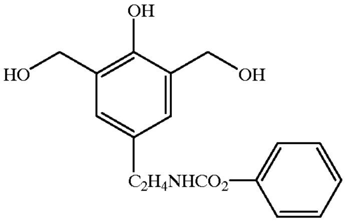

[KZ-12]

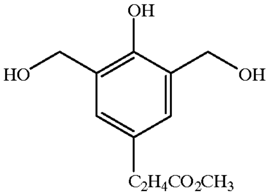

These phenol derivatives can be synthesized by known methods. For example, [KZ-1] can be synthesized by a process stream such as represented by Reaction Formula [1] below, that is, by causing phenol, formaldehyde, and a class-2 amine such as dimethylamine or morpholine to react to make a tri (dialkylaminomethyl)phenol, then causing that to react with anhydrous acetic acid, and finally causing that to react with ethanol in the presence of a weak alkali such as potassium carbonate.

[Reaction Formula 1]

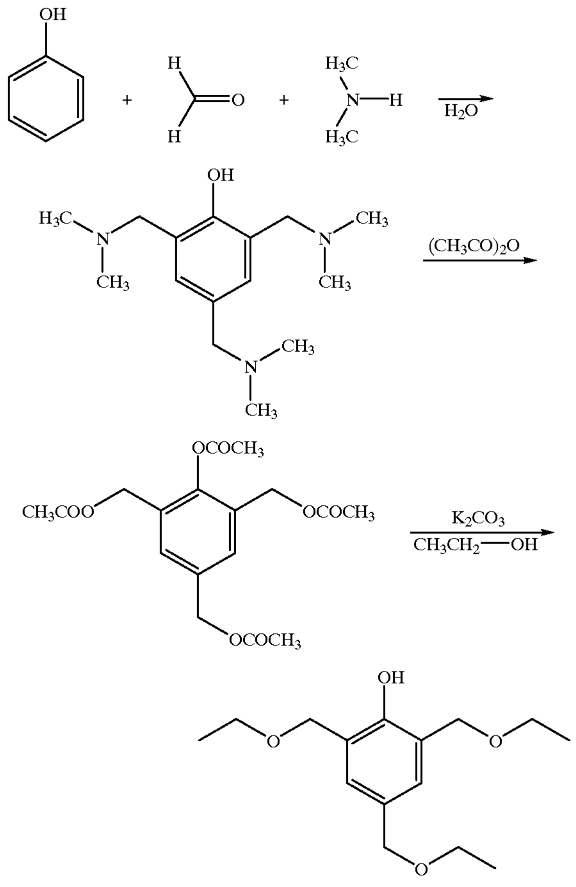

[KZ-1]

Synthesis may also be done using some other method. [KZ-1] may also be synthesized by a process stream such as represented by Reaction Formula [2] below, that is, by causing phenol and formaldehyde or paraformaldehyde to react in the presence of an alkali such as KOH to make 2,4,6-trihydroxymethylphenol, and then causing that to react with ethanol in the presence of an acid such as sulfuric acid.

[Reaction Formula 2]

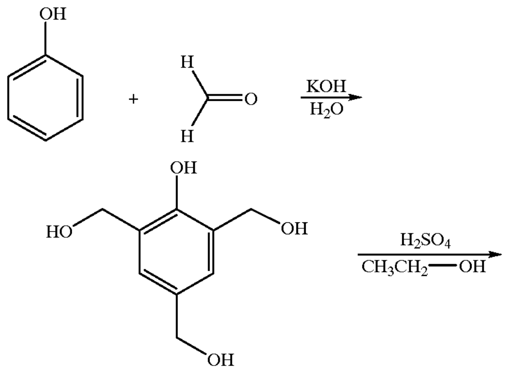

-continued

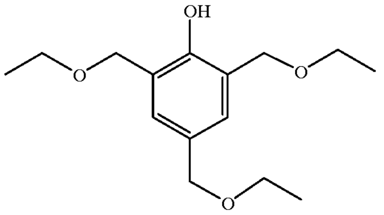

[KZ-1]

These phenol derivatives may be used singly or in combinations of two or more types. When synthesizing these phenol derivatives, moreover, there will be cases where the phenol derivatives themselves condense and generate byproduct impurities such as dimers or trimers, etc., but such may be used, as they are, containing the impurities. In such cases, however, it is preferable that the impurities be 30% or less, and preferably 20% or less.

In the present invention, the phenol derivatives are used in additive quantities of 5 to 70 wt. % in the solid part of the image recording material, but preferably 10 to 50 wt. %. Here, if the quantity of crosslinking agent phenol derivative added is less than 5 wt. %, the film strength in the image portion when the image is recorded will deteriorate, whereas, when 70 wt. % is exceeded, problems arise in terms of stability during storage.

(c) Alkali-soluble Polymers

What is intended by (c) a high-polymer compound substantially insoluble in water and substantially soluble in an alkali aqueous solution used in the present invention are polymer compounds which have acid-group structures such as the following in the main chain and/or the side chain.

Phenolic hydroxyl group (—Ar—OH), carboxylic acid group (—$CO_3H$), sulfonic acid group (—$SO_3H$), phosphoric acid group (—$OPO_3H$), sulfonamide group (—$SO_2NH$—R), substituted sulfonamide-based acid group (active imide group) (—$SO_2NHCOR$, —$SO_2NHSO_2R$, —$CONHSO_2R$).

Here, Ar represents a bivalent aryl group that may have a substituent, while R represents a hydrocarbon group that may have a substituent.

Of these, what may be cited as preferable acid groups include (c-1) phenolic hydroxyl groups, (c-2) sulfonamide groups, and (c-3) active imide groups, with polymer compounds having the (c-1) phenolic hydroxyl group being particularly preferable for use.

(c-1) For the polymer compounds having a phenolic hydroxyl group, examples that may be cited include novolac resins such as condensation polymers of a phenol and formaldehyde (hereinafter called "phenol formaldehyde resins"), condensation polymers of m-cresol and formaldehyde (hereinafter called "m-cresol formaldehyde resins"), condensation polymers of p-cresol and formaldehyde, condensation polymers of m-/p-mixed cresols and formaldehyde, and condensation polymers of a phenol, cresol (m-, p-, or m-/p-mixture), and formaldehyde, and condensation polymers of pyrogallol and acetone. Alternatively, copolymers wherein monomers having phenol in a side chain are copolymerized can also be used. Monomers having a phenol group which can be used include acrylamides, methacrylamides, acrylic acid esters, methacrylic acid esters, and hydroxystyrenes, etc., which have a phenol group. Specific examples thereof which can be used to good effect include N-(2-hydroxyphenyl)acrylamide, N-(3-hydroxyphenyl)acrylamide, N-(4-hydroxyphenyl) acrylamide, N-(2-hydroxyphenyl) methacrylamide, N-(3-hydroxyphenyl)methacrylamide, N-(4-hydroxyphenyl)

methacrylamide, o-hydroxyphenyl acrylate, m-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate, etc. Those wherein the weight average molecular weight of the polymer is $5.0\times10^2$ to $2.0\times10^4$ and the number average molecular weight thereof is $2.0\times10^2$ to $1.0\times10^4$ are preferable in terms of image forming properties. Not only may these resins be used singly, but they may also be used in combinations of two or more types. When combinations are used, it is also permissible to jointly use a condensation polymer of t-butylphenol and formaldehyde, such as that described in the specification of U.S. Pat. No. 4,123,279, or a condensation polymer of a phenol and aldehyde having an alkyl group with 3 to 8 carbons as a substituent, such as a condensation polymer of octylphenol and formaldehyde.

These polymer compounds having a phenolic hydroxyl group preferably have a weight average molecular weight of 500 to 20,000 and a number average molecular weight of 200 to 10,000.

It is also permissible to jointly use a condensation product of a phenol and formaldehyde having an alkyl group with 3 to 8 carbons as a substituent, such as the t-butylphenol formaldehyde resins and octylphenol formaldehyde resins described in the specification of U.S. Pat. No. 4,123,279. Such polymer compounds having a phenolic hydroxyl group may be used as a single type or as a combination of two or more types.

(c-2) The polymer compounds having the sulfonamide group have as their main configuring component a monomer that has the sulfonamide group. Such monomers having the sulfonamide group may be monomers consisting of a sulfonamide group wherein, in one molecule, at least one hydrogen atom is bonded on a nitrogen atom, and low-molecular compounds that each have one or more unsaturated bonds that are capable of polymerization. Among these, low-molecular compounds are preferable which have an acryloyl group, allyl group, or vinyloxy group, on the one hand, and a substituted or mono-substituted aminosulfonyl group or substituted sulfonylimino group, on the other.

As such compounds, those diagrammed in the general formulas (5) to (9) below may be cited as examples.

General Formula (5)

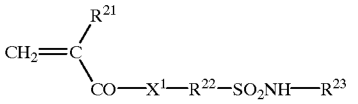

General Formula (6)

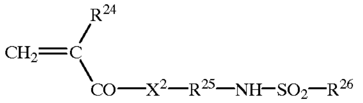

General Formula (7)

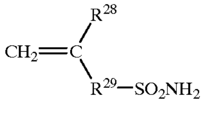

-continued

General Formula (8)

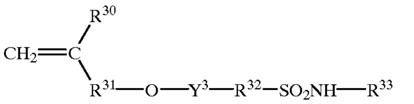

General Formula (9)

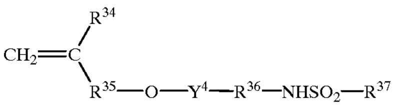

In the formulas, $X^1$ and $X^2$, respectively, independently represent —O— or $NR^{27}$. $R^{21}$ and $R^{24}$, respectively, independently represent a hydrogen atom or $CH^3$. $R^{22}$, $R^{25}$, $R^{29}$, $R^{32}$, and $R^{36}$, respectively, represent alkylene groups, cycloalkylene groups, arylene groups, or aralkylene groups having 1 to 12 carbons that may have substituents. $R^{23}$, $R^{27}$, and $R^{33}$, respectively, independently represent alkyl groups, cycloalkyl groups, aryl groups, or aralkyl groups having 1 to 12 carbons that may have substituents. $R^1$ and $R^{37}$, respectively, independently represent alkyl groups, cycloalkyl groups, aryl groups, or aralkyl groups having 1 to 12 carbons that may have substituents. $R^{28}$, $R^{30}$, and $R^{34}$, respectively, independently represent hydrogen atoms or H3. $R^{31}$ and $R^{35}$, respectively, independently represent alkylene groups, cycloalkylene groups, arylene groups, or aralkylene groups having 1 to 12 carbons that may have single bonds or substituents. $Y^3$ and $Y^4$, respectively, independently represent single bonds or —CO—.

More specifically, m-aminosulfonylphenyl methacrylate, N-(p-aminosulfonylphenyl)methacrylamide, and N-(p-aminosulfonylphenyl)acrylamide, etc., can be used to good effect.

(c-3) The polymer compounds having active imide groups are compounds having the active imide group diagrammed in the formula below in their molecules. For the monomers having the active imide group, which are the main monomers configuring these polymer compounds, monomers may be cited which, in one molecule, comprise the active imide group represented by the formula below, and low-molecular compounds each having one or more unsaturated bonds capable of polymerization.

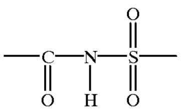

Specific examples of such compounds that can be used to good effect include N-(p-toluenesulfonyl) methacryalamide, and N-(p-toluenesulfonyl)acrylamide, etc.

The alkali-soluble polymers used in the present invention need not be those consisting of one type [of monomer] selected from among monomers including the acid groups from (c-1) to (c-3) noted above. Those wherein two or more types of monomer having the same acid group, or two or more types of monomers having different acid groups, may also be used.

The copolymerization method used may be a conventionally known graft copolymerization method, block copolymerization method, or random copolymerization method.

It is preferable that the copolymers described in the foregoing contain, as the copolymerization components, 10 mol % or more of the monomers having any of the acid groups (c-1) to (c-3) to be copolymerized, with 20 mol % or greater being more preferable. If the monomers containing the (c-1) to (c-3) acid groups are less than 10 mol %, the developing latitude enhancing effect will be insufficient.

These copolymers may also contain other monomers than those containing the (c-1) to (c-3) acid groups, as copolymerization components.

Examples of such other monomers that can be used as copolymerization components include the monomers listed below in (1) to (12).

(1) Acrylic acid esters and methacrylic esters having a fatty hydroxyl group such as 2-hydroxyethylacrylate or 2-hydroxyethylmethacrylate, for example.

(2) Alkylacrylates such as methyl acrylate, ethyl acrylate, propyl acrylate, butyl acrylate, amyl acrylate, hexyl acrylate, octyl acrylate, benzyl acrylate, acrylic acid-2-chloroethyl, glycidyl acrylate, or N-dimethylaminoethyl acrylate, etc.

(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, methacrylic acid-2-chloroethyl, glycidyl methacrylate, and N-dimethylaminoethyl methacrylate, etc.

(4) Acrylamides or methacrylamides such as acrylamide., methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, and N-ethyl-N-phenyl acrylamide, etc.

(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether, etc.

(6) Vinyl esters such as vinyl acetate, vinyl chloroacetate, vinyl butylate, and vinyl benzoate, etc.

(7) Styrenes such as styrene, α-methyl styrene, methyl styrene, and chloromethyl styrene, etc.

(8) Vinyl ketones such as methyl vinyl ketones, ethyl vinyl ketones, propyl vinyl ketones, and phenyl vinyl ketones, etc.

(9) Olefins such as ethylene, propylene, isobutyrene, butadiene, and isoprene, etc.

(10) N-vinyl pyrolidone, N-vinyl carbazole, 4-vinyl pyridine, acrylonitrile, methacrylonitrile, etc.

(11) Unsaturated imides such as maleimido, N-acryloyl acrylamide, N-acetyl methacrylamide, N-propionyl methacrylamide, and N-(p-chlorobenzoyl) methacrylamide, etc.

(12) Unsaturated carboxylic acids such as acrylic acid, methacrylic acid, anhydrous maleic acid, and itaconic acid, etc.

For the alkali-soluble polymers in the present invention, whether single polymers or copolymers, it is preferable in terms of film strength that the weight average molecular weight be 2000 or greater and that the number average molecular weight be 500 or greater. It is even more preferable that the weight average molecular weight be from 5000 to 300,000, that the number average molecular weight be from 800 to 250,000, and that the degree of dispersion ((weight average molecular weight)/(number average molecular weight)) be from 1.1 to 10.

In the copolymers described in the foregoing, the mixture ratio by weight between the monomers having any of the acid groups (c-1) to (c-3) and other monomers should be within a range of 50:50 to 5:95 in the interest of developing latitude, with a range of from 40:60 to 10:90 being more preferable.

These alkali-soluble polymers may be used respectively as single types or as combinations of two or more types, and the quantity added should be 30 to 99 wt. % of the total solid part of the image recording material, but preferably 40 to 95 wt. %, and even more preferably 50 to 90 wt. %. If the quantity of this alkali-soluble polymer added is less than 30 wt. %, the durability of the photosensitive layer deteriorates, whereas when 99 wt. % is exceeded, that is undesirable in terms of both sensitivity and durability.

Other Components

In the present invention, the four components described in the foregoing are mandatory, but various other compounds may be added as necessary.

Dyes that exhibit great absorbency in the visual light region may be used as image coloring agents, for example.

More specifically, these include such dyes as oil yellow #101, oil yellow #103, oil pink #312, oil green BG, oil blue BOS, oil blue #603, oil black BY, oil black BS, oil black T-505 (all of which are manufactured by Orient Kagaku Kogyo KK), victoria pure blue, crystal violet (CI42555), methyl violet (CI42535), ethyl violet, rhodamine B (CI145170B), malachite green (CI42000), methylene blue (CI52015), etc., or the dyes described in JP-A No. 62-293247.

It is preferable that these dyes be added because they make it easier to distinguish between the image and non-image portions after the image is formed. The quantity added should be 0.01 to 10 wt. % relative to the total solid part of the image recording material.

Furthermore, in the negative-type image recording material of the present invention, in order to broaden the process stability for the developing conditions, non-ionic surfactants such as described in JP-A No. 62-251740 or JP-A No. 3-208514, or amphoteric surfactants such as described in JP-A Nos. 59-121044 or JP-A No. 4-13149, can be added.

Specific examples of the non-ionic surfactants noted above include sorbitan tristearate, sorbitan monopalmitate, sorbitan trioleate, stearic acid monoglyceride, and polyoxyethylene nonylphenyl ether, etc.

Specific examples of the amphoteric surfactants noted above include alkyldi(aminoethyl) glycine, alkylpolyaminoethyl glycine chloride, 2-alkyl-N-carboxyethyl-N-hydroxyethyl imadazolinium betaine, or N-tetradecyl-N,N-betaine types (such, for example, as the product named Amogen K made by Dai-ichi Kogyo KK). The ratio of such non-ionic surfactants and amphoteric surfactants in the image recording material should be 0.05 to 15 wt. % and preferably 0.1 to 5 wt. %.

Furthermore, plasticizers for imparting flexibility to coating films, etc., are added, as necessary, to the image recording material of the present invention. Examples of such permissible additives include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and acrylic acid and methacrylic acid oligomers and polymers, etc.

Besides these, epoxy compounds and vinyl ethers and the like may also be added.

The image recording material of the present invention configured as described in the foregoing can be used to good effect in planographic printing plates. Planographic printing plates wherein the image recording materials of the present invention are used are now described. In this specification, moreover, by planographic printing plate is meant a plate material that is in a condition wherein no image pattern having ink-receptive portions and non-ink-receptive portions is formed, while by planographic plate is meant a plate material whereon an image pattern having ink-receptive portions and non-ink-receptive portions has been formed and which may be used in that condition for printing.

The planographic printing plate has a photosensitive layer containing the image recording material of the present invention described in the foregoing on a supporting body, and also has other layers as necessary.

The photosensitive layer can ordinarily be manufactured by dissolving the components described in the foregoing in a solvent and coating that on a suitable supporting body. Examples of the solvents that are used here include, but are not limited to, ethylene dichloride, cyclobexanone, methyl-ethyl ketones, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethyl acetamide, N,N-dimethyl formamide, tetramethyl urea, N-methyl pyrolidone, dimethyl sulfoxide, sulfolane, γ-butyl lactone, toluene, and water, etc. These solvents are used singly or in mixtures. The concentration of the components noted above (total solid part including additives) in the solvent should be 1 to 50 wt. %.

The quantity of the coating (solid part) on the supporting body obtained after coating and drying will differ according to the application, but in general, for planographic plates, should be from 0.5 to 5.0 $g/m^2$. Various methods of coating may be used, such as barcoater coating, revolving coating, spray coating, curtain coating, dip coating, air knife coating, blade coating, roller coating, etc. As the coating quantity becomes less, although the apparent sensitivity becomes greater, the coating film properties of the photosensitive layer noted above deteriorate.

Surfactants can be added to the photosensitive layer described above in order to improve coatability, such, for example, as the fluorine-based surfactants described in JP-A No. 62-170950. The preferable range of the quantity added is 0.01 to 1 wt. % in the total solid part of the photosensitive layer, but 0.05 to 0.5 wt. % is even more preferable.

The supporting body used in the present invention is a dimensionally stable plate-form material such, for example, as paper, paper on which is laminated a plastic (such as polyethylene, polypropylene, or polystyrene, etc.), metal plate (including aluminum, zinc, copper, etc.), plastic film (such as cellulose diacetate, cellulose triacetate, cellulose propionate, cellulose butyrate, cellulose acetate-butyrate, cellulose nitrate, polyethylene terephthalate, polyethylene, polystyrene, polypropylene, polycarbonate, or polyvinyl acetal, etc.), and paper or plastic films on which metals like those noted above are laminated or vapor-deposited.

Polyester films or aluminum plate is good for the supporting body used in the present invention, with aluminum plate which is dimensionally stable and comparatively inexpensive being especially good. Ideal aluminum plate includes pure aluminum plate and alloy plate containing aluminum and the main component along with minute quantities of other elements, but plastic film on which aluminum has been laminated or vapor-deposited is also good. The other elements contained in the aluminum alloys include silicon, iron, manganese, copper, magnesium, chromium, zinc, bismuth, nickel, and titanium, etc. The content of these other elements in the alloy at most should be 10 wt. % or less. Particularly ideal aluminum is pure aluminum, but it is difficult, in terms of refining technology, to manufacture completely pure aluminum, wherefore that which contains minute amounts of other elements may be used. The composition of the aluminum plate described in the foregoing is not particularly defined, and aluminum plate of conventionally known and used material can be suitably used. The thickness of the aluminum plate should be 0.1 to 0.6 mm, but preferably 0.15 to 0.4 mm, and even more preferably 0.2 to 0.3 mm.

Prior to roughening the surface of the aluminum plate, it is subjected to a degreasing treatment, if desired, using a surfactant, organic solvent, or alkaline aqueous solution or the like, in order to remove pressing oil from the surface.

The process of surface-roughening the surface of the aluminum plate may be done by any of various methods, such, for example, as by a mechanical surface-roughening method, a method whereby the surface is electrochemically melt-roughened, or a method whereby the surface is selectively melted chemically. The mechanical method used may be a known ball polishing method, brush polishing method, blast polishing method, or buff polishing method, etc. One electrochemical surface roughening method is performed with an alternating current or direct current in a hydrochloric acid or nitric acid electrolyte. Or a method that combines the two, such as is disclosed in JP-A No. 54-63902, can be used.

The aluminum plate surface-roughened in this manner, after being subjected to an alkali etching process and neutralizing process as necessary, is subjected to a cation oxidizing treatment in order to enhance the water retention and wear-resistance of the surface, as desired. For the electrolyte used in the aluminum plate anode oxidizing treatment, various electrolytes that form a porous oxidation film can be used, but sulfuric acid, phosphoric acid, oxalic acid, or chromic acid or a mixture of such acids is generally used. The concentration of these electrolytes is determined appropriately depending on the type of electrolyte used.

The anode oxidation process conditions will vary according to the electrolyte used and so cannot be uniformly defined. Nevertheless, in general, the electrolyte concentration should be a 1 to 80 wt. % solution, with a solution temperature of 5 to 70° C., using a current density of 5 to 60 $A/dm^2$, a voltage of 1 to 100 V, and an electrolysis time within a range of 10 seconds to 5 minutes.

If the quantity of the anode oxidation coating film is less than 1.0 $g/m^2$, the ability to stand up under printing will be inadequate, the non-image portions of the planographic plate will be easily marred, often resulting in so-called "mar contamination" wherewith ink adheres to the marred portions during printing.

After being subjected to the anode oxidation treatment, the aluminum surface, as necessary, is subjected to a treatment to make it hydrophilic. Such hydrophilication treatments include the alkali-metal silicate methods (using aqueous solutions of sodium silicate, for example) disclosed in the specifications of U.S. Pat. Nos. 2,714,066, 3,181,461, 3,280,734 and 3,902,734. In these methods, the supporting body is treated by electrolysis or immersion in an aqueous solution of sodium silicate. In addition, the treatment using potassium zirconate fluoride disclosed in Japanese Patent Publication No. S36-22063/1961 and the treatments using polyvinylphosphonic acid such as disclosed in the specifications of U.S. Pat. Nos. 3,276,868, 4,153,461 and 4,689,272 are used.

The planographic printing plate described in the foregoing, as necessary, may have an undercoat layer on the supporting body.

For the components of the undercoat layer, various organic compounds are used, which may be selected from among carboxymethyl cellulose, dextrin, gum arabic, phosphones having an amino group, such organic phosphonic acids that may have a substituent as phenyl phosphonic acid, naphthyl phosphonic acid, alkyl phosphonic acid, glycerophosphonic acid, methylene diphosphonic acid, and ethylene diphosphonic acid, etc., such organic phosphoric acids that may have a substituent as phenyl phosphoric acid, naphthyl phosphoric acid, alkyl phosphoric acid, and glycerophosphoric acid, etc., such organic phosphinic acids as phenyl phosphinic acid, naphthyl phosphinic acid, alkyl phosphinic acid, and glycerophosphinic acid, etc., such amino acids as glycine or β-alanine, and such amine chlorides having a hydroxy group as triethanol amine chlorides, etc. These may also be used in mixtures of two or more types.

The coating quantity for the undercoat layer should be 2 to 200 $mg/m^2$.

The planographic printing plate in which the image recording material of the present invention is used can be manufactured as described in the foregoing.

The exposure and developing processes are now described.

The planographic printing plate obtained is image-exposed by a solid laser and semiconductor laser emitting infrared light having a wavelength of 760 to 1200 nm. In the present invention, developing processing may be performed immediately after laser irradiation, but it is preferable that a heat treatment be performed between the laser irradiation process and the developing process. The heat treatment should be performed under conditions of 80 to 150° C. for a period of 10 seconds to 5 minutes. By this heat treatment, the laser energy required for recording during laser irradiation can be diminished.

After performing the heat treatment as necessary, the planographic printing plate is developed in an alkaline aqueous solution.

For the developing fluid and replenishing fluid used on the planographic printing plate, a conventionally known alkali aqueous solution can be used. Such include [solutions of] such inorganic alkali salts as sodium silicate, potassium silicate, sodium hypophosphite, potassium hypophosphite, ammonium hypophosphite, sodium phosphite, potassium phosphite, ammonium phosphite, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide, etc. Also, such organic alkali agents as monomethyl amine, dimethyl amine, trimethyl amine, monoethyl amine, diethyl amine, triethyl amine, monoisopropyl amine, diisopropyl amine, triisopropyl amine, n-butyl amine, monoethanol amine, diethanol amine, triethanol amine, monoisopropanol amine, diisopropanol amine, ethylene imine, ethylene diamine, and pyridine can be used. These alkali agents may be used singly or two or more types may be used together.

Of these alkali agents, those which are particularly preferable for the developing fluid are aqueous solutions of such silicate salts as sodium silicate and potassium silicate. The reason why that is so is that it is then possible to adjust the developing characteristics by the concentration of and proportion between the alkali metal oxide $M^2$ O and the silicon oxide $SiO_2$ that is a component of the silicate, and the alkali metal silicates described in JP-A No. 54-62004 and Japanese Patent Publication No. S57-7427 can be used effectively.

When developing is done using an automatic developing machine, moreover, it is know that, by adding an aqueous solution (replenishing fluid) having stronger alkalinity than the developing fluid to the developing fluid, planographic printing plate processing can be done in high volume without changing the developing fluid in the developing tank for a long time. Such a replenishing fluid can be used to good effect in the present invention also.

To the developing fluid and replenishing fluid may be added, as necessary, various surfactants and organic solvents for the purpose of promoting or suppressing development, dispersing development residues, or enhancing the ink-affinity of the printing plate image portions. Preferable surfactants include anionic, cationic, nonionic, and amphoteric surfactants.

To the developing fluid and replenishing fluid, furthermore, as necessary, reducing agents such as hydroxinone, resorcin, and sodium and potassium salts of such inorganic acids as sulfurous acid and hydrosulfurous acid, etc., as well as organic caxboxylic acid, defoaming agents, and water softening agents can also be added.

The planographic plate which has been subjected to a developing process using the developing fluids and replenishing fluids described in the foregoing is post-processed with washing water, a rinse solution containing surfactants, etc., and a desensitizing oiling fluid containing gum arabic or a starch derivative. For the post-processing used when the image recording material of the present invention is used for the printing plate material, these processes can be used in various combinations.

In recent years, due to the rationalization and standardization of plate-making operations in the plate-making and printing industries, automatic developing machines are being widely used for printing plate materials. These automatic developing machines generally consist of a developing unit and a post-processing unit, and comprise mechanisms for conveying the printing plate material, various processing fluid tanks, and spray mechanisms, wherewith developing processing is performed, while conveying the exposed printing plate horizontally, by spraying the processing fluids delivered by pumps from spray nozzles. In recent years, moreover, methods of processing have come into being wherewith submerged guide rollers or the like in processing fluid tanks filled with processing fluid are used to convey the printing plate materials while submerged. In such automatic processing as this, processing can be carried on while replenishing the processing fluid with the replenishing fluid according to the volume of processing and operating time, etc.

The so-called use-and-discard processing method, wherein processing is performed with substantially unused processing fluid, can also be employed.

The planographic plates obtained as described in the foregoing can be coated with a desensitizing oiling gum, as desired, and then used in printing processes, but a burning treatment is performed when the planographic plate must exhibit even greater ability to stand up under printing.

When burning the planographic plate, it is preferable to implement treatment, prior to burning, with a surface preparation solution such as described in Japanese Patent Publication Nos. 61-2518 and 55-28062, and JP-A Nos. 62-318597 and 61-159655.

For the method of so doing, the planographic plate may be coated using a sponge or degreased cotton impregnated with the surface preparation solution, or coating may be done by immersing the printing plate in a vat filled with the surface preparation solution, or coating may be done using an automatic coater. Even more desirable results will be obtained if the coating amount is made uniform after coating by a squeegee or squeegee roller.

For the amount of surface preparation solution applied, a range of 0.03 to 0.8 $g/m^2$ (dried weight) will generally be appropriate.

The planographic plate to which the surface preparation solution has been applied is dried, if necessary, and then heated to a high temperature in a burning processor (such as the BP-1300 burning processor sold by Fuji Photo Film Co., Ltd.). The heating temperature end heating time will depend on the type of components forming the image, but ranges of 100 to 300° C. and 1 to 20 minutes are preferable.

The burning-processed planographic plate may be subjected suitably and as necessary to such processes as are conventionally performed, such as water washing and gum removal. However, in cases where a surface preparation solution containing hydrophilic polymer compounds and the like has been used, so-called desensitizing oiling processes such as gum removal can be omitted.

The planographic plate obtained by such processes as these is loaded in an offset printing press or the like and used in printing many pages.

EXAMPLES

Embodiments of the present invention are now described, but the present invention is not limited to or by these embodiments.

Example 1

Plate Fabrication

After washing and degreasing an aluminum plate (material 1050) having a thickness of 0.3 mm with trichloroethylene, the aluminum plate was given a sand-grain surface using a nylon brush and 400-mesh pumice-water suspension, then washed well in water. This aluminum plate was subjected to etching by immersion for 9 seconds in a 25% aqueous solution of sodium hydroxide at 45° C., washed with water, then immersed for 20 seconds in 20% nitric acid, and washed with water again. The amount of etching on this sand-grained surface at this time was approximately 3 g/m$^2$. Next, after a 3 g/m$^2$ direct-current anode oxidation coating film was applied, using 7% sulfuric acid as the electrolyte and a current density of 15 A/dm$^2$, the aluminum plate was washed with water and dried. Then the following undercoating solution was coated on and the coating film was dried for 1 minute at 90° C. The amount of coating layer coating after drying was 10 mg/m$^2$.

Undercoating solution composition:

| | |
|---|---|
| β-alanine | 0.5 g |
| methanol | 95 g |
| water | 5 g |

Planographic Plate Fabrication

Photosensitive solution composition:

| | |
|---|---|
| Acid generating compound X-1 (having structural formula noted below) | 0.15 g |
| Anionic infrared absorbing agent in Table 1 below | 0.10 g |
| Novolac resin obtained from phenol and formaldehyde (weight average molecular weight 10,000) | 1.5 g |
| Crosslinking agent MM-1 (having structural formula noted below) | 0.50 g |
| Fluorine-based surfactant (Megafak F-177, trade name, made by Dainippon Ink and Chemicals, Inc.) | 0.03 g |
| Methylethyl ketone | 15 g |
| 1-methoxy-2-propanol | 10 g |
| Methyl alcohol | 5 g |

[X-1]

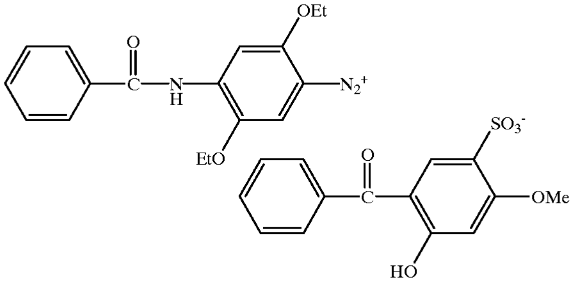

[MM-1]

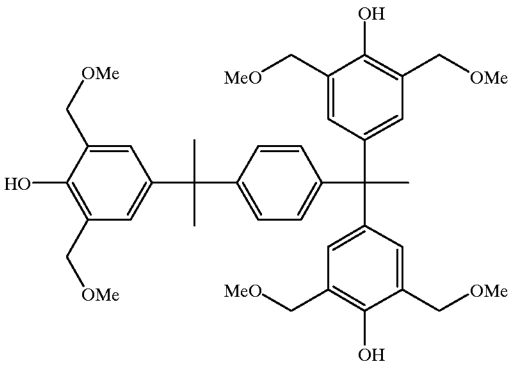

This photosensitive solution was coated onto the plate described above (the supporting body), and dried for 1 minute at 100° C. to yield the planographic printing plate of Embodiment 1. The weight of the coating after drying was 1.3 g/m$^2$.

Examples 2–15

Planographic printing plates in Embodiments 2 to 15 were obtained as in Embodiment 1 excepting that the anionic infrared absorbing agent used in the photosensitive solution was replaced by the anionic infrared absorbing agents listed in Tables 1 and 2 below.

Comparative Examples 1 and 2

Planographic printing plates in Comparative Examples 1 and 2 were obtained as in Example 1 excepting that the anionic infrared absorbing agent used in the photosensitive solution was replaced by the anionic infrared absorbing agents B-1 and B-2 expressed by the following structural formulas.

B-1

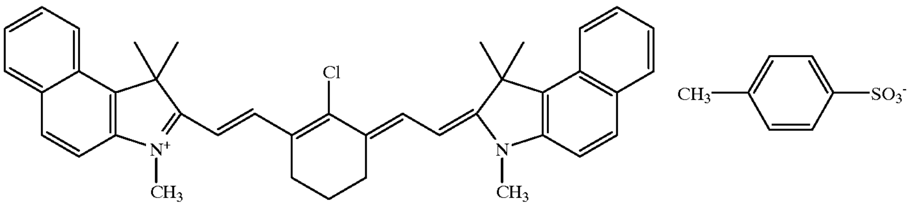

B-2

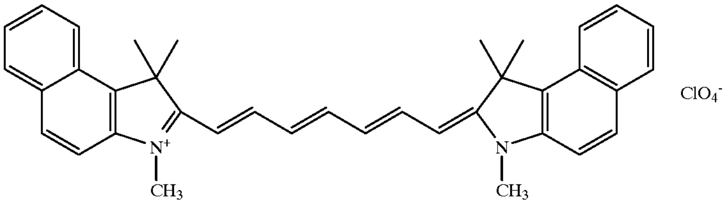

Evaluation of Sensitivity and Developing Latitude

The planographic printing plates of Examples 1 to 15 and Comparative Examples 1 and 2 were exposed using a semiconductor laser having a wavelength of 840 nm and a YAG laser having a wavelength of 1064 nm, as indicated in Tables 1 and 2 below. Which of these two lasers to be used was determined appropriately according to the wavelengths absorbed by the infrared absorbing dyes contained. After exposure, heat treatment was performed in an oven at 140° C., after which developing was done using an automatic developing machine ("PS Processor 900VR", trade name, made by Fuji Photo Film Co., Ltd.) loaded with developing fluid DP-4 and rinse solution FR-3 (1:7) made by Fuji Photo Film Co., Ltd. The developing solution DP-4 was prepared in two strengths, namely that diluted to 1:6 and that diluted to 1:12.

The line width in the non-image portions obtained with the DP-4 developing solution diluted to 1:6 was measured, and the laser irradiation energy corresponding to that line width was determined and used as a sensitivity index ($mJ/cm^2$). The smaller this measured value ($mJ/cm^2$), the higher the sensitivity of the planographic plate indicated.

Next, the line widths in the non-image portion obtained with the standard developing solution diluted to 1:6 and the more dilute developing solution diluted to 1:12 were measured, the laser irradiation energy corresponding to those line widths was found, and the difference between the two sensitivities was taken as the developing latitude index. The smaller that difference, the better the developing latitude, with 20 $mJ/cm^2$ or less being a practical level.

Evaluation of Storage Stability

The planographic printing plates in Embodiments 1 to 15 and Comparative Examples 1 and 2 were stored for 3 days in a high-temperature, high-humidity environment of 45° temperature and 75% relative humidity. Then laser exposure and developing were performed by the same methods as described in the foregoing, the sensitivities were found in the same manner, comparisons were made with the earlier results, and the differences found were made storage stability indexes. If the variation in sensitivity was 20 $mJ/cm^2$ or less, the storage stability was deemed good, representing a practical level.

The results of the evaluations are noted in Tables 1 and 2.

TABLE 1

| | Infrared absorbing agent | | | Developing | Exposure light | Energy change |
|---|---|---|---|---|---|---|
| | Anionic infrared absorbing colorant | Counter cation | Sensitivity ($mJ/cm^2$) | latitude ($mJ/cm^2$) | wavelength (nm) | after time elasped ($mJ/cm^2$) |
| Example 1 | IR-2 | $^{n}Bu_4N^+$ | 260 | 15 | 840 | 15 |
| Example 2 | IR-3 | $^{n}Bu_4N^+$ | 265 | 10 | 1064 | 15 |
| Example 3 | IR-5 | 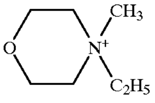 | 240 | 10 | 840 | 15 |
| Example 4 | IR-12 | $Na^+$ | 240 | 10 | 840 | 10 |
| Example 5 | IR-17 | $(CH_3)_3N^+—(CH_2)_{10}N^+(CH_3)_3$ | 235 | 5 | 840 | 15 |

TABLE 1-continued

| | Infrared absorbing agent | | | Developing | Exposure light | Energy change |
|---|---|---|---|---|---|---|
| | Anionic infrared absorbing colorant | Counter cation | Sensitivity ($mJ/cm^2$) | latitude ($mJ/cm^2$) | wavelength (nm) | after time elasped ($mJ/cm^2$) |
| Example 6 | IR-19 | 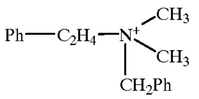 | 235 | 10 | 840 | 10 |
| Example 7 | IR-22 | 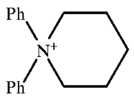 | 240 | 5 | 840 | 10 |
| Example 8 | IR-29 | $Ph_4P^+$ | 240 | 10 | 840 | 15 |
| Example 9 | IR-39 | $Ph—CO—CH_2N^+(CH_3)_2CH_2—Ph$ | 240 | 10 | 840 | 10 |

TABLE 2

| | Infrared absorbing agent | | | Developing | Exposure light | Energy change |
|---|---|---|---|---|---|---|
| | Anionic infrared absorbing colorant | Counter cation | Sensitivity ($mJ/cm^2$) | latitude ($mJ/cm^2$) | wavelength (nm) | after tme elasped ($mJ/cm^2$) |
| Example 10 | IR-B-3 | 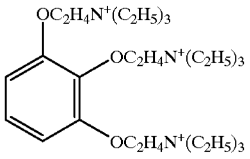 | 245 | 5 | 840 | 15 |
| Example 11 | IR-C-8 | 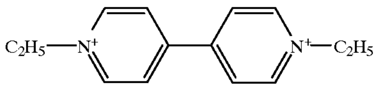 | 230 | 10 | 840 | 15 |
| Example 12 | IR-D-7 | $(CH_3)_4N^+$ | 235 | 5 | 840 | 10 |
| Example 13 | IR-D-7 | 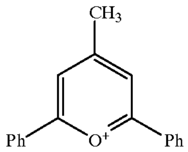 | 230 | 5 | 840 | 10 |
| Example 14 | IR-D-8 | $Ph_3S^+$ | 235 | 10 | 840 | 10 |
| Example 15 | JR-E-7 | $Ph—I^+—Ph$ | 235 | 5 | 840 | 15 |
| Comparative example 1 | | B-1 | 280 | 30 | 840 | 20 |
| Comparative example 2 | | B-2 | 280 | 25 | 840 | 20 |

These results show that the planographic printing plates of Examples 1 to 15, as compared to the planographic printing plates of Comparative Examples 1 and 2, exhibit higher sensitivity to infrared lasers, exhibit very small difference in sensitivity when using the two strengths of developing solution noted earlier, respectively, and exhibit developing latitude that is sufficiently practical.

All of the planographic printing plates of Examples 1 to 15, as compared to the planographic printing plates of Comparative Examples 1 and 2, exhibit extremely small variation in sensitivity before and after storage, excel in storage stability, and fully satisfy [what is required in] a practical level.

Examples 16–19

Planographic printing plates in Examples 16 to 19 were obtained as in Example 1 excepting that the infrared absorbing agent used in the photosensitive solution 1 was replaced by the infrared absorbing agents listed in Table 3, and the crosslinking agent was replaced by the crosslinking agent KZ-3 represented by the structural formula given below, and were evaluated as described earlier.

[KZ-3]

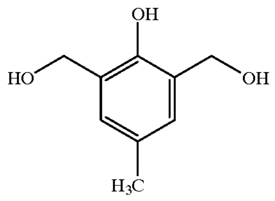

Comparative Examples 3 and 4

Planographic printing plates in Comparative Examples 3 and 4 were obtained as in Example 1 excepting that the infrared absorbing agent used in the photosensitive solution 1 was replaced either by the infrared absorbing agent B-1 represented by the structural formula given above or by the infrared absorbing agent B-3 represented by the structural formula given below, and were evaluated as described earlier. The results are shown in Table 3 below.

TABLE 3

B-3

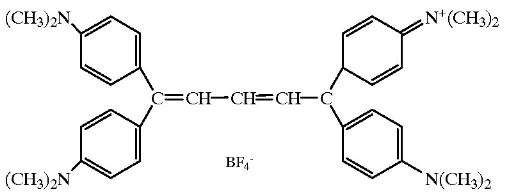

| | Infrared absorbing agent | Sensitivity ($mJ/cm^3$) | Energy change after time elapsed | Film remaining in non-image portions after storage at 60° C. |
|---|---|---|---|---|
| Example 16 | IR-5 | 190 | 15 | None |
| Example 17 | IR-18 | 175 | 10 | None |
| Example 18 | IR-30 | 180 | 15 | None |
| Example 19 | IR-46 | 175 | 15 | None |
| Comparative Example 3 | B-1 | 210 | 20 | Slight |
| Comparative Example 4 | B-3 | 220 | 25 | Slight |

These results show that the planographic printing plates of Examples 16 to 19, as compared to the planographic printing plates of Comparative Examples 3 and 4, exhibit higher sensitivity to infrared lasers, exhibit extremely little sensitivity variation before and after storage, excel in storage stability, do not develop residual film in the non-image portions even after storage, and fully satisfy [what is required in] a practical level.

Example 20

Photosensitive solution composition:

| | |
|---|---|
| Acid generating compound X-2 (having structural formula noted below) | 0.15 g |
| Anionic infrared absorbing agent in Table 4 below | 0.10 g |
| Maruka Linker-M S-4P (trade name, made by Maruzen Sekiyu Kagaku) | 1.5 g |

-continued

| | |
|---|---|
| (weight average molecular weight 10,000) | |
| Crosslinking agent MM-1 (having structural formula noted earlier) | 0.25 g |
| Crosslinking agent KZ-9 (having structural formula noted below) | 0.25 g |
| Fluorine-based surfactant (Megafak F-177, trade name, made by Dainippon Ink and Chemicals, Inc.) | 0.03 g |
| Methylethyl ketone | 15 g |
| 1-methoxy-2-propanol | 10 g |
| Methyl alcohol | 5 g |

Acid Generating Compound

[X-2]

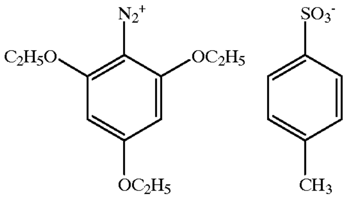

Cross-linking Agent

[KZ-9]

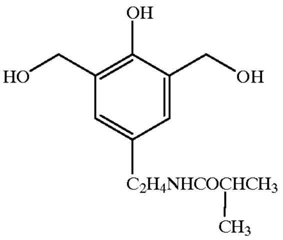

The planographic printing plate in Example 20 was obtained as in Example 1, excepting that the photosensitive solution 2 described above was used instead of the photosensitive solution 1.

Examples 21–23

Planographic printing plates in Examples 21 to 23 were obtained as in Example 20, excepting that the infrared absorbing agent used in the photosensitive solution 2 was changed to the infrared absorbing agents noted in Table 4.

Comparative Examples 5 and 6

Planographic printing plates in Comparative Examples 5 and 6 were obtained as in Example 20, excepting that the infrared absorbing agent used in the photosensitive solution 2 was changed to the infrared absorbing agents B-1 and B-3 represented by the structural formulas given earlier.

The planographic printing plates of Examples 20 to 23 and Comparative Examples 5 and 6 were evaluated for sensitivity and storage stability in the same manner as in Example 1.

The results are given in Table 4.

TABLE 4

| | Infrared absorbing agent | Sensitivity ($mJ/cm^2$) | Energy change after time elapsed | Film remaining in non-image portions after storage at 60° C. |
|---|---|---|---|---|
| Example 20 | IR-54 | 175 | 5 | None |

TABLE 4-continued

| | Infrared absorbing agent | Sensitivity ($mJ/cm^2$) | Energy change after time elapsed | Film remaining in non-image portions after storage at 60° C. |
|---|---|---|---|---|
| Example 21 | IR-67 | 165 | 5 | None |
| Example 22 | IR-79 | 170 | 10 | None |
| Example 23 | IR-95 | 165 | 5 | None |
| Comparative Example 5 | B-1 | 190 | 15 | Very Slight |
| Comparative Example 6 | B-3 | 200 | 20 | Very Slight |

These results show that the planographic printing plates of Examples 20 to 23, as compared to the planographic printing plates of Comparative Examples 5 and 6, exhibit higher sensitivity to infrared lasers, exhibit extremely little sensitivity variation before and after storage, excel in storage stability, do not develop residual film in the non-image portions even after storage, and fully satisfy [what is required in] a practical level.

As based on the present invention, image recording materials can be provided wherewith, using solid lasers and semiconductor lasers emitting infrared light, direct plate-making is possible by recording digital data from a computer or the like, which image recording materials exhibit high sensitivity to the infrared lasers, as well as good developing latitude and storage stability.

What is claimed is:

1. An image recording material comprising:

(a) a compound decomposable by light or heat, and which produces an acid when decomposed thereby;

(b) a crosslinking agent that crosslinks in the presence of an acid;

(c) a high-polymer compound substantially insoluble in water and substantially soluble in an alkali aqueous solution; and (d) an infrared absorbing agent selected from the group of general formulas consisting of general formula (I) or general formula (II) as follows:

(I)

$$[G_a^- — M — G_b]_m \ X^{m+}$$

(II)

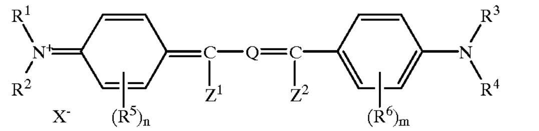

wherein in general formula (I), M represents a conjugated chain; $G_a^-$ represents an anionic substituent; $G_b$ represents a neutral substituent; and $X^{m+}$ represents a hydrogen ion or a cation of valence m, where m represents an integer from 1 to 6; and in general formula (II), $R^1$ to $R^4$ each independently represent a hydrogen atom, alkyl group, or aryl group; $R^5$ and $R^6$ each independently represent an alkyl group, substituted oxy group, or halogen atom; n and m each independently represent an integer from 0 to 4; either $R^1$ and $R^2$, or $R^3$ and $R^4$, may bond to form a ring, or $R^1$ and/or $R^2$ may bond with $R^5$, or $R^3$ and/or $R^4$ may bond with $R^6$ to form a ring, and, furthermore, either $R^5$'s may bond to form a ring or $R^6$'s may bond to form a ring; $Z^1$ and $Z^2$ are each independently a hydrogen atom, alkyl group, or aryl group, and at least one of $Z^1$ and $Z^2$ represents either a hydrogen atom or an alkyl group; Q is a trimethine group or pentamethine group that may have a substituent, and may form a ring structure together with a bivalent organic group; and $X^-$ represents a counter-anion.

2. An image recording material according to claim 1, wherein the (d) infrared absorbing agent expressed by general formula (I) has an onium salt as a counter-cation.

3. An image recording material according to claim 2, wherein the counter-cation is a thermally decomposing onium salt.

4. An image recording material according to claim 1, wherein the counter-anion represented by $X^-$ in the (d) infrared absorbing agent expressed by general formula (II) is selected from the group consisting of $SbF_6^-$ and $SbF_6(OH)$.

5. An image recording material according to claim 1, wherein the (d) infrared absorbing agent is added in an amount of 0.01 to 50 weight % of the total solids of the image recording material.

6. An image recording material according to claim 1, wherein the (a) acid generating compound is cationic.

7. An image recording material according to claim 1, wherein the (a) acid generating compound is selected from the group consisting of the compounds represented by the following general formulas (i) to (viii):

(i)

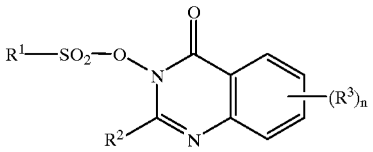

(ii)

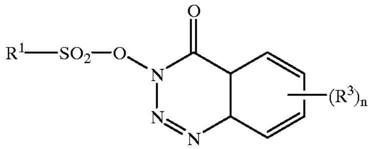

(iii)

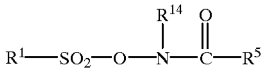

(iv)

$$Ar^1—SO_2—SO_2—Ar^2$$

(v)

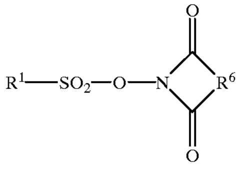

General Formula (vi)

$$Ar^3—I^+—Ar^4 \ X^-$$

General Formula (vii)

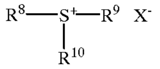

General Formula (viii)

$$Ar^3—N_2^+ \ X^-$$

wherein $R^1$, $R^2$, $R^4$, $R^5$ and $R^7$, which may be the same or different, represent hydrocarbon groups having 20 or fewer carbons which may have substituents; $R^3$ represents a halogen atom, a hydrocarbon group having 10 or fewer carbons which may have a substituent, or an alkoxy group having 10 or fewer carbons; $Ar^1$, $Ar^2$, $Ar^3$ and $Ar^4$, which may be the same or different, represent aryl groups having 20 or fewer carbons which may have substituents; $R^6$ represents a bivalent hydrocarbon group having 20 or fewer carbons which may have a substituent; $R^8$, $R^9$, and $R^{10}$, which may be the same or different, represent hydrocarbon groups having 18 or fewer carbons which may have substituents; $X^-$ represents a halogen compound ion, $ClO_4^-$, $PF_6^-$, $SbF_6^-$, $BF_4^-$, or $R^7$—$SO_3^-$; and n represents an integer from 0 to 4.

8. An image recording material according to claim 1, wherein the (a) acid generating compound is added in an amount of 0.01 to 50 weight % of the total solids of the image recording material.

9. An image recording material according to claim 1, wherein the (b) crosslinking agent is selected from the group consisted of (i) aromatic compounds (except for resol) with a substituted alkoxymethyl group or hydroxymethyl group, (ii) compounds having an N-hydroxymethyl group, N-alkoxymethyl group, or N-acyloxymethyl group, and (iii) an epoxy compound.

10. An image recording material according to claim 9, wherein the (b) crosslinking agent is added in an amount of 5 to 80 weight % of the total solids of the image recording material.

11. An image recording material according to claim 1, wherein the (b) crosslinking agent is a phenol derivative represented by following general formula (5):

General Formula (5)

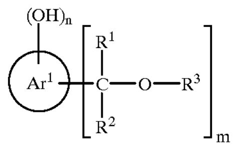

wherein $Ar^1$ represents an aromatic hydrocarbon ring which may have a substituent; $R^1$ and $R^2$, which may be the same or different, respectively represent hydrogen atoms or hydrocarbon groups having 12 or fewer carbons; m represents an integer from 2 to 4; and n represents an integer from 1 to 3.

12. An image recording material according to claim 11, wherein the (b) crosslinking agent is added in an amount of 5 to 70 weight % of the total solids of the image recording material.

13. An image recording material according to claim 1, wherein the (c) alkali-soluble high-polymer compound has, in the main chain and/or the side chain, acid groups selected from the group consisting of (c-1) phenolic hydroxy groups, (c-2) sulfonamide groups, and (c-3) active imide groups.

14. An image recording material according to claim 13, wherein the (c) alkali-soluble high-polymer compound is a copolymer comprising 10 mol % or more of monomers having any of the acid groups (c-1) to (c-3).

15. An image recording material according to claim 14, wherein, in the (c) alkali-soluble high-polymer compound, the mixing ratio by weight between monomers having any of the acid groups (c-1) to (c-3) and other monomers contained in the (c) alkali-soluble high-polymer compound is within the range of 50:50 to 5:95.

16. An image recording material according to claim 1, wherein the (c) alkali-soluble high-polymer compound has a weight average molecular weight of 2000 or greater and the number average molecular weight of 500 or greater.

17. An image recording material according to claim 1, wherein the (c) alkali-soluble high-polymer compound is added in an amount of 30 to 99 weight % of the total solids of the image recording material.

18. The image recording material according to claim 1, wherein the infrared absorbing agent (d) is represented by the general formula (I), wherein the conjugated chain M is represented by the following formula:

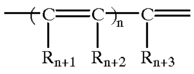

in which $R_{n+1}$, $R_{n+2}$, and $R_{n+3}$, respectively, independently represent hydrogen atoms, halogen atoms, cyano groups, alkyl groups, aryl groups, alkenyl groups, alkynyl groups, carbonyl groups, thio groups, sulfonyl groups, sulfinyl groups, oxy groups, or amino groups which may have substituents and may link to each other to form a ring structure, and n represents an integer from 1 to 8;

and $G_a$ and $G_b$ are respectively represented by the structures shown below;

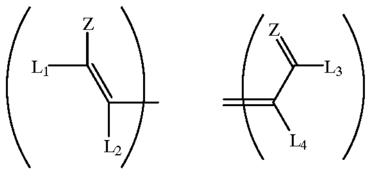

in which $L_1$ to $L_4$ represent mutually independent hydrogen atoms, halogen atoms, cyano groups, the alkyl groups noted above, aryl groups, alkenyl groups, alkynyl groups, carbonyl groups, thio groups, sulfonyl groups, sulfinyl groups, oxy groups, or amino groups; and $L_1$ and $L_2$, and $L_3$ and $L_4$, may be linked to form a ring structure, and wherein Z represents a chalcogen atom or —$C(Y_1)(Y_2)$ group, where $Y_1$ and $Y_2$ may be the same or different, and respectively represent, —CN, —$CO_2R'$, or —$SO_2R''$, where R' and R" represent alkyl groups or aryl groups.

19. The image recording material according to claim 18, wherein Z represents a chalcogen atom.

20. The image recording material according to claim 1, wherein $G_a$ and $G_b$ are respectively selected from the group consisting of:

1) 1,3-dicarbonyl nucleii;
2) pyrazolinone nucleii;
3) isooxazolinone nucleii;
4) oxyindole nucleii;
5) 2,4,6-triketohexahydropyrimidine nucleii;
6) 2-thio-2,4-thiazoline dione nucleii;
7) 2-thio-2,4-oxazolidine dione (2-thio-2,4-(3H,5H)-oxazol dione) nucleii;
8) thianaphthenone nucleii;
9) 2-thio-2,5-thiazolidine dione nucleii;
10) 2,4-thiazolidine dione nucleii;
11) thiazolidinone nucleii;
12) 4-thiazolinone nucleii;
13) 2-imino-2-oxozoline4-one nucleii;

14) 2,4-imidazolidine dione nucleii;

15) 2-thio-2,4-imidazolidine dione nucleii;

16) 2-imidazoline-5-one nucleii;

17) furan-5-one;

18) 4-hydroxy-2(1H)quinolinone nucleii;

19) 4-hydroxy-2(1H)-pyridinone nucleii;

20) substituted or non-substituted 4-hydroxy-2H-pyrane-2-one;

21) substituted or non-substituted 4-hydroxycoumarin; and 22) substituted or non-substituted thioindoxyl.

21. A planographic plate comprising:

(i) a supporting body; and (ii) a photosensitive layer having:

(a) a compound decomposable by light or heat, and which produces an acid when decomposed thereby;

(b) a crosslinking agent that crosslinks in the presence of an acid;

(c) a high-polymer compound substantially insoluble in water and substantially soluble in an alkali aqueous solution; and (d) an infrared absorbing agent selected from the group of general formulas consisting of general formula (I) or general formula (II) as follows:

(I)

$$[Ga^{-}—M—G_b]_m\ X^{m+}$$

-continued (II)

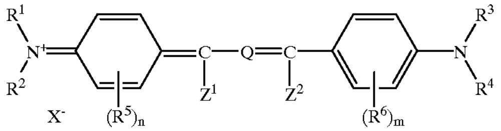

wherein in general formula (I), M represents a conjugated chain; $G_a^-$ represents an anionic substituent; $G_b$ represents a neutral substituent; and $X^{m+}$ represents a hydrogen ion or a cation of valence m, where m represents an integer from 1 to 6; and in general formula (II), $R^1$ to $R^4$ each independently represent a hydrogen atom, alkyl group, or aryl group; $R^5$ and $R^6$ each independently represent an alkyl group, substituted oxy group, or halogen atom; n and m each independently represent an integer from 0 to 4; either $R^1$ and $R^2$, or $R^3$ and $R^4$, may bond to form a ring, or $R^1$ and/or $R^2$ may bond with $R^5$, or $R^3$ and/or $R^4$ may bond with $R^6$ to form a ring, and, furthermore, either $R^5$'s may bond to form a ring or $R^6$'s may bond to form a ring; $Z^1$ and $Z^2$ are each independently a hydrogen atom, alkyl group, or aryl group, and at least one of $Z^1$ and $Z^2$ represents either a hydrogen atom or an alkyl group; Q is a trimethine group or pentamethine group that may have a substituent, and may form a ring structure together with a bivalent organic group; and $X^-$ represents a counter-anion.

* * * * *